US012563765B2

(12) United States Patent
Zhao et al.

(10) Patent No.: US 12,563,765 B2
(45) Date of Patent: Feb. 24, 2026

(54) NITRIDE-BASED SEMICONDUCTOR CIRCUIT AND METHOD FOR MANUFACTURING THE SAME

(71) Applicant: INNOSCIENCE (SUZHOU) TECHNOLOGY CO., LTD., Suzhou City (CN)

(72) Inventors: Qiyue Zhao, Suzhou City (CN); Wuhao Gao, Suzhou City (CN)

(73) Assignee: INNOSCIENCE (SUZHOU) TECHNOLOGY CO., LTD., Suzhou City (CN)

( * ) Notice: Subject to any disclaimer, the term of this patent is extended or adjusted under 35 U.S.C. 154(b) by 993 days.

(21) Appl. No.: 17/767,457

(22) PCT Filed: Jan. 7, 2022

(86) PCT No.: PCT/CN2022/070619
§ 371 (c)(1),
(2) Date: Apr. 8, 2022

(87) PCT Pub. No.: WO2023/130336
PCT Pub. Date: Jul. 13, 2023

(65) Prior Publication Data
US 2024/0088286 A1 Mar. 14, 2024

(51) Int. Cl.
*H10D 30/47* (2025.01)
*H10D 30/01* (2025.01)
(Continued)

(52) U.S. Cl.
CPC ....... *H10D 30/4755* (2025.01); *H10D 30/015* (2025.01); *H10D 62/8503* (2025.01); *H10D 64/256* (2025.01)

(58) Field of Classification Search
CPC ............. H10D 30/475; H10D 30/4755; H10D 30/015; H10D 64/256; H10D 84/83; H10D 84/84; H10D 84/83125; H10D 84/82
See application file for complete search history.

(56) References Cited

U.S. PATENT DOCUMENTS

2009/0189191 A1 7/2009 Sato et al.
2012/0153300 A1* 6/2012 Lidow ................... H01L 23/535
257/77
(Continued)

FOREIGN PATENT DOCUMENTS

CN 104347698 A 2/2015
CN 113035841 A 6/2021

OTHER PUBLICATIONS

International Search Report and Written Opinion of corresponding PCT application No. PCT/CN2022/070619 mailed on Sep. 23, 2022.

*Primary Examiner* — Matthew C Landau
(74) *Attorney, Agent, or Firm* — Li & Cai Intellectual Property (USA) Office

(57) ABSTRACT

A nitride-based semiconductor circuit including a first semiconductor substrate, a second semiconductor substrate, a nitride-based heterostructure, connectors, a first patterned conductive layer, a second patterned conductive layer, and connecting vias is provided. The second substrate is disposed on the first substrate. The first substrate has first dopants, and the second substrate has second dopants, which is different from the first dopants, and a pn junction is formed between the first substrate and the second substrate. The nitride-based heterostructure is disposed on the second substrate. The connectors are disposed on the nitride-based heterostructure. The first and second patterned conductive layers are disposed on the connectors. The connecting vias
(Continued)

include a first interconnection and a second interconnection. The first interconnection electrically connects the first substrate to one of the connectors. The second interconnection electrically connects the second substrate to another one of the connectors.

18 Claims, 50 Drawing Sheets

(51) Int. Cl.
　　　*H10D 62/85*　　　(2025.01)
　　　*H10D 64/23*　　　(2025.01)

(56)　　　　　　　　References Cited

U.S. PATENT DOCUMENTS

2014/0367744 A1 * 12/2014 Briere .................. H10D 88/101
　　　　　　　　　　　　　　　　　　257/195
2015/0371987 A1　 12/2015 Pan et al.

* cited by examiner

NITRIDE-BASED SEMICONDUCTOR CIRCUIT AND METHOD FOR MANUFACTURING THE SAME

FIELD OF THE DISCLOSURE

The present disclosure generally relates to a nitride-based semiconductor circuit. More specifically, the present disclosure relates to a nitride-based semiconductor circuit having a pn junction formed in its substrate.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistors (HFET), and modulation-doped FETs (MODFET).

Due to characteristics of gallium nitride (GaN), GaN-based devices can be applied to half bridge circuits. Half bridge circuits require a high side transistor and a low side transistor. The transistors need to be alternately switched on. However, while one of the transistors is switched on, another transistor will be affected by voltage leakage. Therefore, electronic circuits having transistors that can be switched on without affecting other transistors are needed.

SUMMARY OF THE DISCLOSURE

In accordance with one aspect of the present disclosure, a nitride-based semiconductor circuit is provided. The nitride-based semiconductor circuit includes a first semiconductor substrate, a second semiconductor substrate, a nitride-based heterostructure, connectors, a first patterned conductive layer, a second patterned conductive layer, and connecting vias. The second semiconductor substrate is disposed on the first semiconductor substrate. The first semiconductor substrate has first dopants, and the second semiconductor substrate has second dopants, which are different from the first dopants, and a pn junction is formed between the first semiconductor substrate and the second semiconductor substrate. The nitride-based heterostructure is disposed on the second semiconductor substrate. The connectors are disposed on the nitride-based heterostructure. The first and second patterned conductive layers are disposed on the connectors. The connecting vias go through the nitride-based heterostructure. The connecting vias include a first interconnection and a second interconnection. The first interconnection electrically connects the first semiconductor substrate to one of the connectors or an external power source through the first patterned conductive layer. The second interconnection electrically connects the second semiconductor substrate to another one of the connectors or another external power source through the second patterned conductive layer.

In accordance with one aspect of the present disclosure, a nitride-based semiconductor circuit is provided. The nitride-based semiconductor circuit includes a first semiconductor substrate, a second semiconductor substrate, a nitride-based heterostructure, a first drain connector, a first source connector, a first gate connector, a second drain connector, a second source connector, and a second gate connector. The second semiconductor substrate is disposed on the first semiconductor substrate. The first semiconductor substrate has first dopants, and the second semiconductor substrate has second dopants, which is different from the first dopants, and a pn junction is formed between the first semiconductor substrate and the second semiconductor substrate. The nitride-based heterostructure is disposed on the second semiconductor substrate. The first gate connector is disposed between the first drain connector and the first source connector. The second gate connector is disposed between the second drain connector and the second source connector. The second semiconductor substrate shares the same voltage with the first source connector or the second source connector. The first semiconductor substrate shares the same voltage with the first drain connector or the second source connector. Voltages of the first and second semiconductor substrates reversibly bias the pn junction therebetween.

In accordance with one aspect of the present disclosure, a manufacturing method of a nitride-based semiconductor circuit is provided. The manufacturing method includes: providing a first semiconductor substrate having first dopants; disposing a second semiconductor substrate having second dopants, which are different from the first dopants, on the first semiconductor substrate to form a pn junction; disposing a nitride-based heterostructure on the second semiconductor substrate; disposing connectors on the nitride-based heterostructure; etching through the nitride-based heterostructure; disposing connecting vias; and disposing a first patterned conductive layer and a second patterned conductive layer on the nitride-based heterostructure. The connecting vias include a first interconnection and a second interconnection. The first interconnection electrically connects the first semiconductor substrate to one of the connectors or an external power source through the first patterned conductive layer. The second interconnection electrically connects the second semiconductor substrate to another one of the connectors or another external power source through the second patterned conductive layer.

By the above configuration, the nitride-based semiconductor circuit has a substrate structure with a pn junction, and voltage can be applied through the connectors, so as to bias the pn junction of the substrate structure, and voltage leakage may be prevented.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1:
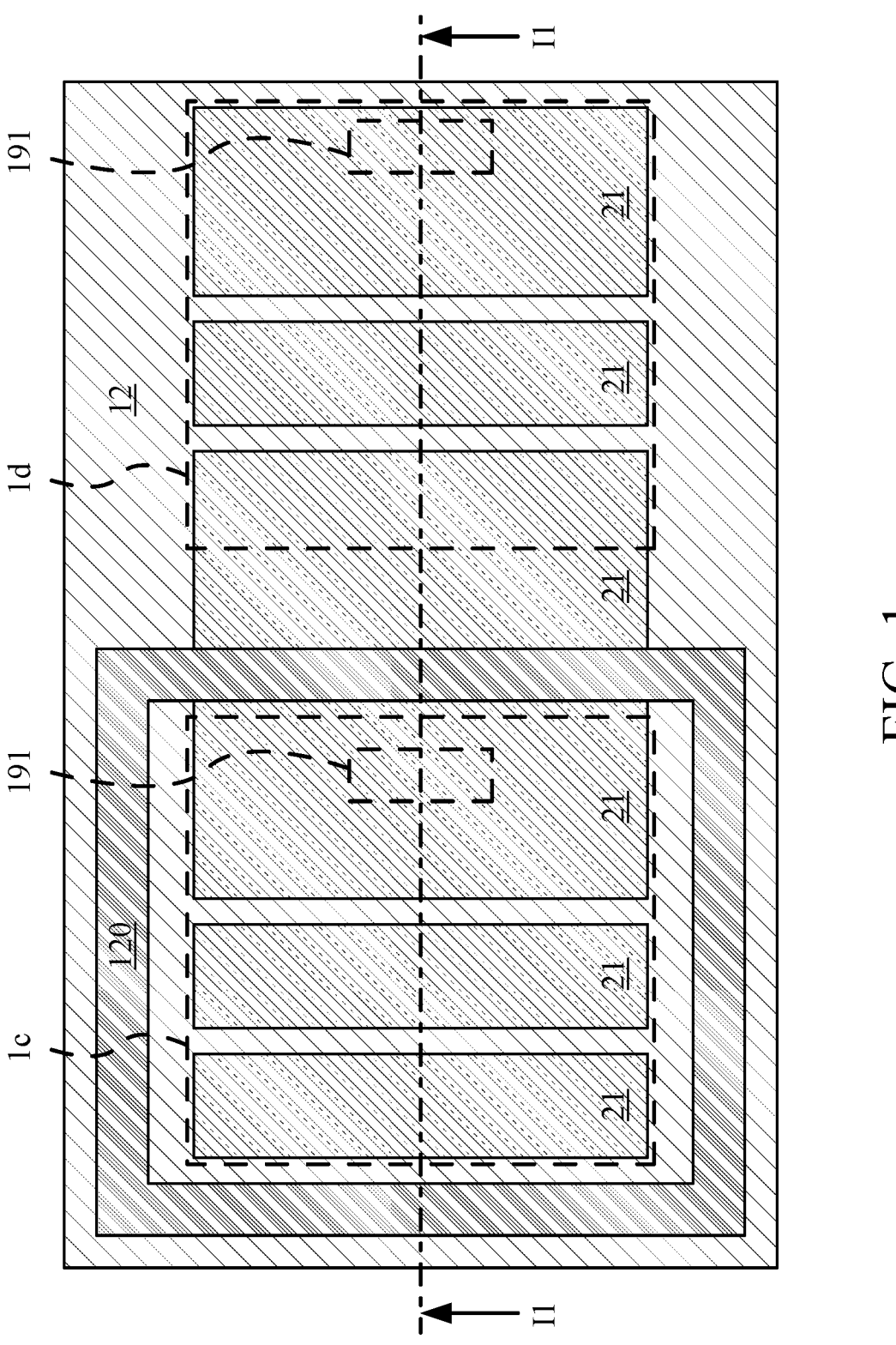
FIG. 1 is a top view of a nitride-based semiconductor circuit according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor circuits/devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

Figure 2:
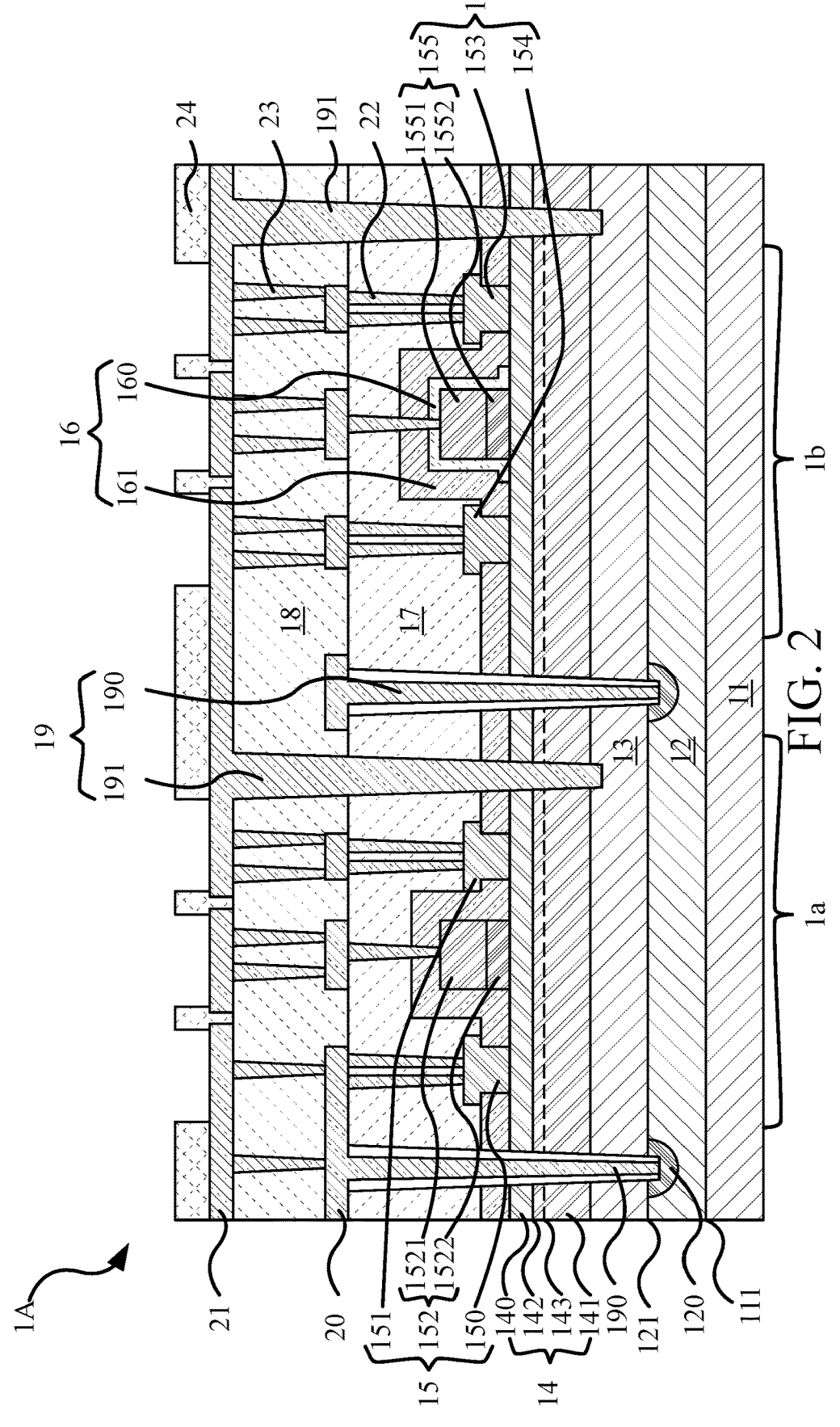
FIG. 2 is a cross-sectional view of the nitride-based semiconductor circuit according to cutting plane line I1 in FIG. 1.

FIG. 1 is a top view of a nitride-based semiconductor circuit according to some embodiments of the present disclosure, and FIG. 2 is a cross-sectional view of the nitride-based semiconductor circuit according to cutting plane line I1 in FIG. 1, and parts of the layers of the nitride-based semiconductor circuit are omitted in the top view for clarity. The nitride-based semiconductor circuit 1A comprises a semiconductor substrate 12, a semiconductor substrate 13, and a nitride-based heterostructure 14. The substrate 13 is disposed on the substrate 12, and the nitride-based heterostructure 14 is disposed on the substrate 13.

In this embodiment, the substrate 12 has dopants, and the substrate 13 has dopants. The dopants of the substrate 12 are different from the dopants of the substrate 13, and a pn junction 121 is formed between the substrates 12, 13. In other words, the substrate 12 and the substrate 13 forms an interface therebetween with pn junction 121 across the interface.

For example, the semiconductor substrates 12, 13 may include silicon (Si).

The nitride-based semiconductor circuit 1A further comprises a plurality of connectors 15, a patterned conductive layer 20, a patterned conductive layer 21, and a plurality of connecting vias 19. The connectors 15 are disposed on the nitride-based heterostructure 14, and the patterned conductive layers 20, 21 are disposed on the connectors 15.

The connecting vias 19 go through the nitride-based heterostructure 14. To be specific, a plurality of holes go through the nitride-based heterostructure 14, and a plurality of connections are formed between the layer above the nitride-based heterostructure 14 and the layer below the nitride-based heterostructure 14 through the holes.

In this embodiment, the connecting vias 19 comprise: interconnection 190 and interconnection 191. The interconnection 190 electrically connects the substrate 12 to one of the connectors 15 through the patterned conductive layer 21. The interconnection 191 electrically connects the substrate 13 to another one of the connectors 15 through the patterned conductive layer 21. Therefore, the voltage of the substrate 12 and the voltage of the substrate 13 can be controlled through applying electrical signals to the connectors 15, and the pn junction 121 may be biased.

The interconnection 190 separates a group of connectors 15 from another group of connectors 15. When the pn junction 121 is zero biased or reverse biased, no voltage leakage may be allowed between the groups of connectors 15.

In some embodiments, the connectors 15 and connecting vias 19 can include, for example but are not limited to, metals, alloys, doped semiconductor materials (such as doped crystalline silicon), compounds such as silicides and nitrides, other conductor materials, or combinations thereof. The exemplary materials of the connectors 15 and connecting vias 19 can include, for example but are not limited to, W, Au, Pd, Ta, Co, Ni, Pt, Mo, Ti, AlSi, TiN, or combination thereof. The connectors 15 and connecting vias 19 may be a single layer, or plural layers of the same or different composition. In some embodiments, the connectors 15 and connecting vias 19 form ohmic contacts with the nitride-based heterostructure 14 or substrates 12, 13. The ohmic contacts can be achieved by applying Ti, Al, or other suitable materials to the connectors 15 and connecting vias 19. In some embodiments, each of the connectors 15 and connecting vias 19 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

Referring to FIG. 2, the connectors 15 comprise source connectors 151, 153, drain connectors 150, 154, and gate connectors 152, 155. The gate connector 152 is located between the drain connector 150 and the source connector 151, and the gate connector 155 is located between the drain connector 154 and the source connector 153.

The source connector 151, the drain connector 150, the gate connector 152, and a part of the nitride-based heterostructure 14 are configured to constitute a high-electron-mobility transistor (HEMT) structure 1a. The source connector 153, the drain connector 154, the gate connector 155, and another part of the nitride-based heterostructure 14 are configured to constitute another HEMT structure 1b. The HEMT structure 1a is located beside the HEMT structure 1b. The HEMT structure 1a and the HEMT structure 1b are adjacent.

In this embodiment, a threshold voltage of the HEMT structure 1b is different from a threshold voltage of the HEMT structure 1a. To be specific, the threshold voltage of the HEMT structure 1b is higher than the threshold voltage of the HEMT structure 1a. Therefore, the HEMT structure 1a can be prevented from opening while the HEMT structure

1b is open. In other words, the HEMT structures 1a, 1b can be prevented from accidentally being turned on by a voltage spike or voltage leakage.

Also, the HEMT structure 1a is connected to the HEMT structure 1b. To be specific, the patterned conductive layer 21 connects the source connector 151 to the drain connector 154, optionally the HEMT structures 1a and 1b may form a half bridge circuit.

The threshold voltage of the HEMT structure 1b is higher than the HEMT structure 1a, and the HEMT structure 1b can be prevented from being affected by the voltage of the HEMT structure 1a during operation. In other words, the HEMT structures 1a, 1b can be prevented from accidentally being opened by a voltage spike or voltage leakage.

Moreover, the gate connector 152 has a gate electrode 1521 and a doped nitride-based semiconductor layer 1522, and the gate connector 155 has a gate electrode 1551 and a doped nitride-based semiconductor layer 1552. The doped nitride-based semiconductor layers 1522, 1552 are disposed on the nitride-based heterostructure 14, and the gate electrode 1521 is disposed on the doped nitride-based semiconductor layer 1522, and the gate electrode 1551 is disposed on the doped nitride-based semiconductor layer 1552. Therefore, the HEMT structures 1a, 1b are enhanced mode HEMTs. For example, the doped nitride-based semiconductor layers 1522, 1552 are p-type doped gallium nitride layers. With the higher threshold voltage, the HEMT structure 1b can be prevented from accidentally turning on while the voltage of the source connector 151 is changing. The HEMT structure 1a can be prevented from being opened while the HEMT structure 1b is open. In other words, the HEMT structures 1a, 1b can be prevented from accidentally being turned on by a voltage spike or a voltage leakage.

In one aspect, the interconnection 190 electrically connects the drain connector 150 to the substrate 12, and the interconnection 191 electrically connects the source connectors 151, 153 to the substrate 13. The pn junction 121 can be biased through the interconnections 190, 191.

For example, the substrate 12 has n-type dopants, and the substrate 13 has p-type dopants. The substrate 12 is connected to the drain connector 150 through the interconnection 190, and the substrate 13 is connected to the source connector 151 and the source connector 153 through the interconnection 191.

The substrate 13 shares the same voltage as the source connector 151 or the source connector 153. The substrate 12 shares the same voltage as the drain connector 150. Therefore, the n-type doped substrate 12 is connected to the drain of the HEMT structure 1a or a $V_{dd}$ of the nitride-based semiconductor circuit 1A, and the p-type doped substrate 13 is connected to the sources of the HEMT structures 1a and 1b. The pn junction 121 is reversely biased by the voltages of the substrates 12, 13, and a depletion region is formed, and the substrate voltage of the HEMT structure 1a is isolated from the substrate voltage of the HEMT structure 1b. In other words, the substrate voltage of the HEMT structure 1a and the substrate voltage of the HEMT structure 1b may be different.

Moreover, the substrate 12 has a heavily doped area 120, and the interconnection 190 is connected to the heavily doped area 120.

FIG. 1 only shows a top view of the substrate 12, the heavily doped area 120, and part of the patterned conductive layer 21 thereon for clarity. Therefore, the substrate voltage of the HEMT structure 1a and the substrate voltage of the HEMT structure 1b can be properly separated through interconnection 190.

Moreover, the heavily doped area 120 surrounds a projection 1c of the HEMT structure 1a on the substrate 12, and a projection 1d of the HEMT structure 1b on the substrate 12 is not surrounded by the heavily doped area 120. Therefore, the substrate voltage of the HEMT structure 1a is isolated from the substrate voltage of the HEMT structure 1b. In other words, the substrate 12 and the substrate 13 form a plurality of diode structures, and the diode structures surrounded by the heavily doped area 120 is isolated from the diode structures that is not surrounded by the heavily doped area 120.

For example, when the HEMT structure 1a is on and the HEMT structure 1b is off, the pn junction 121 between the substrates 12, 13 under the HEMT structure 1a is zero biased, and the pn junction 121 under the HEMT structure 1b is reversely biased, and a depletion region is created. The voltage of the substrate 13 under the HEMT structure 1b is isolated while the voltage of the substrate 13 under the HEMT structure 1a is changing.

When the HEMT structure 1a is off and the HEMT structure 1b is on, the pn junctions 121 under the HEMT structures 1a, 1b are both reversely biased, and depletion regions are created. The voltage of the substrate 13 under the HEMT structure 1a is isolated while the voltage of the substrate 13 under the HEMT structure 1b is changing.

In one aspect, the nitride-based semiconductor circuit 1A comprises passivation layers 16, and the gate connector 155 of the HEMT structure 1b is covered by multiple passivation layers 16, while the gate connector 152 of the HEMT structure 1a is covered by single passivation layer.

To be specific, the nitride-based semiconductor circuit 1A comprises an oxide layer 160 and a nitride layer 161. The oxide layer 160 is in contact with the gate connector 155, and the oxide layer 160 is isolated from the gate connector 152. The oxide layer 160 abuts the gate connector 155, and no oxide layer 160 makes contact with the gate connector 152 that is surrounded by the interconnection 190.

In other words, the interconnection 190 is disposed on the heavily doped area 120, and the interconnection 190 surrounds an area in the nitride-based semiconductor circuit 1A. The drain connector 150, the source connector 151, and the gate connector 152 are located in the area surrounded by the interconnection 190, and the gate connector 152 is free from oxide layer 160. The nitride layer 161 is in contact with the gate connector 152, and no other passivation layer makes contact with gate connector 152.

For example, in this embodiment, the oxide layer 160 comprises silicon dioxide, and the oxide layer 160 is applied through plasma-enhanced chemical vapor deposition (PECVD). The nitride layer 161 comprises silicon nitride, and the nitride layer 161 is applied through low pressure chemical vapor deposition (LPCVD). The hydrogen concentration of oxide layer 160 is different from the hydrogen concentration of nitride layer 161, and the doped nitride-based semiconductor layer 1552 is in direct contact with the oxide layer 160. While the doped nitride-based semiconductor layers 1522, 1552 are doped with a p-type dopant, activation of magnesium in doped nitride-based semiconductor layer 1522 and activation of magnesium in doped nitride-based semiconductor layer 1552 can be different during high temperature thermal environment. Therefore, the threshold voltage of the HEMT structure 1a is different from the threshold voltage of the HEMT structure 1b. The HEMT structure 1a can be prevented from opening while the HEMT structure 1b is open. In other words, the HEMT structures 1a, 1b can be prevented from being accidentally turned on by a voltage spike or a leakage voltage.

In one aspect, the nitride-based semiconductor circuit 1A further comprises a semiconductor substrate 11. The substrate 12 is disposed on the substrate 11, and the substrates 11, 13 have the same type of dopants. For example, when the substrates 11, 13 have p-type dopants, and the substrate 12 has n-type dopants, the substrates 11-13 together form a p-n-p structure. The substrate 11 and the substrate 12 also form a pn junction 111.

To be specific, the bottom side of the interconnection 190 is located between the pn junction 111 and the pn junction 121, and the bottom side of the interconnection 191 is located above the pn junction 121. Therefore, the pn junction 121 can be reversely biased or zero biased through the interconnections 190, 191.

In one aspect, the nitride-based heterostructure 14 includes a nitride-based semiconductor layer 140 and a nitride-based semiconductor layer 141. The nitride-based semiconductor layer 141 is disposed on the substrate 13, and the nitride-based semiconductor layer 140 is disposed on the nitride-based semiconductor layer 141.

In this embodiment, a band gap of the nitride-based semiconductor layer 140 is different from a bandgap of the nitride-based semiconductor layer 141, and a heterojunction 142 is formed in-between. In other words, an interface is formed between the nitride-based semiconductor layers 140, 141, and the heterojunction 142 is formed. The interface between the nitride-based semiconductor layers 140, 141 is parallel with the interface between the substrates 12, 13.

For example, the nitride-based semiconductor layer 140 may comprise AlGaN, and the nitride-based semiconductor layer 141 may comprise GaN. The bandgap of the nitride-based semiconductor layer 140 is greater than the bandgap of the nitride-based semiconductor layer 141. Therefore, a 2DEG region 143 is formed.

In one aspect, the nitride-based semiconductor circuit 1A comprises an interlayer dielectric (ILD) layer 17 and an intermetal dielectric (IMD) layer 18. The ILD layer 17 is disposed above the nitride-based heterostructure 14, and the IMD layer 18 is disposed on the ILD layer 17. To be specific, the ILD layer 17 is disposed on the passivation layers 16 and the connectors 15.

In this embodiment, both the interconnections 190, 191 pass through the ILD layer 17, and the ILD layer 17 covers part of the connectors 15 and the nitride layer 161. For example, the ILD layer 17 may include silicon oxide.

Also, the interconnection 190 is covered by the IMD layer 18 with the patterned conductive layer 20, and only the interconnection 191 passes through the IMD layer 18. For example, the IMD layer 18 may include silicon oxide.

In one aspect, the nitride-based semiconductor circuit 1A comprises a plurality of vias 22 and a plurality of vias 23. The vias 22 pass through the ILD layer 17, and the vias 22 connect the connectors 15 and the patterned conductive layer 20.

The vias 23 passes through the IMD layer 18, and the vias 23 connect the patterned conductive layer 20 and the patterned conductive layer 21.

The vias 22, 23 may include tungsten, but the disclosure is not limited thereto. The vias 22, 23 can include, for example but are not limited to, metals, alloys, doped semiconductor materials (such as doped crystalline silicon), compounds such as silicides and nitrides, other conductor materials, or combinations thereof. The exemplary materials of the vias can include, for example but are not limited to, Ti, AlSi, TiN, or combination thereof. The vias may be a single layer, or plural layers of the same or different composition. In some embodiments, the vias form ohmic contacts with connectors 15 or the patterned conductive layers 20, 21. The ohmic contacts can be achieved by applying Ti, Al, or other suitable materials to the vias 22, 23. In some embodiments, each of the vias 22, 23 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

In one aspect, the nitride-based semiconductor circuit 1A comprises a passivation layer 24, and the passivation layer 24 covers part of the patterned conductive layer 21.

The exemplary materials of the passivation layer 24 can include, for example but are not limited to, $SiN_x$, $SiO_x$, SiON, SiC, SiBN, SiCBN, oxides, nitrides, or combinations thereof. In some embodiments, the passivation layer 24 is a multi-layered structure, such as a composite dielectric layer of $Al_2O_3/SiN$, $Al_2O_3/SiO_2$, AlN/SiN, $AlN/SiO_2$, or combinations thereof.

Figure 3:
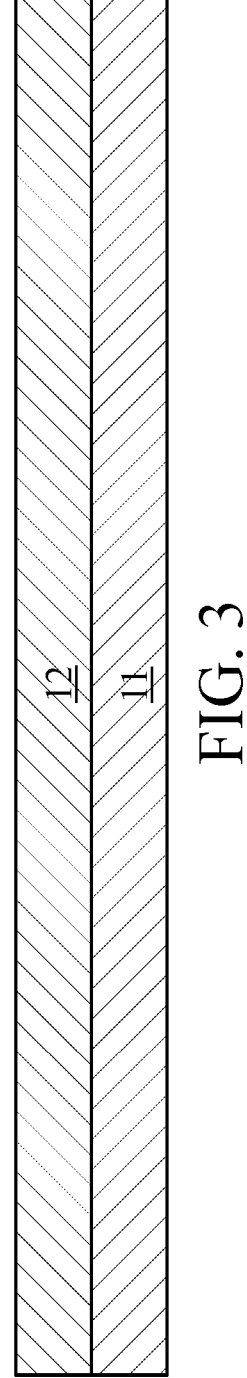
FIGS. 3-16 are cross-sectional views of steps of a manufacturing method of the nitride-based semiconductor circuit according to some embodiments of the present disclosure.

FIGS. 3-16 are cross-sectional views of steps of manufacturing method of the nitride-based semiconductor circuit 1A. Referring to FIG. 3, the manufacturing method of the nitride-based semiconductor circuit 1A includes: providing a semiconductor substrate 12 having dopants. To be specific, the substrate 12 is disposed on the optional semiconductor substrate 11, but the disclosure is not limited thereto. In some embodiment, the substrate 12 may be provided without disposing on the optional substrate 11.

Figure 5:
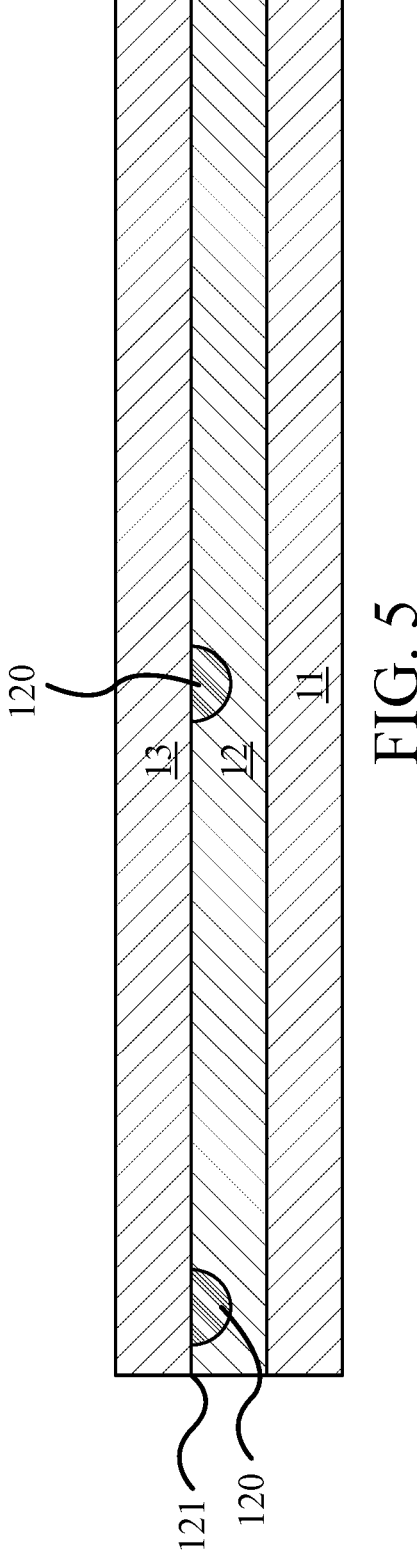

Referring to FIG. 5, the manufacturing method may include: disposing the semiconductor substrate 13 having dopants different from the dopants of the semiconductor substrate 12. The pn junction 121 is formed between the substrates 12, 13.

Figure 4:
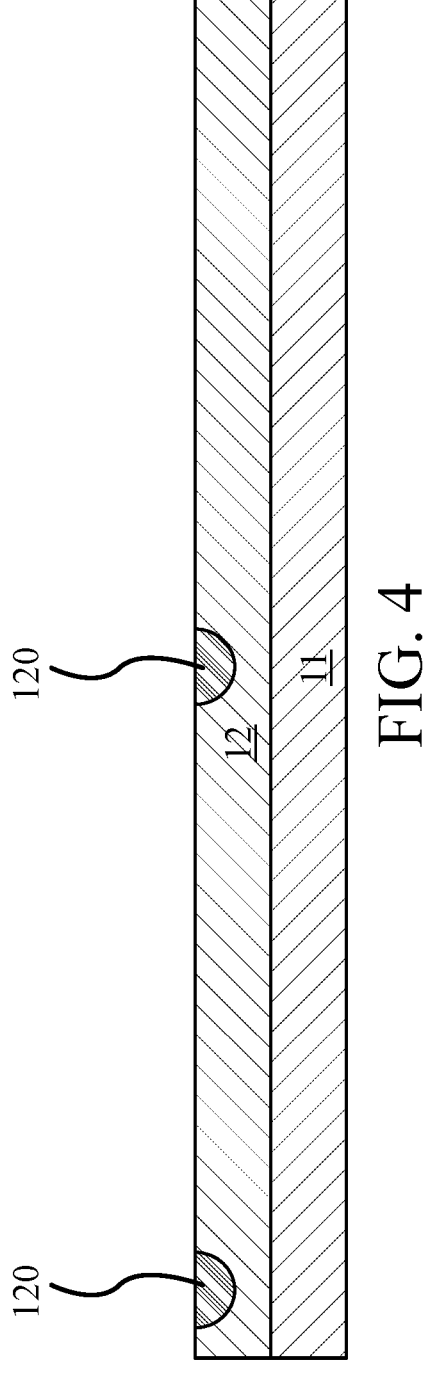

Moreover, referring to FIG. 4, in this embodiment, before the step of disposing the substrate 13, a heavily doped area 120 is formed through doping a selected type of ion. For example, if the substrate 12 has n-type dopants, the heavily doped area 120 is formed through doping n-type ions for example, by ion implantation.

In some embodiments, the substrate 13 may be disposed without forming a heavily doped area 120.

Moreover, referring to FIG. 5, the substrates 11, 13 may include p-type dopants, while the substrate 12 has n-type dopants, and the substrates 11-13 form a p-n-p structure (it is understood that, alternatively, the substrates 11 and 13 may include n-type dopants and the substrate 12 includes p-type dopants to form an n-p-n structure).

Figure 6:
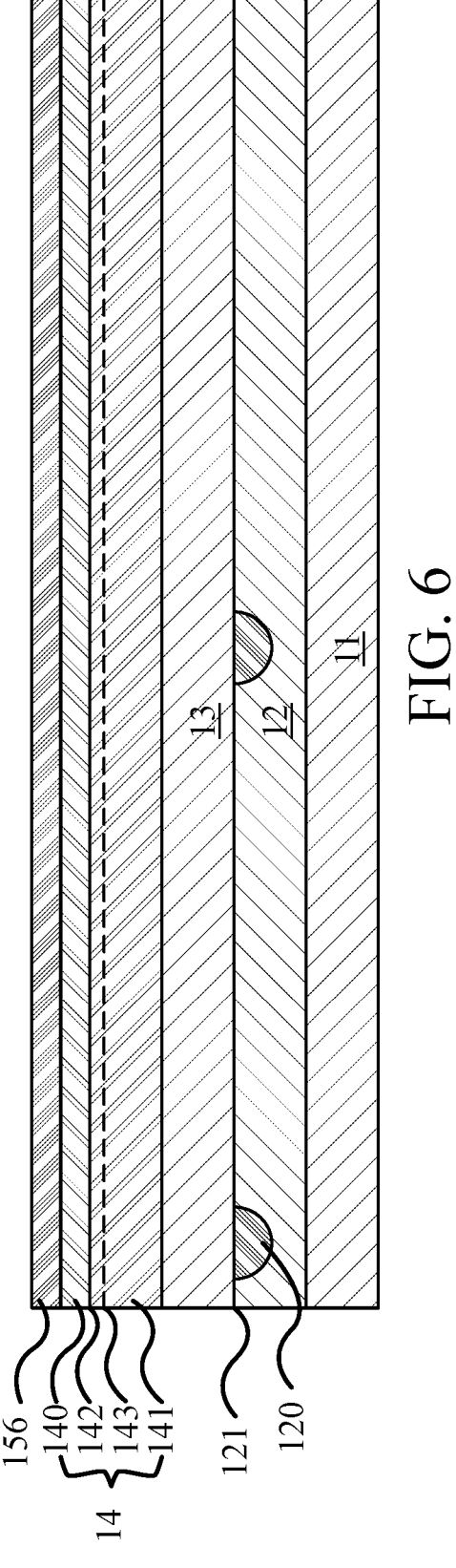

Referring to FIG. 6, after disposing the substrate 13, the manufacturing method includes: disposing a nitride-based heterostructure 14 on the semiconductor substrate 13.

FIGS. 7-11 depict the formation of the source, gate, and drain electrodes and associated conformal layers. These FIGS. will be discussed in further detail below.

Figure 12:
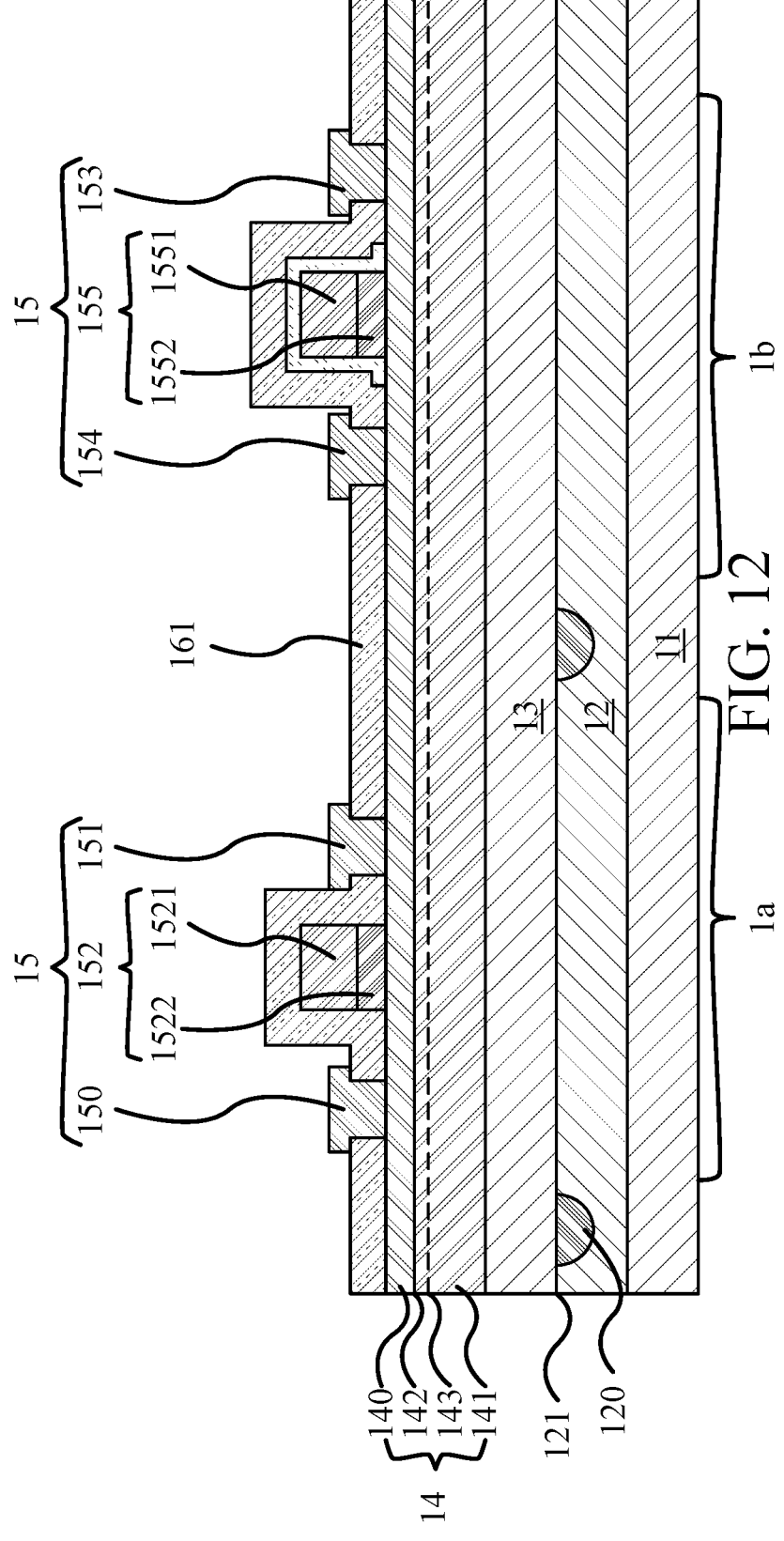

Referring to FIG. 12, after disposing the nitride-based heterostructure 14, the manufacturing method include: disposing the connectors 15 on the nitride-based heterostructure 14. The connectors 15 are disposed in two adjacent areas.

To be specific, the drain connector 150, the gate connector 152, and the source connector 151 are disposed on the area for HEMT structure 1a, and the drain connector 154, the gate connector 155, and the source connector 153 are disposed on the area of HEMT structure 1b. The areas of the HEMT structures 1a, 1b are adjacent.

Figure 13:
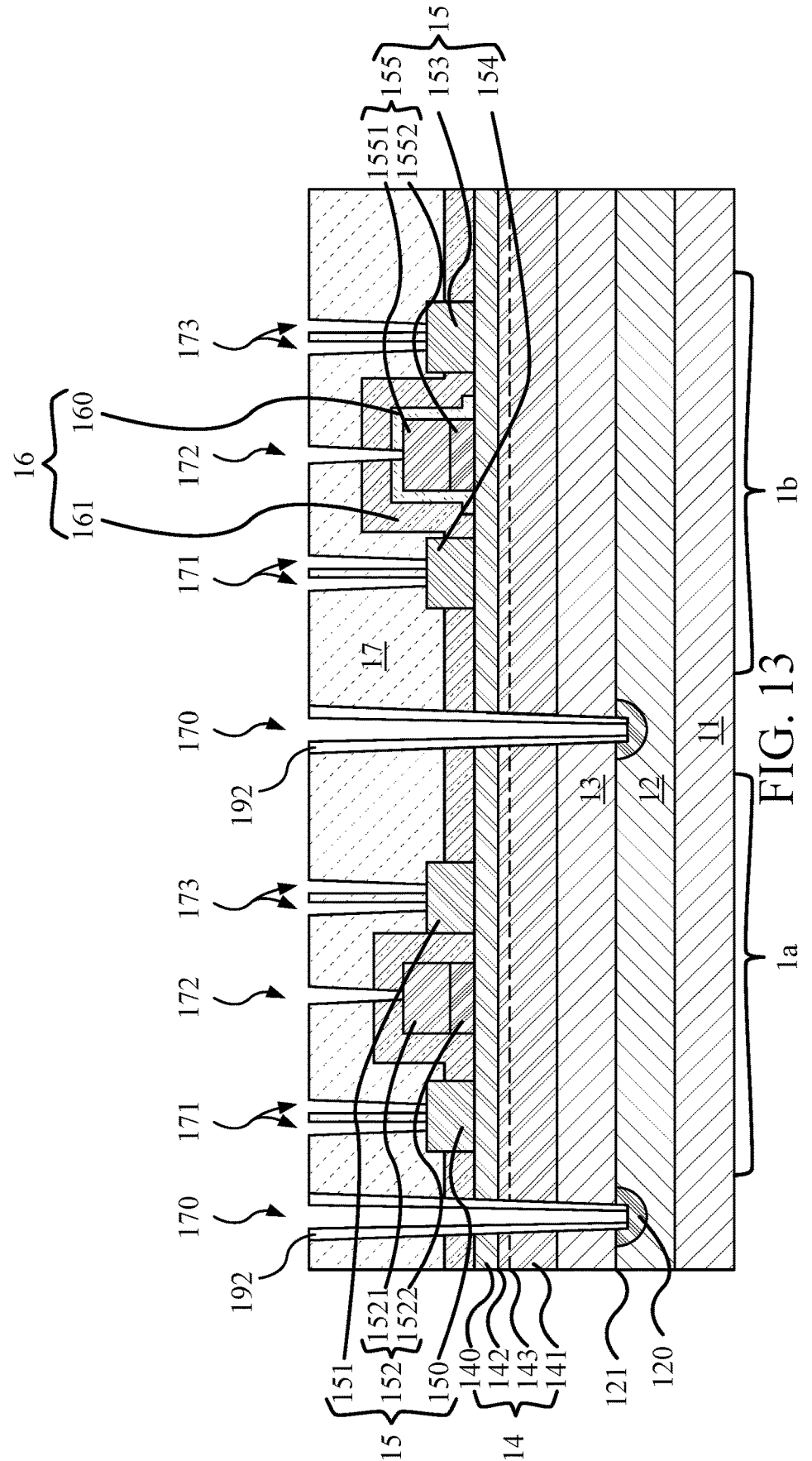

Referring to FIG. 13, after disposing the connectors 15, the manufacturing method includes: etching through part of the nitride-based heterostructure 14. Part of the nitride-based heterostructure 14 that is not covered by the connectors 15 is etched. The etched opening will expose part of the substrate 12. To be specific, the heavily doped area 120 is exposed by the opening.

Figure 14:
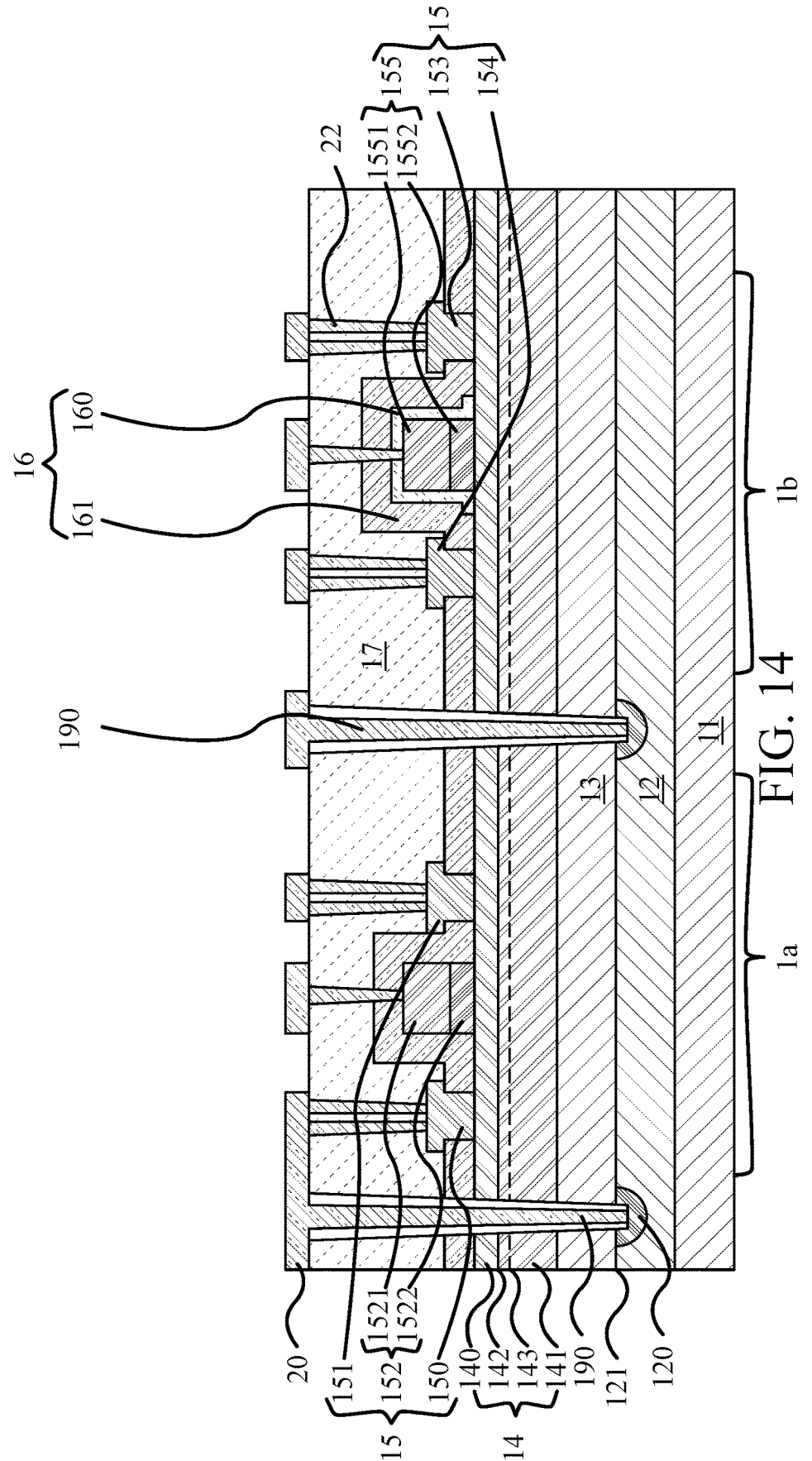

Referring to FIG. 14, after etching the nitride-based heterostructure 14, the manufacturing method includes: disposing the interconnection 190; and disposing the patterned conductive layer 20. The interconnection 190 is disposed in the etched openings that pass through the nitride-based heterostructure 14. Part of the patterned conductive layer 20 is connected to the interconnection 190, and the interconnection 190 electrically connects the substrate 12 to one of the connectors 15 through the patterned conductive layer 20. For example, the interconnection 190 electrically connects the substrate 12 to the drain connector 150.

Figure 15:
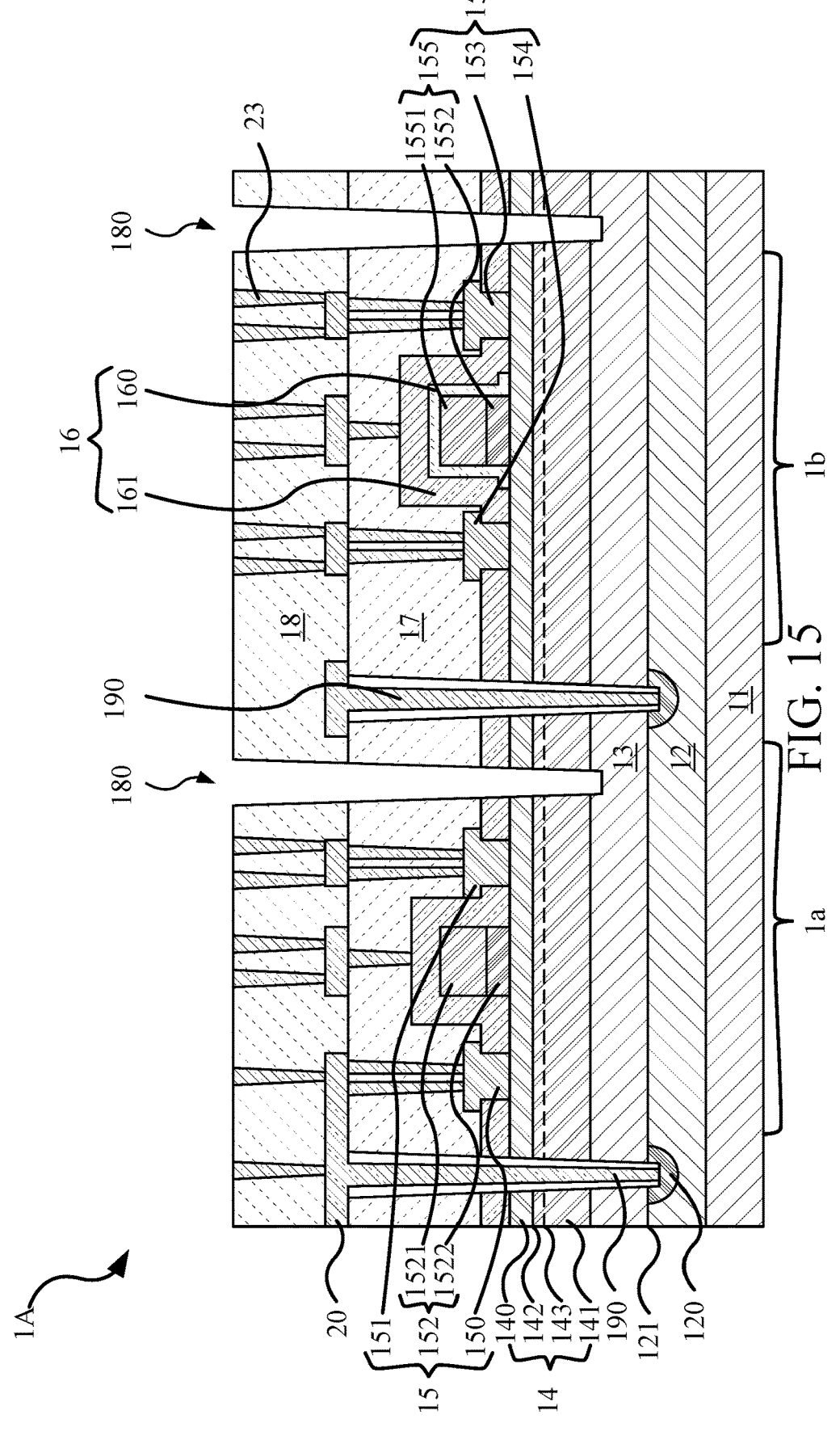

Referring to FIG. 15, after disposing the interconnection 190 and the patterned conductive layer 20, the manufacturing method includes: etching another part of the nitride-based heterostructure 14. Another part of the nitride-based heterostructure 14 that is not covered by the connectors 15 or filled with interconnection 190 is etched. The etched opening will expose part of the substrate 13.

Figure 16:
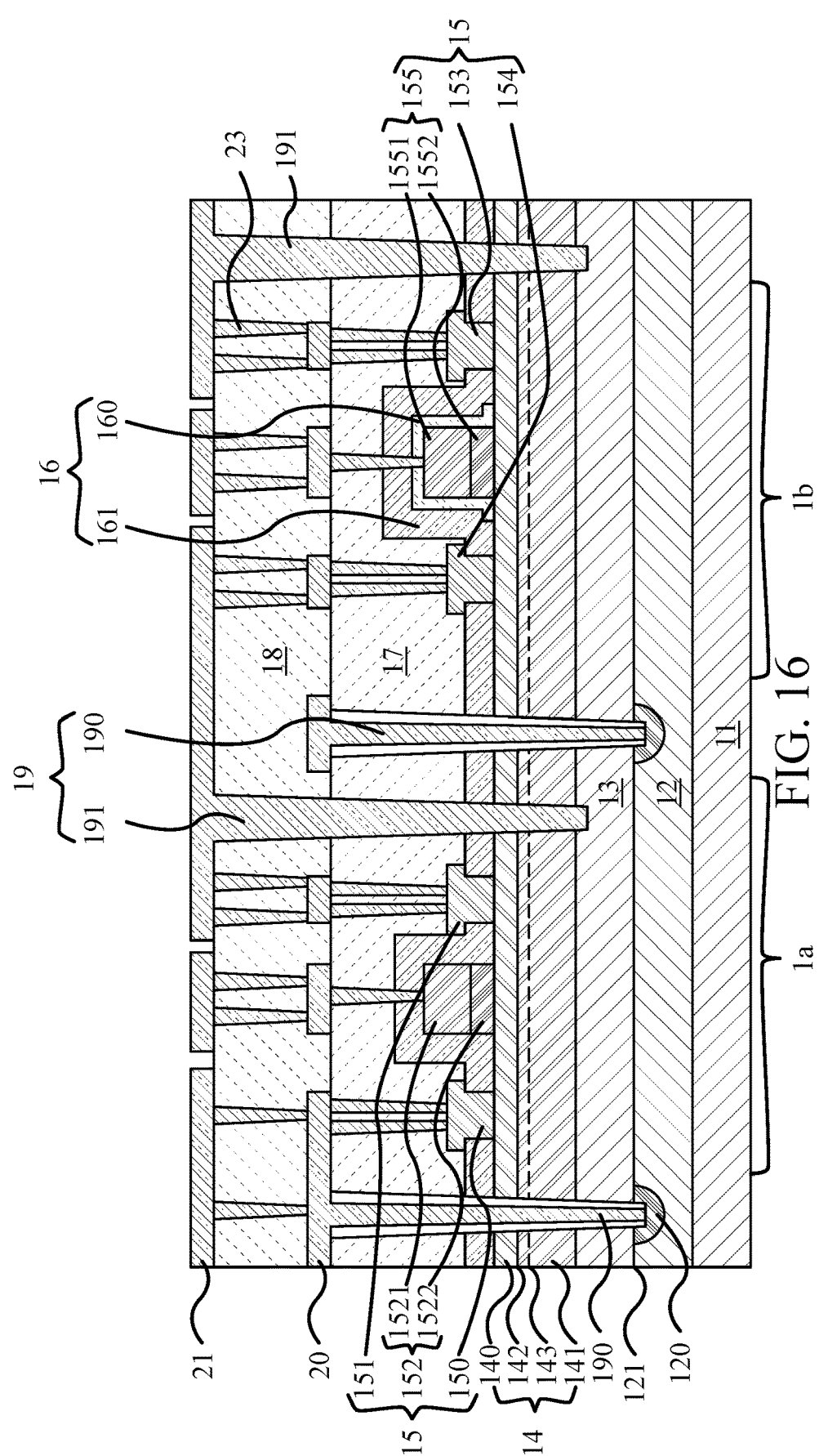

Referring to FIG. 16, after etching the nitride-based heterostructure 14 for the second time, the manufacturing method includes: disposing the interconnection 191; and disposing the patterned conductive layer 21 on the nitride-based heterostructure 14. The interconnection 191 is disposed in the etched openings that pass through the nitride-based heterostructure 14 and expose the substrate 13. Part of the patterned conductive layer 21 is connected to the interconnection 191, and the interconnection 191 electrically connects the substrate 13 to another one of the connectors 15 through the patterned conductive layer 21. For example, the interconnection 191 electrically connects the substrate 13 to the source connectors 151, 153.

The manufacturing method forms the pn junction 121 between the substrates 12, 13, and the interconnections 190, 191 are electrically connected to the substrate 12, 13 respectively. The pn junction 121 can be reverse biased or zero biased through connectors 15 that are electrically connected to the substrates 12, 13, and substrate voltage of different areas can be isolated.

In some embodiments, the interconnections 190, 191 are electrically connected to external power sources, and the pn junction 121 can be reverse biased or zero biased through the external power sources.

Referring to FIG. 3, the substrate 12 may be disposed on the substrate 11 through epitaxial growth techniques, while the dopants of the substrate 12 may be different from the dopants of the substrate 11. In the embodiment, before providing the substrate 13 on the substrate 12, the manufacturing method provides the substrate 11 and grows the substrate 12 on the substrate 11, and the substrate 11 has the same dopant as the dopant of the substrate 13 as shown in FIG. 5.

Referring to FIG. 4, the heavily doped areas 120 may be formed through ion implantation. For example, n-type ions are implants in the heavily doped areas 120. Moreover, the heavily doped areas 120 are formed through ion implantation and diffusion through high temperature. For example, the ion can include silicon, phosphorus, arsenic, and antimony. Also, by "heavily doped" it is meant a doping level of p-type or n-type dopants at a concentration of at least $10^{16}$ $cm^{-3}$ or greater.

Referring to FIG. 5, the substrate 13 may be provided on the substrate 12 through another epitaxial growth techniques. In this embodiment, the interface between the substrate 11 and the substrate 12 and the interface between the substrate 12 and the substrate 13 are parallel.

Referring to FIG. 6, the nitride-based heterostructure 14 is disposed on the substrate 13, and a doped nitride-based semiconductor layer 156 is formed on the nitride-based heterostructure 14.

To be specific, the step of disposing the nitride-based heterostructure 14 on the substrate 13 includes: growing the nitride-based semiconductor layer 141 on the substrate 13; and growing the nitride-based semiconductor layer 140 on the nitride-based semiconductor layer 141. The bandgaps of the nitride-based semiconductor layers 140, 141 are different, and the heterojunction 142 is formed with the 2DEG region 143.

The doped nitride-based semiconductor layer 156 is formed through epitaxial growth techniques. In other words, the nitride-based semiconductor layer 141, the nitride-based semiconductor layer 140, and the doped nitride-based semiconductor layer 1522 are formed through epitaxial growth techniques respectively.

Figure 7:
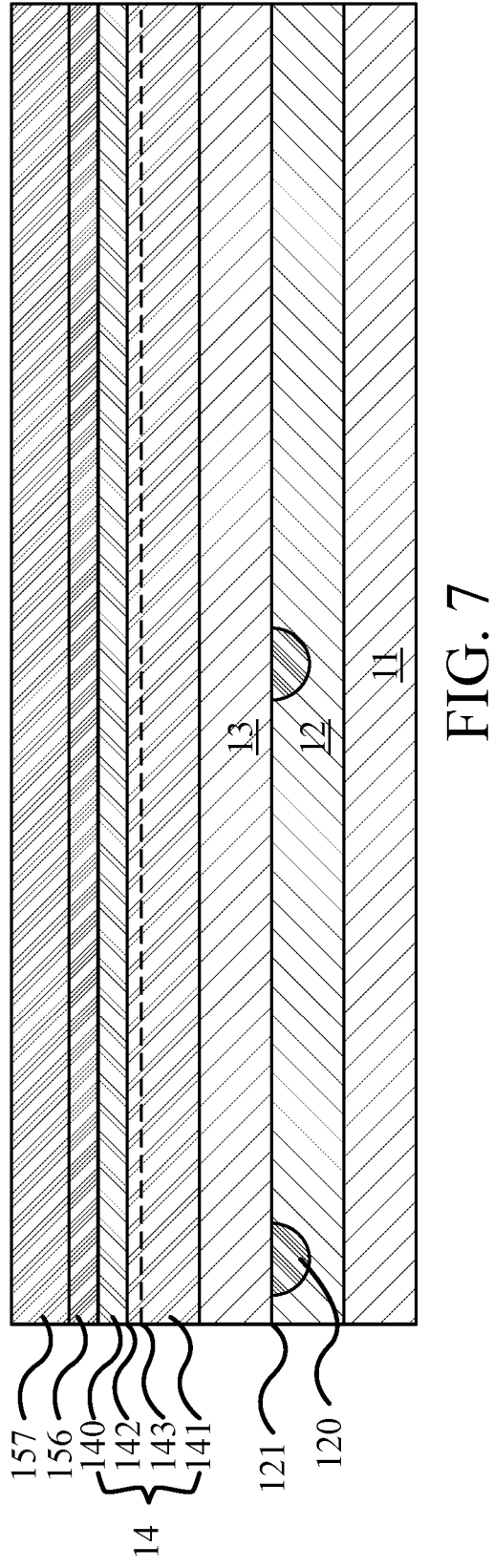

Referring to FIG. 7, a conductive layer 157 is formed on the doped nitride-based semiconductor layer 156 through deposition. The conductive layer 157 can include, for example but is not limited to, metals, alloys, doped semiconductor materials (such as doped crystalline silicon), compounds such as silicides and nitrides, other conductor materials, or combinations thereof. The exemplary materials of the conductive layer 157 can include, for example but are not limited to, Ti, AlSi, TiN, or combinations thereof.

Figure 8:
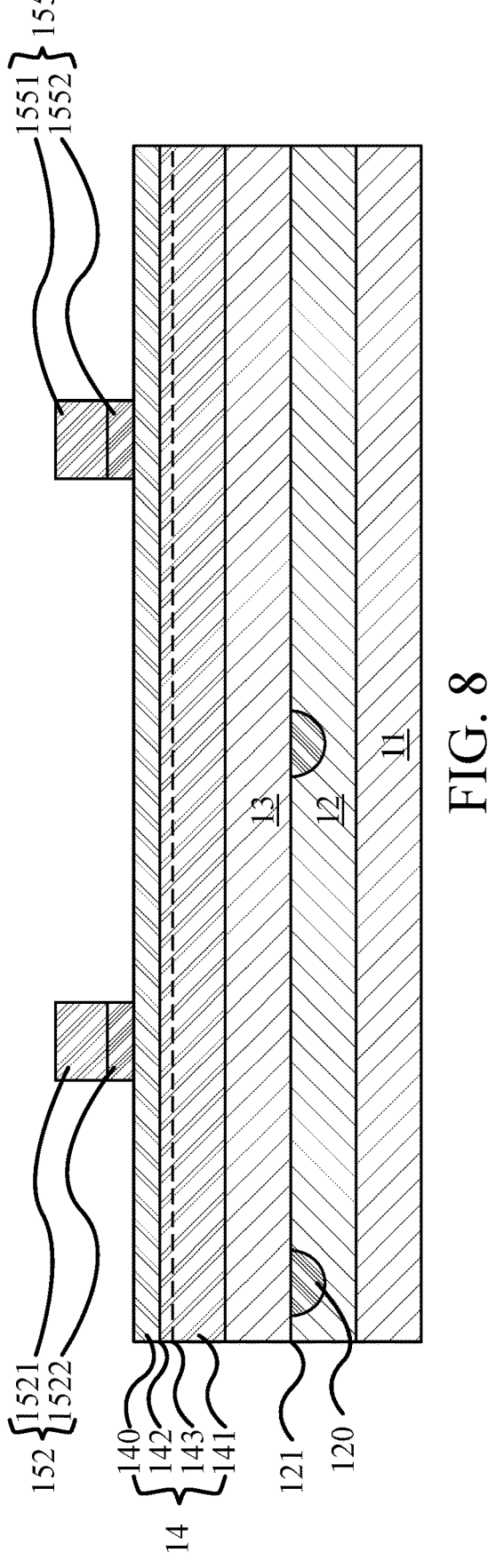

In this manufacturing method of the nitride-based semiconductor circuit 1A, the step of disposing the connectors 15 comprises: disposing the gate connector 152 and the gate connector 155 on the nitride-based heterostructure 14. Referring to FIG. 8, the conductive layer 157 and the doped nitride-based semiconductor layer 156 are etched, and the gate connectors 152, 155 are formed. The gate connector 152 includes the gate electrode 1521 and doped nitride-based semiconductor layer 1522, and the gate connector 155 includes the gate electrode 1551 and doped nitride-based semiconductor layer 1552. In other words, the manufacturing method etches the conductive layer 157 and the doped nitride-based semiconductor layer 156 into the gate connectors 152, 155.

Figure 9:
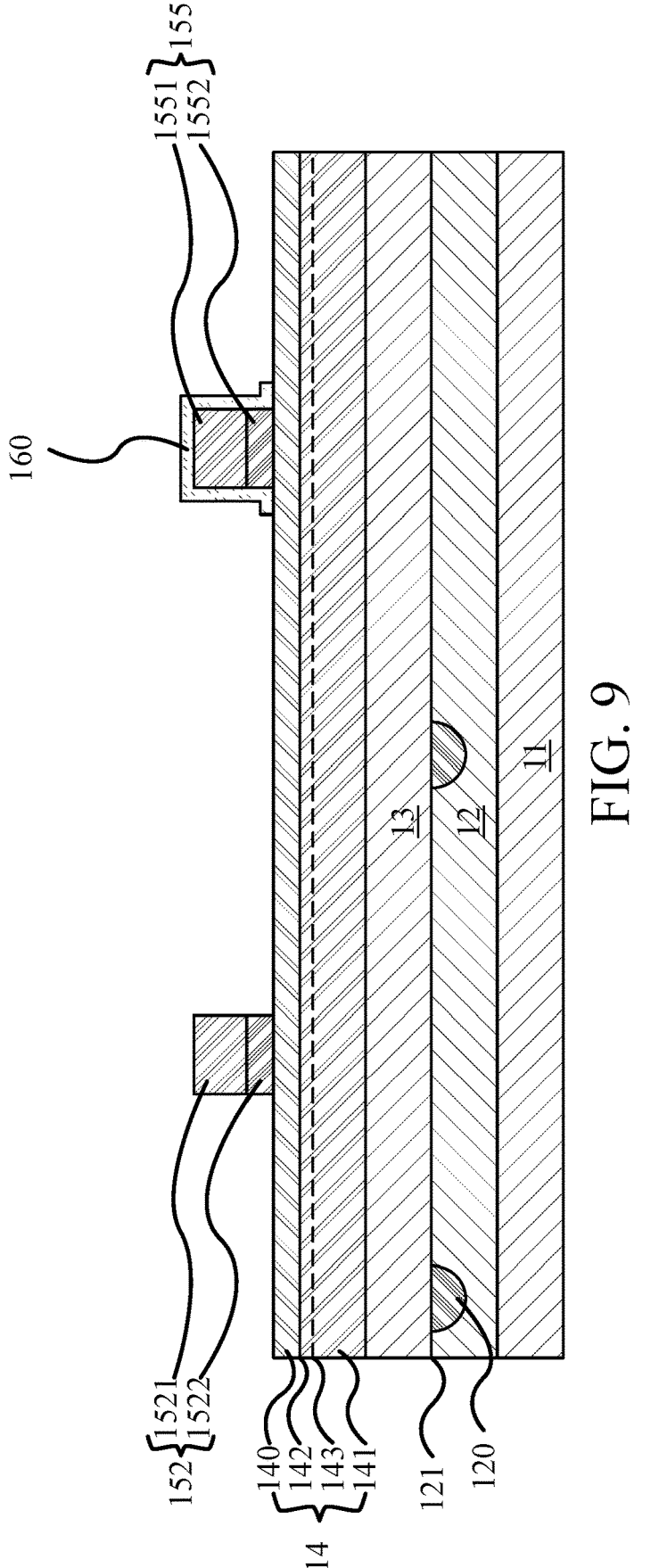

Referring to FIG. 9, the oxide layer 160 is disposed on the gate connector 155. To be specific, the oxide layer 160 covers the top surface of the gate electrode 1551 of the gate connector 155, and the oxide layer 160 covers side surfaces of the gate electrode 1551 and side surfaces of the doped nitride-based semiconductor layer 1552. Furthermore, the oxide layer 160 covers a part of the nitride-based semiconductor layer 140 that is adjacent to the gate connector 155.

In this manufacturing method of the nitride-based semiconductor circuit 1A, after disposing the gate connectors 152, 155, the step of disposing the connectors 15 comprises: disposing the oxide layer on the gate connectors 152, 155 and nitride-based heterostructure 14; and etching a part of the oxide layer in contact with the gate connector 152. In this embodiment, the step of disposing the oxide layer 160 may include: disposing a layer of oxide, and the layer covers the nitride-based heterostructure 14 and the gate connectors 152, 155; defining a pattern covering the gate connector 155 with photoresist; etching the rest of the layer of oxide which is not covered by the photoresist; and removing the photoresist on the gate connector 155.

Figure 10:
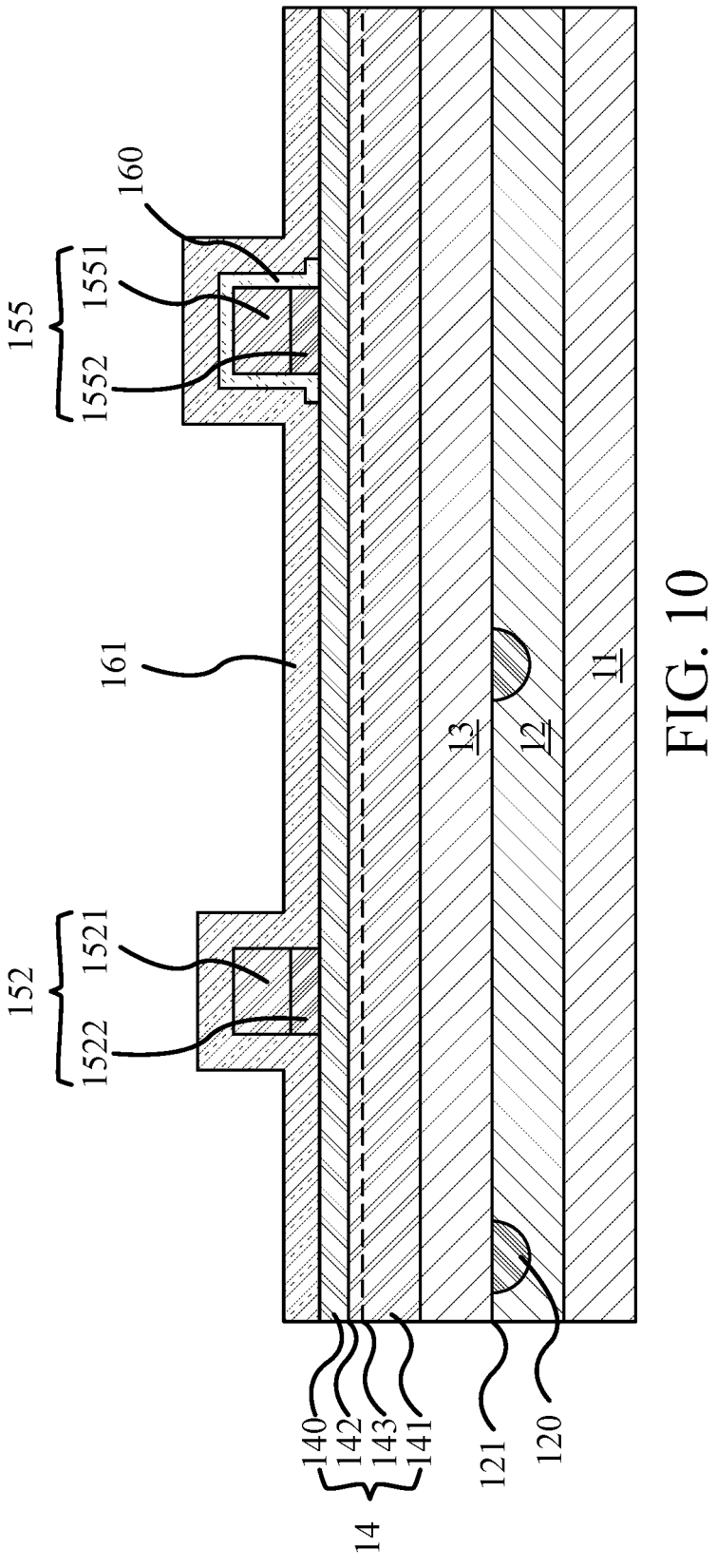

In this manufacturing method of the nitride-based semiconductor circuit 1A, after etching the oxide layer, the step of disposing the connectors 15 comprises: disposing the nitride layer 161 on the gate connector 152 and the gate connector 155 and the oxide layer 160. Referring to FIG. 10, the nitride layer 161 is disposed on the gate connectors 152, 155 and the nitride-based semiconductor layer 140. The nitride layer 161 encapsulates the oxide layer 160 on the gate connector 155, and the oxide layer 160 only touches the gate electrode 1551, the doped nitride-based semiconductor layer 1552, and the nitride layer 161 directly. The gate connector 152 is free from the oxide layer 160.

In this embodiment, the oxide layer 160 elevates the height of the nitride layer 161 on the gate connector 155, and the top surface of the nitride layer 161 on the gate connector 155 is higher than the top surface of the nitride layer 161 on the gate connector 152. On the gate connector 155, the oxide layer 160 and the nitride layer 161 are overlapped, and the concentrations of hydrogen in the oxide layer 160 and the nitride layer 161 are different.

Figure 11:
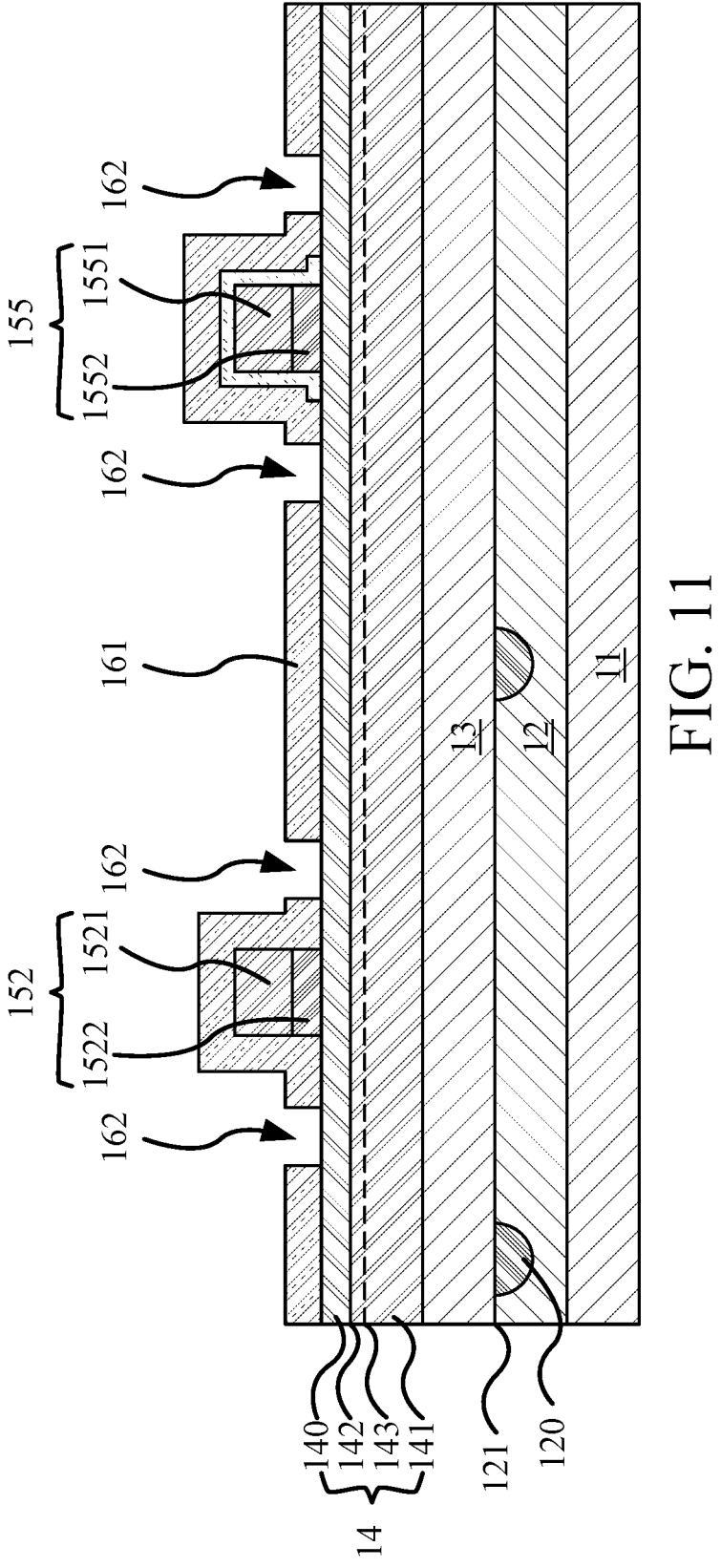

Referring to FIG. 11, the manufacturing method etches the nitride layer 161. A plurality of openings 162 are formed, and the openings 162 expose the nitride-based semiconductor layer 140. The etching pattern of the nitride layer 161 can be defined by photoresist.

Referring to FIG. 12, the manufacturing method forms the drain connector 150, the source connector 151, the drain connector 154, and the source connector 153. The drain connectors 150, 154, and the source connectors 151, 153 include conductive metal and form ohmic contacts to the nitride-based semiconductor layer 140, and the HEMT structure 1a and the HEMT structure 1b are formed.

The gate connector 152 of the HEMT structure 1a is free from the oxide layer 160, and the gate connector 155 of the HEMT structure 1b directly contacts the oxide layer 160. Since the concentrations of hydrogen in the oxide layer 160 and the nitride layer 161 are different, the threshold voltage of the HEMT structure 1b is higher than the threshold voltage of the HEMT structure 1a. Therefore, the HEMT structure 1a can be prevented from opening while the HEMT structure 1b is open. In other words, the HEMT structures 1a, 1b can be prevented from accidentally opening by a voltage spike or voltage leakage.

Referring to FIG. 13, the ILD layer 17 is disposed on the connectors 15 and the nitride layer 161, and the ILD layer is etched. To be specific, at first, the ILD layer 17, the nitride layer 161, the nitride-based heterostructure 14, the substrate 13 and part of the substrate 12 are etched, and the openings 170 are formed. The openings 170 expose the substrate 12, and the openings 170 expose the heavily doped area 120 of the substrate 12. The rest of the ILD layer 17, the nitride layer, and the oxide layer are etched, and the openings 171, 172, 173 are formed. The openings 171 pass through the ILD layer 17, and the openings 171 expose the drain connectors 150, 154. The openings 172 pass through the ILD layer 17 and the passivation layers 16, and the openings 172 expose the gate connectors 152, 155. The openings 173 pass through the ILD layer 17, and the openings 173 expose the source connector 151, 153. Moreover, the manufacturing method disposed dielectric layers 192 on the side wall of the openings 170 before etching the openings 171, 172, 173. For example, the dielectric layers 192 can include oxide or silicon nitride.

Referring to FIG. 14, the manufacturing method deposits conductive material in the openings 170, 171, 172, 173 as shown in FIG. 13, and the interconnection 190 and the vias 22 are formed, and the interconnections 190 connect the heavily doped areas 120. For example, the conductive material can include tungsten, but the disclosure is not limited thereto.

After the interconnection 190 and the vias 22 are formed, the patterned conductive layer 20 is disposed on the ILD layer 17, and the patterned conductive layer 20 electrically connects the vias 22 and the interconnection 190. In one aspect, the drain connector 150 is electrically connected to the substrate 12 through the conductive material of the interconnection 190 and the patterned conductive layer 20.

Referring to FIG. 15, the manufacturing method deposits the IMD layer 18 on the ILD layer 17 and the patterned conductive layer 20. After disposing the IMD layer 18, the IMD layer 18 is etched for the first time, and the etched openings expose parts of the patterned conductive layer 20. The manufacturing method disposes conductive material in the openings, and the vias 23 are formed.

After the vias 23 are formed, the manufacturing method involves etching the IMD layer 18 again. The IMD layer 18, the ILD layer 17, the nitride layer 161, the nitride-based heterostructure 14, and part of the substrate 13 are etched, and openings 180 are formed. The openings 180 pass through the nitride-based heterostructure 14 and expose the substrate 13.

Referring to FIG. 16, the manufacturing method deposits the conductive material in the openings 180 as shown in FIG. 15, and the interconnections 191 are formed. Moreover, the patterned conductive layer 21 is disposed on the IMD layer 18, and the patterned conductive layer 21 electrically connects the vias 23 and the interconnection 191.

In one aspect, the source connector 151 and the drain connector 154 are electrically connected to an area of the substrate 13, which is surrounded by the interconnection 190, through one of the interconnections 191, and the source connector 153 is electrically connected to another area of the substrate 13 through another one of the interconnections 191. Also, the patterned conductive layer 21 connects the HEMT structure 1a to the HEMT structure 1b, and the HEMT structures 1a, 1b can form a half bridge circuit.

After disposing the patterned conductive layer 21, the manufacturing method creates the passivation layer 24 as shown in FIG. 2. The passivation layer 24 include dielectric material, and the passivation layer 24 exposes only parts of the patterned conductive layer 21 for external connection.

Figure 17:
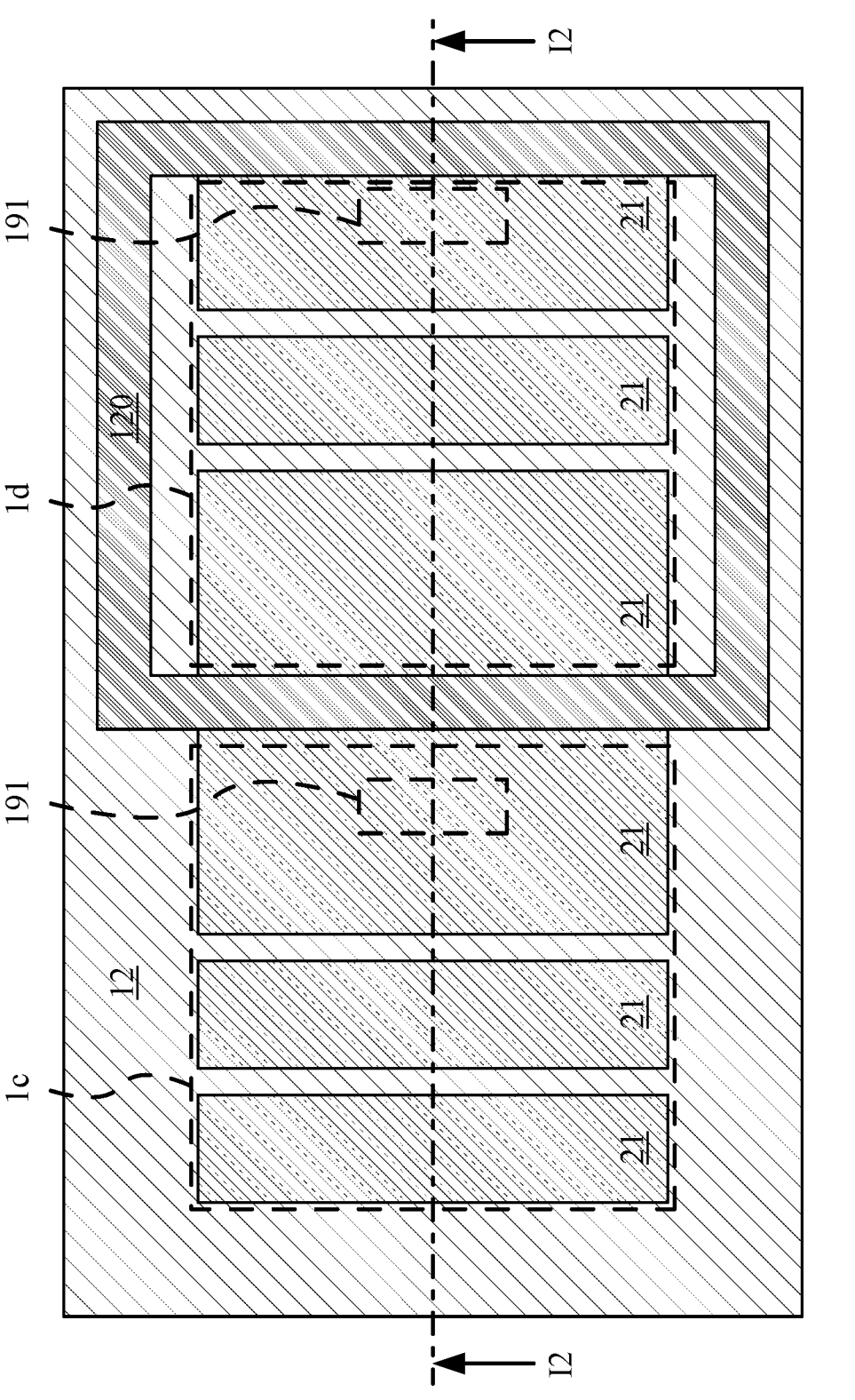
FIG. 17 is a top view of a nitride-based semiconductor circuit according to another embodiment of the present disclosure.
Figure 18:
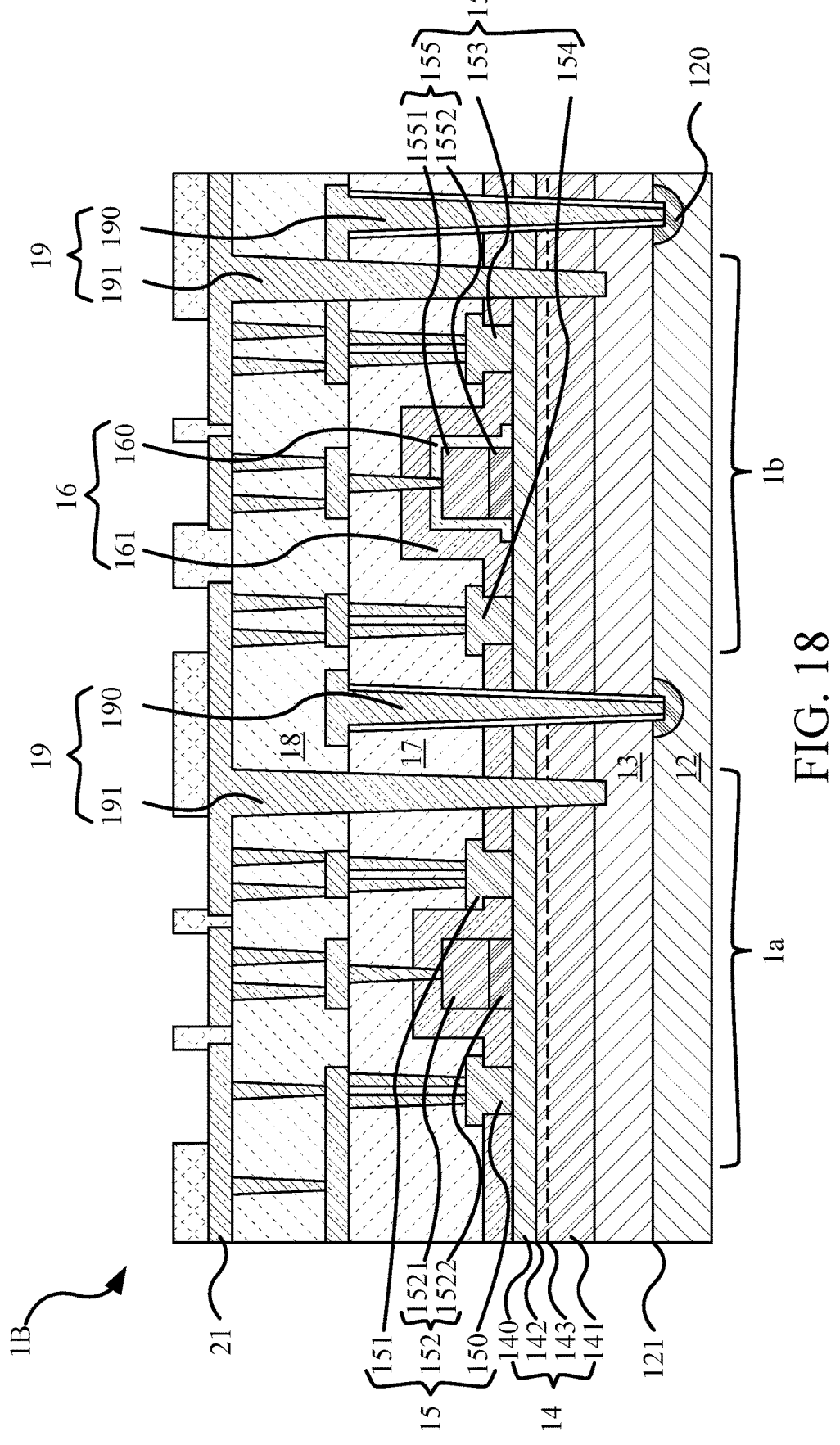
FIG. 18 is a cross-sectional view of a semiconductor circuit according to cutting plane line I2 in FIG. 17.

FIG. 17 is a top view of a nitride-based semiconductor circuit according to another embodiment of the present disclosure, and FIG. 18 is a cross-sectional view of a semiconductor circuit according to cutting plane line I2 in FIG. 17, and parts of the layers of the semiconductor circuit are omitted in the top view for clarity. To be specific, FIG. 17 only shows a top view of a substrate 12, a heavily doped area 120, and part of a patterned conductive layer 21 thereon for clarity. The nitride-based semiconductor circuit 1B is similar to the nitride-based semiconductor circuit 1A, and the nitride-based semiconductor circuit 1B has a nitride-based heterostructure 14 and connectors 15, and the connectors 15 are disposed on the nitride-based heterostructure 14, and the detailed description about the similar components will not be repeated.

In this embodiment, the nitride-based semiconductor circuit 1B includes a substrate 13 and the substrate 12, and the substrate 13 is disposed on the substrate 12, and a pn junction 121 is formed. For example, the substrate 12 has p-type dopants, and the substrate 13 has n-type dopants, and the pn junction 121 is formed between the substrates 12, 13. The heavily doped area 120 is formed through doping a type of ion. For example, the substrate 12 has p-type dopants, and the heavily doped area 120 is formed through doping p-type ions. For example, the p-type ions include magnesium.

The nitride-based heterostructure 14 is disposed on the substrate 13. The nitride-based heterostructure 14 has a nitride-based semiconductor layer 140, and a nitride-based semiconductor layer 141, and the nitride-based semiconductor layer 140 is disposed on the nitride-based semiconductor layer 141, and a heterojunction 142 is formed with a 2DEG region 143.

The connectors 15 are disposed on the nitride-based heterostructure 14, and the connectors 15 has drain connectors 150, 154, gate connectors 152, 155, source connectors 151, 153. The drain connector 150, the gate connector 152, and the source connector 151 are disposed on the region of a HEMT structure 1a, and the drain connector 154, the gate connector 155, and the source connector 153 are disposed on the region of a HEMT structure 1b.

The nitride-based semiconductor circuit 1B has a plurality of connecting vias 19, and the connecting vias 19 include interconnection 190 and interconnections 191. The interconnection 190 electrically connects the substrate 12 to the source connector 153, and one of the interconnections 191 electrically connects the substrate 13 to the source connector 151 and the drain connector 154, and another one of the interconnections 191 electrically connects the substrate 13 to the source connector 153. Moreover, the interconnection 190 of this embodiment is electrically connected to the heavily doped area 120 of the substrate 12. Therefore, the pn junction 121 can be reversely biased or zero biased through the connecting vias 19, and the substrate voltage of the HEMT structure 1a can't affect the substrate voltage of the HEMT structure 1b.

In this embodiment, the heavily doped area 120 surrounds a projection 1d of the HEMT structure 1b on the substrate 12, and a projection 1c of the HEMT structure 1a on the substrate 12 is not surrounded by the heavily doped area 120. Therefore, the substrate voltage of the HEMT structure 1a is isolated from the substrate voltage of the HEMT structure 1b. In other words, the substrate 12 and the substrate 13 form a plurality of diode structures, and the diode structures surrounded by the heavily doped area 120 is isolated from the diode structures that is not surrounded by the heavily doped area 120.

For example, when the HEMT structure 1a is on and the HEMT structure 1b is off, the pn junction 121 between the substrates 12, 13 under the HEMT structure 1a is reverse biased, and the pn junction 121 between the substrates 12, 13 under the HEMT structure 1b is zero biased, and a depletion region is created in the substrates 12, 13 of the HEMT structure 1a. The voltage of the substrate 13 under the HEMT structure 1b is isolated while the voltage of the substrate 13 under the HEMT structure 1a is changing.

When the HEMT structure 1a is off and the HEMT structure 1b is on, the pn junction 121 between the substrates 12, 13 under the HEMT structure 1a is reversely biased, and the pn junction 121 between the substrates 12, 13 under the HEMT structure 1b is zero biased, and a depletion region is created in the substrates 12, 13 of the HEMT structure 1a. The voltage of the substrate 13 under the HEMT structure 1a is isolated while the voltage of the substrate 12 under the HEMT structure 1b is changing.

In other words, the substrate 13 shares the same voltage with the source connector 151 or the source connector 153, and the substrate 12 shares the same voltage with the source connector 153, and voltages of the substrates 12, 13 reversibly bias part of the pn junction 121 therebetween.

Also, the nitride-based semiconductor circuit 1B includes passivation layers 16 covering the gate connectors 152, 155, while only the gate connector 155 is directly in contact with the oxide layer 160. The gate connector 152 is only covered by the nitride layer 161. Therefore, the threshold voltages of the HEMT structures 1a, 1b are different. The HEMT structure 1a can prevent from opening while the HEMT structure 1b is open. In other words, the HEMT structures 1a, 1b can be prevented from accidentally opening by a voltage spike or voltage leakage.

Figure 19:
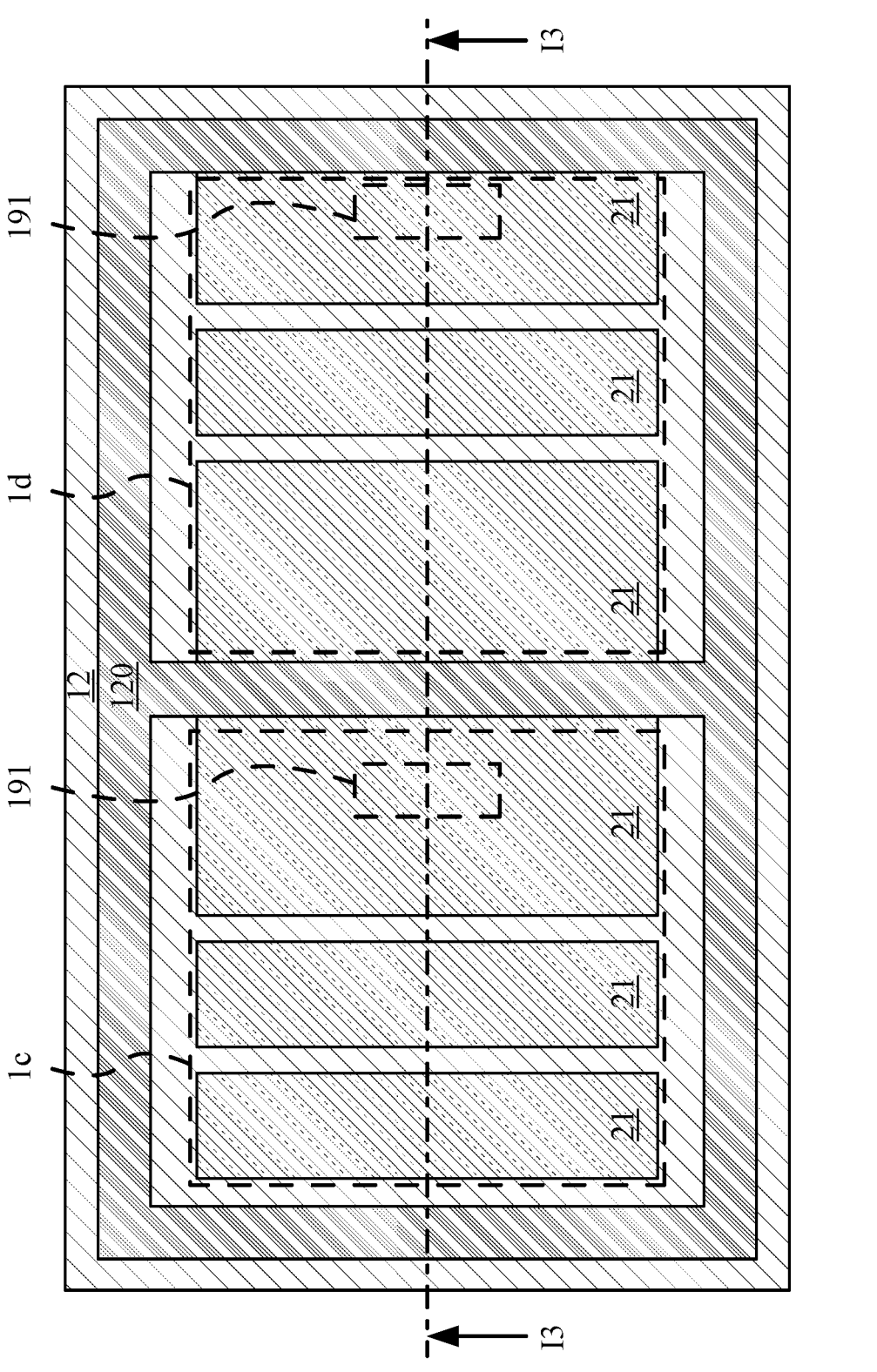
FIG. 19 is a top view of a nitride-based semiconductor circuit according to another embodiment of the present disclosure.
Figure 20:
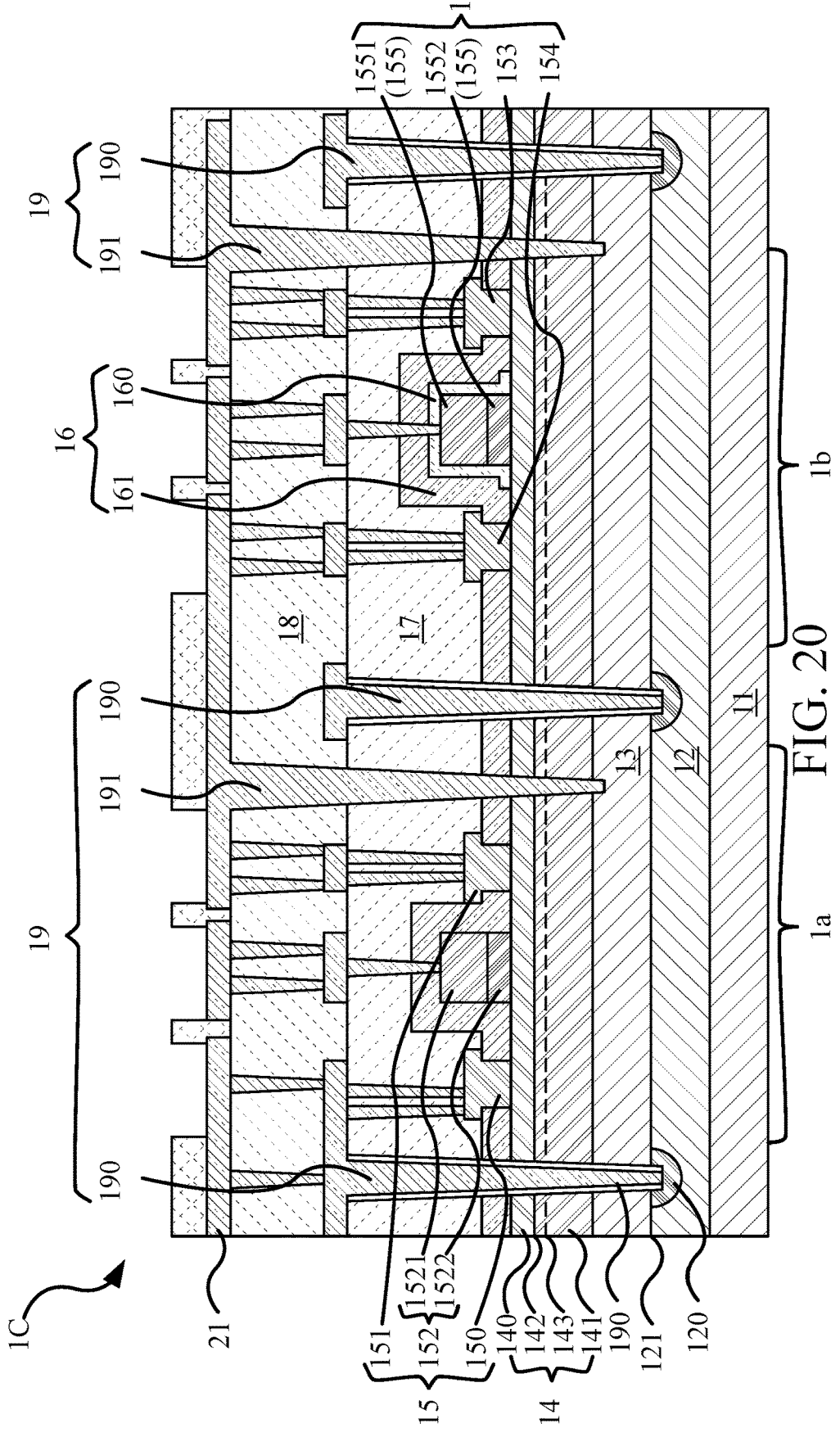
FIG. 20 is a cross-sectional view of the nitride-based semiconductor circuit according to cutting plane line I3 in FIG. 19.

FIG. 19 is a top view of a nitride-based semiconductor circuit according to another embodiment of the present disclosure, and FIG. 20 is a cross-sectional view of the nitride-based semiconductor circuit according to cutting plane line I3 in FIG. 19, and parts of the layers of the semiconductor circuit are omitted in the top view for clarity. To be specific, FIG. 19 only shows a top view of a substrate 12, a heavily doped area 120, and part of a patterned conductive layer 21 thereon for clarity. The nitride-based semiconductor circuit 1C is similar to the nitride-based semiconductor circuit 1A, and the nitride-based semiconductor circuit 1C has substrates 11-13, a nitride-based heterostructure 14, and connectors 15, and the detailed description about the similar components will not be repeated. The nitride-based heterostructure 14 is disposed on the substrate 13, and the connectors 15 are disposed on the nitride-based heterostructure 14.

In this embodiment, the substrate 12 is provided on the substrate 11, and the substrate 13 is provided on the substrate 12, and a pn junction 121 is formed. For example, the substrate 11 has p-type dopants, and the substrate 12 has n-type dopants, and the substrate 13 has p-type dopants. The substrates 11-13 form a p-n-p structure, and the pn junction 121 is located between the substrate 12 and the substrate 13, and the heavily doped area 120 is formed on the substrate 12.

The nitride-based heterostructure 14 is disposed on the substrate 13. The nitride-based heterostructure 14 has a nitride-based semiconductor layer 140, and a nitride-based semiconductor layer 141, and the nitride-based semiconductor layer 140 is disposed on the nitride-based semiconductor layer 141, and a heterojunction 142 is formed with a 2DEG region 143.

The connectors 15 are disposed on the nitride-based heterostructure 14, and the connectors 15 has drain connectors 150, 154, gate connectors 152, 155, source connectors 151, 153. The drain connector 150, the gate connector 152, and the source connector 151 are disposed on the region of a HEMT structure 1a, and the drain connector 154, the gate connector 155, and the source connector 153 are disposed on the region of a HEMT structure 1b.

The nitride-based semiconductor circuit 1C has a plurality of connecting vias 19, and the connecting vias 19 include interconnection 190 and interconnection 191. The interconnection 190 electrically connects the substrate 12 to the drain connector 150, and one of the interconnections 191 electrically connects the substrate 13 to the source connector 151 and the drain connector 154, and another one of the interconnections 191 electrically connects the substrate 13 to the source connector 153. Moreover, the interconnection 190 of this embodiment is electrically connected to the heavily doped area 120 of the substrate 12. Therefore, the pn junction 121 can be reversely biased or zero biased through the connecting vias 19, and the substrate voltage of the HEMT structure 1a does not affect the substrate voltage of the HEMT structure 1b.

In this embodiment, the heavily doped area 120 surrounds both projections 1c, 1d of the HEMT structures 1a, 1b on the substrate 12. Therefore, the substrate voltage of the HEMT structure 1a is isolated from the substrate voltage of the HEMT structure 1b. In other words, the substrate 12 and the substrate 13 form a plurality of diode structures, and all the diode structures under the HEMT structures 1a, 1b are surrounded by the heavily doped area 120, and the diode structures are isolated into two groups.

For example, when the HEMT structure 1a is on and the HEMT structure 1b is off, the pn junction 121 between the substrates 12, 13 under the HEMT structure 1a is zero biased, and the pn junction 121 between the substrates 12, 13 under the HEMT structure 1b is reverse biased, and a depletion region is created in the substrates 12, 13 of the HEMT structure 1b. The voltage of the substrate 13 under the HEMT structure 1b is isolated while the voltage of the substrate 13 under the HEMT structure 1a is changing.

When the HEMT structure 1a is off and the HEMT structure 1b is on, the pn junction 121 between the substrates 12, 13 under the HEMT structures 1a, 1b are both reversely biased, and depletion regions are created in the substrates 12, 13 of the HEMT structures 1a, 1b. The voltage of the substrate 13 under the HEMT structure 1a is isolated while the voltage of the substrate 13 under the HEMT structure 1b is changing.

In other words, the substrate 12 shares the same voltage with the drain connector 150, and the substrate 13 shares the same voltage with the source connector 151 or the source connector 153, and voltages of the substrates 12, 13 reversibly bias the pn junction 121 therebetween.

Also, the nitride-based semiconductor circuit 1C includes passivation layers 16 covering the gate connectors 152, 155, while only the gate connector 155 is directly in contact with the oxide layer 160. The gate connector 152 is only covered by the nitride layer 161. Therefore, the threshold voltages of the HEMT structures 1a, 1b are different. The HEMT structure 1a can be prevented from opening while the HEMT structure 1b is open. In other words, the HEMT structures 1a, 1b can be prevented from accidentally opening by a voltage spike or voltage leakage.

Figure 21:
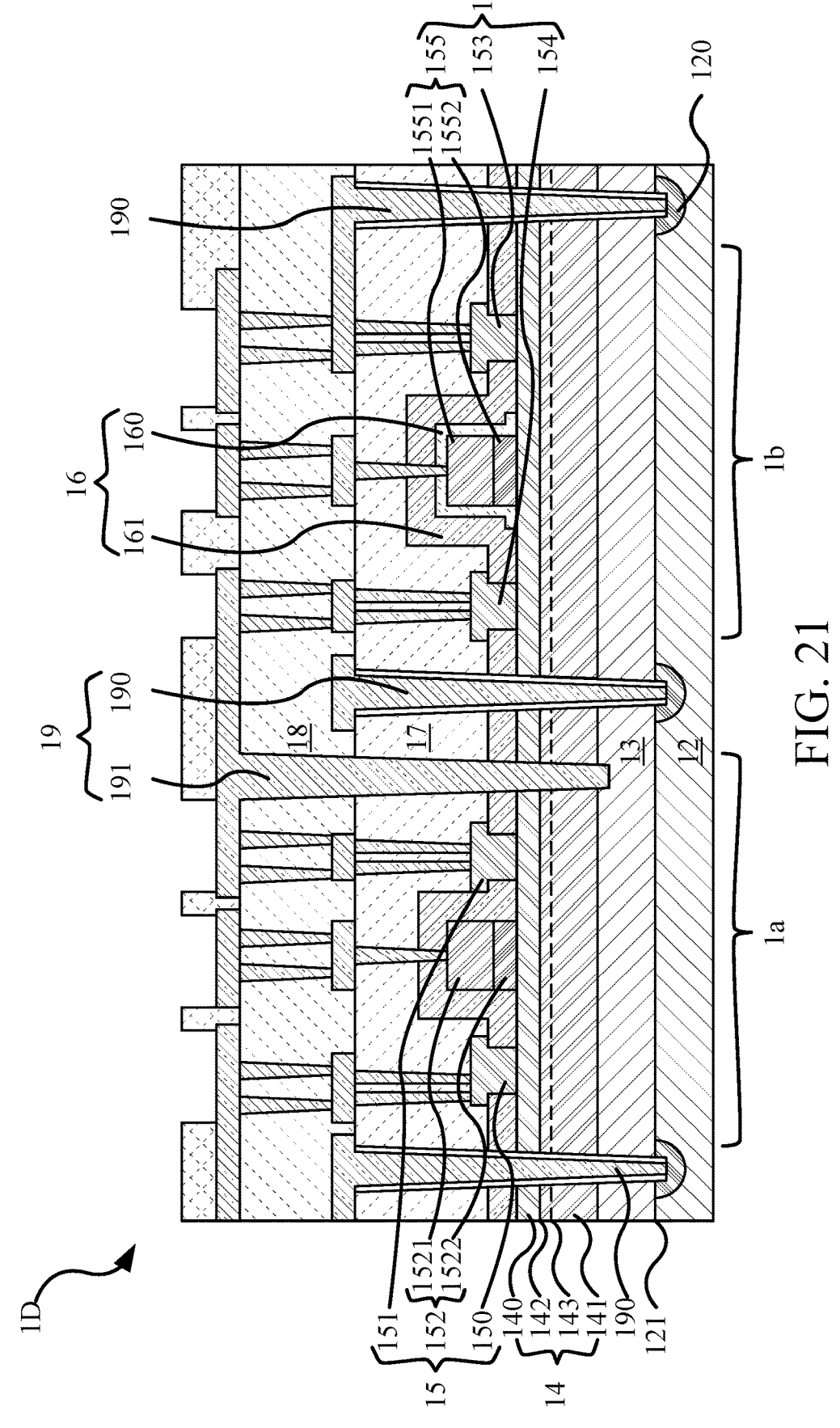
FIG. 21 is a cross-sectional view of a nitride-based semiconductor circuit according to another embodiment of the present disclosure.

FIG. 21 is a cross-sectional view of a nitride-based semiconductor circuit according to another embodiment of the present disclosure. The nitride-based semiconductor circuit 1D is similar to the nitride-based semiconductor circuit 1C, and the detailed description regarding the similar components will not be repeated. The differences between the two circuits are: the nitride-based semiconductor circuit 1C has only a substrate 12 and a substrate 13 being disposed on the substrate 12. Also, the interconnection 190 electrically connects the heavily doped area 120 of the substrate 12 to the source connector 153, and the interconnection 191 electrically connects the substrate 13 to the source connector 151 and the drain connector 154.

For example, the substrate 12 has p-type dopants, and the substrate 13 has n-type dopants, and the source connector 153 is grounded. Therefore, the pn junction 121 under the HEMT structure 1a is always reverse biased, and the substrate voltages of the HEMT structures 1a, 1b are individual isolated.

Figure 22:
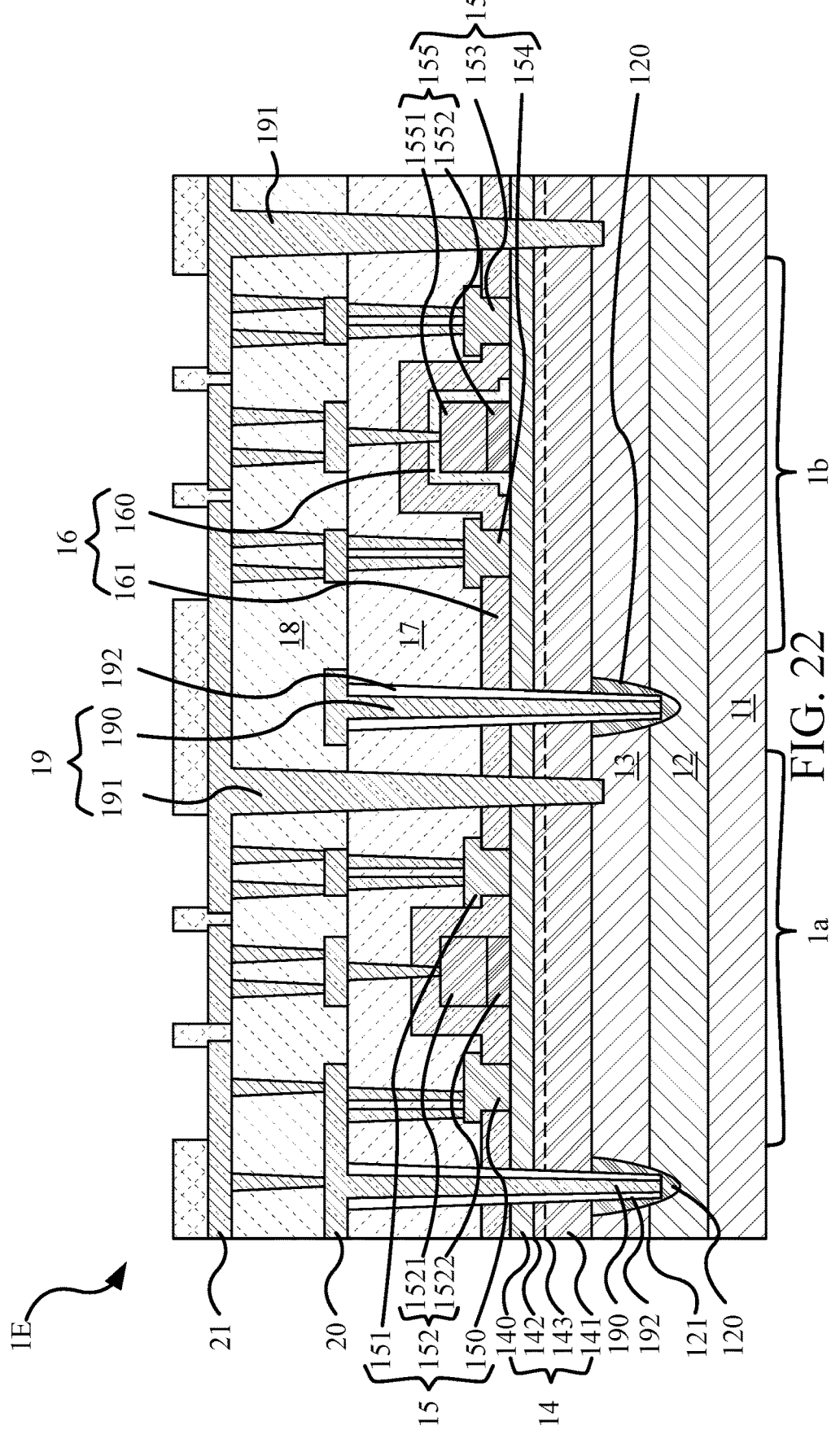
FIG. 22 is a cross-sectional view of a nitride-based semiconductor circuit according to some embodiments of the present disclosure.

FIG. 22 is a cross-sectional view of a nitride-based semiconductor circuit according to an embodiment of the present disclosure. The nitride-based semiconductor circuit 1E has a nitride-based heterostructure 14, connectors 15, passivation layers 16, and patterned conductive layers 20, 21, which are similar to the nitride-based semiconductor circuit 1A, and the detailed description regarding the similar components will not be repeated.

In this embodiment, the nitride-based semiconductor circuit 1E has substrates 11-13, and the substrate 12 is disposed on the substrate 11, and the substrate 13 is disposed on the substrate 12. A heavily doped area 120 is formed, and the heavily doped area 120 is formed across the substrates 12, 13. The heavily doped area 120 is extended from the top surface of the substrate 13 to the inside of the substrate 12. In other words, part of the substrate 12 and part of the substrate 13 thereon form the heavily doped area 120 together, and the heavily doped area 120 is formed after the substrate 13 is disposed on the substrate 12.

For example, the substrate 13 has p-type dopants, and the substrate 12 has n-type dopants, and the heavily doped area 120 is formed through implantation of n-type ions. Therefore, a pn junction is formed between the substrate 13 and the heavily doped area 120, and no current will be transmitted between the heavily doped area 120 and the substrate 13.

The interconnection 190 is electrically connected to the heavily doped area 120, and the interconnection 190 in the substrate 13 is surrounded by the pn junction between the substrate 13 and the heavily doped area 120, and the current from the interconnection 190 can be transmitted to the substrate 12 without leakage in the substrate 13.

A dielectric layer 192 is disposed on the side wall of the opening where the interconnection 190 is disposed. In some embodiment, the interconnection 190 can be directly disposed in the nitride-based semiconductor circuit 1E without being surrounded by the dielectric layer 192.

Figure 23:
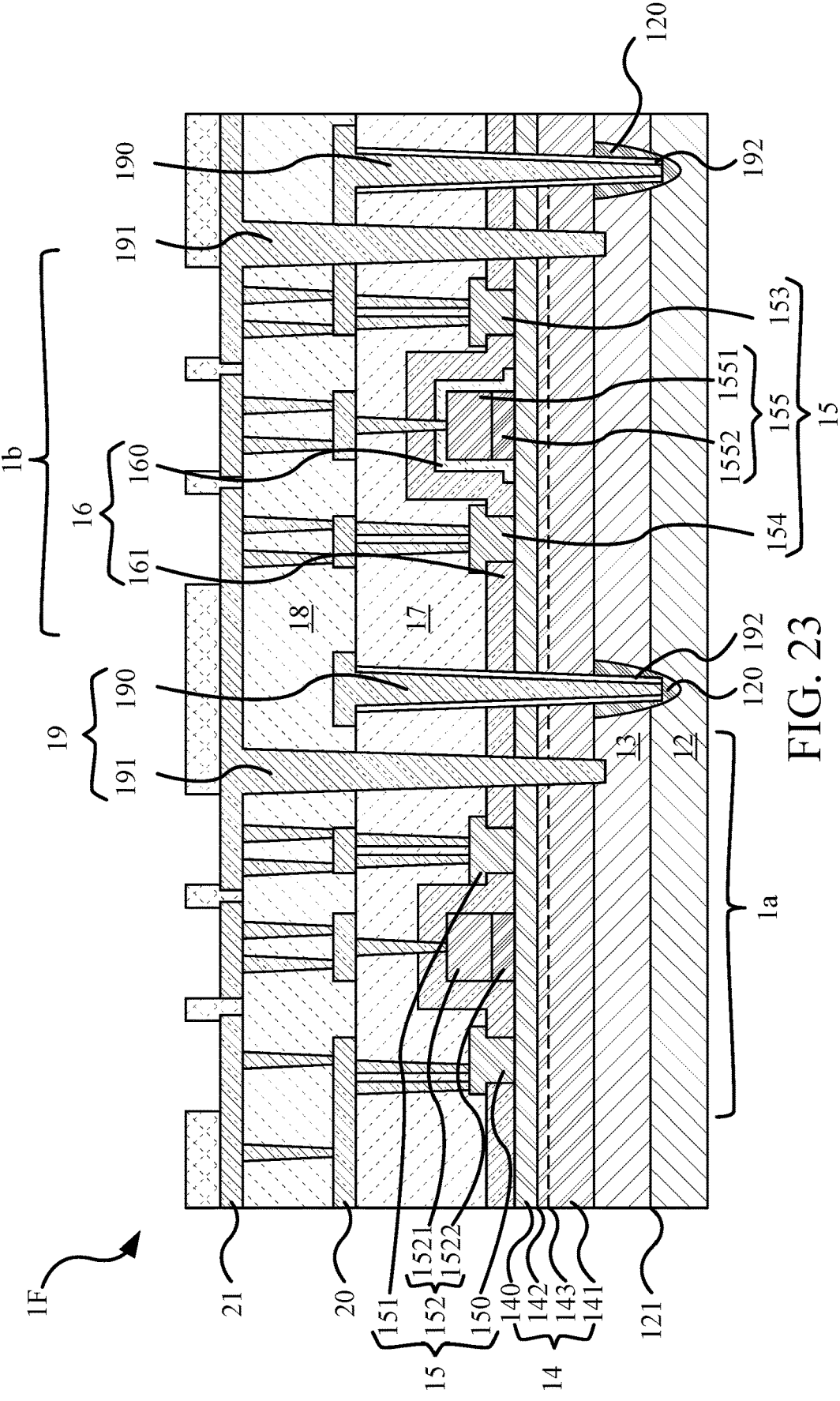
FIG. 23 is a cross-sectional view of a nitride-based semiconductor circuit according to some embodiments of the present disclosure.

FIG. 23 is a cross-sectional view of a nitride-based semiconductor circuit according to an embodiment of the present disclosure. The nitride-based semiconductor circuit 1F has a nitride-based heterostructure 14, connectors 15, passivation layers 16, and patterned conductive layers 20, 21, which are similar to the nitride-based semiconductor circuit 1B, and the detailed description regarding the similar components will not be repeated.

In this embodiment, the nitride-based semiconductor circuit 1F has substrates 12, 13, and the substrate 13 is disposed on the substrate 12. A heavily doped area 120 is formed, and the heavily doped area 120 is formed across the substrates 12, 13. The heavily doped area 120 is extended from the top surface of the substrate 13 to the inside of the substrate 12. In other words, part of the substrate 12 and part of the substrate 13 thereon form the heavily doped area 120 together, and the heavily doped area 120 is formed after the substrate 13 is disposed on the substrate 12.

For example, the substrate 13 has n-type dopants, and the substrate 12 has p-type dopants, and the heavily doped area 120 is formed through implantation of p-type ions. Therefore, pn junction is formed between the substrate 13 and the heavily doped area 120, and no current will be transmitted between the heavily doped area 120 and the substrate 13.

The interconnection 190 is electrically connected to the heavily doped area 120, and the interconnection 190 in the substrate 13 is surrounded by the pn junction between the substrate 13 and the heavily doped area 120, and the current from the interconnection 190 can be transmitted to the substrate 12 without leakage in the substrate 13.

A dielectric layer 192 is disposed on the side wall of the opening where the interconnection 190 is disposed. In some embodiments, the interconnection 190 can be directly disposed in the nitride-based semiconductor circuit 1F without being surrounded by the dielectric layer 192.

Figure 24:
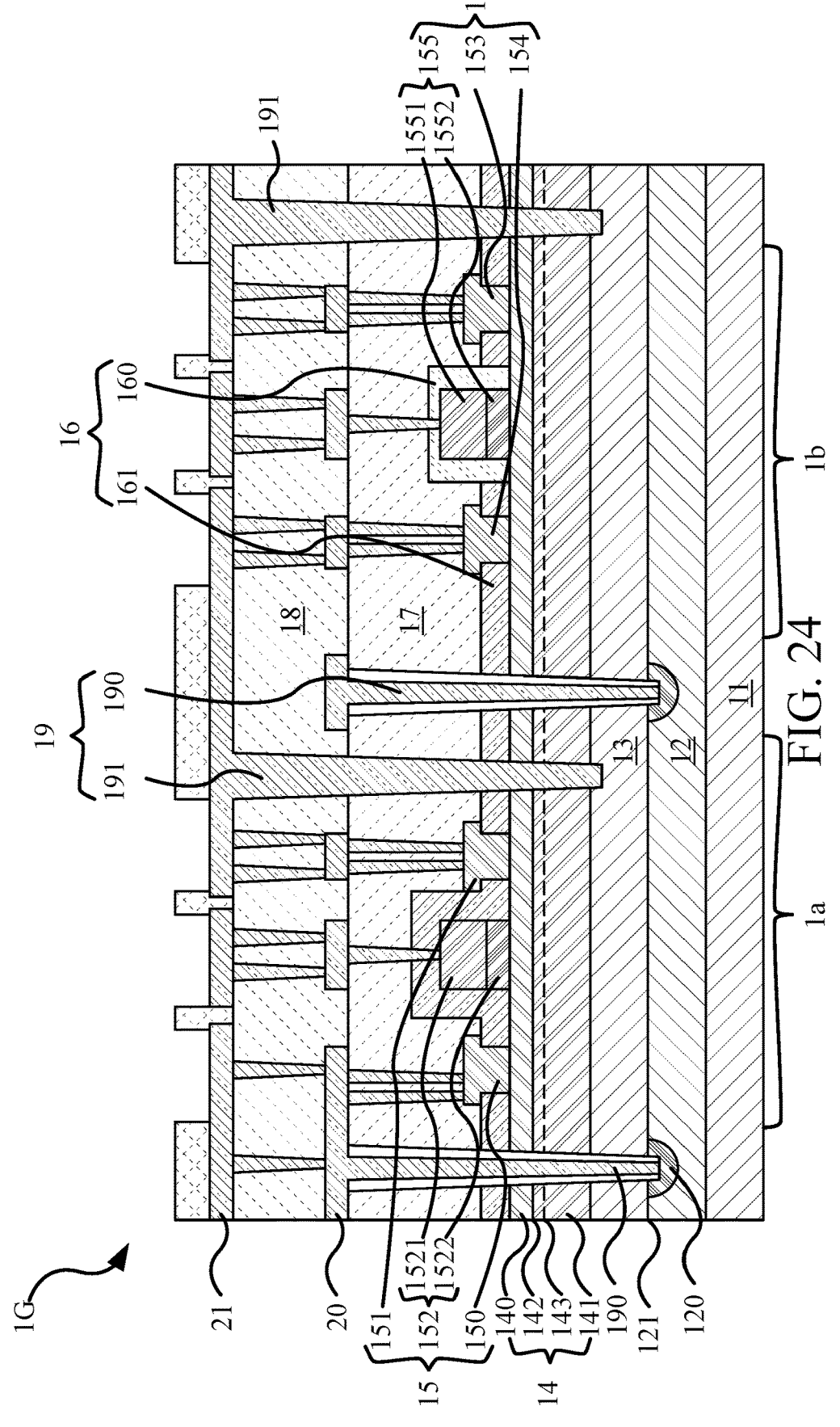
FIG. 24 is a cross-sectional view of a nitride-based semiconductor circuit according to some embodiments of the present disclosure.

FIG. 24 is a cross-sectional view of a nitride-based semiconductor circuit according to an embodiment of the present disclosure. The nitride-based semiconductor circuit 1G has substrates 11-13, a nitride-based heterostructure 14, connectors 15, and patterned conductive layers 20, 21, which are similar to the nitride-based semiconductor circuit 1A, and the detailed description regarding the similar components will not be repeated.

In this embodiment, the nitride-based semiconductor circuit 1G has passivation layers 16, and the passivation layers 16 include an oxide layer 160 and a nitride layer 161. The oxide layer 160 is in contact with the gate connector 155 and isolated from the gate connector 152, and the nitride layer is in contact with the gate connector 152.

To be specific, the gate connector 155 has a doped nitride-based semiconductor layer 1552 and a gate electrode 1551, and the gate electrode 1551 is disposed on the doped nitride-based semiconductor layer 1552. The oxide layer 160 covers the side surface of the doped nitride-based semiconductor layer 1552, and the doped nitride-based semiconductor layer 1552 makes contact with the oxide layer 160. The top surface of the oxide layer 160 is not covered by the nitride layer 161, and the nitride layer 161 only covers lower part of side surface of the oxide layer 160. The ILD layer 17 makes contact with the oxide layer 160 and the nitride layer 161. Therefore, the HEMT structures 1a, 1b may have different threshold voltages. The HEMT structure 1a can be prevented from opening while the HEMT structure 1b is open. In other words, the HEMT structures 1a, 1b can be prevented from accidentally opening by a voltage spike or voltage leakage.

FIGS. 25-28 are cross-sectional views of steps of manufacturing the nitride-based semiconductor circuit 1G, and FIGS. 25-28 illustrate the manufacturing method of the passivation layers 16 of the nitride-based semiconductor circuit 1G, and the remaining steps of the manufacturing method are substantially similar to the embodiment shown in FIGS. 3-16, discussed in detail above.

Figure 25:
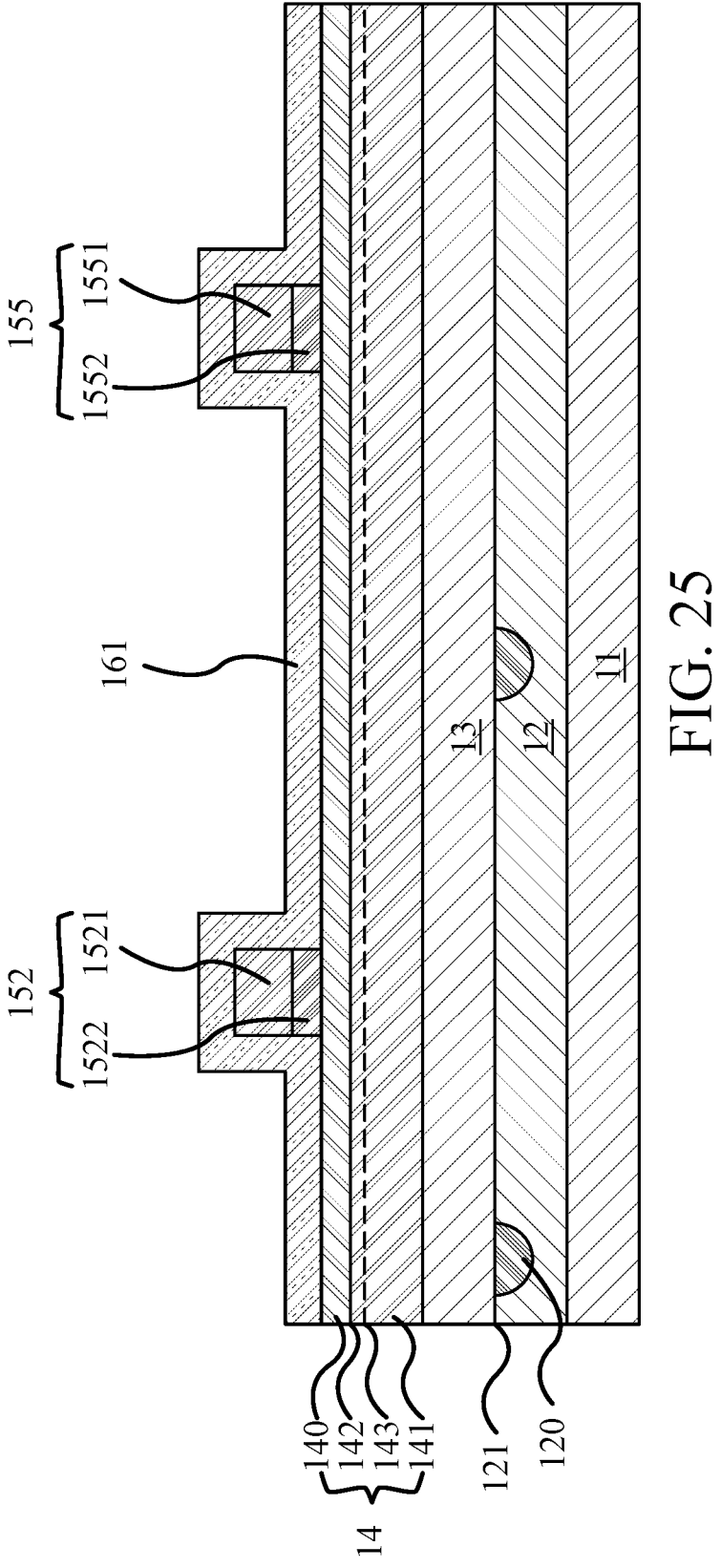
FIGS. 25-28 are cross-sectional views of steps of manufacturing the nitride-based semiconductor circuit according to some embodiments of the present disclosure.

Referring to FIG. 25, the substrate 12 is disposed on the substrate 11, and the substrate 12 has a heavily doped area 120. The substrate 13 is disposed on the substrate 12, and the pn junction 121 is formed between the substrates 12, 13.

The nitride-based heterostructure 14 is disposed on the substrate 13, and the nitride-based heterostructure 14 has the nitride-based semiconductor layers 140, 141. A heterojunction 142 is formed between the nitride-based semiconductor layers 140, 141 with the 2DEG region 143.

The gate connectors 152, 155 are disposed on the nitride-based heterostructure 14, and the nitride layer 161 is disposed on the gate connectors 152, 155 and the nitride-based heterostructure 14. For example, the nitride layer 161 may comprise silicon nitride, and the nitride layer 161 may be formed through LPCVD. In this step, both the gate connectors 152, 155 make contact with the nitride layer 161.

Figure 26:
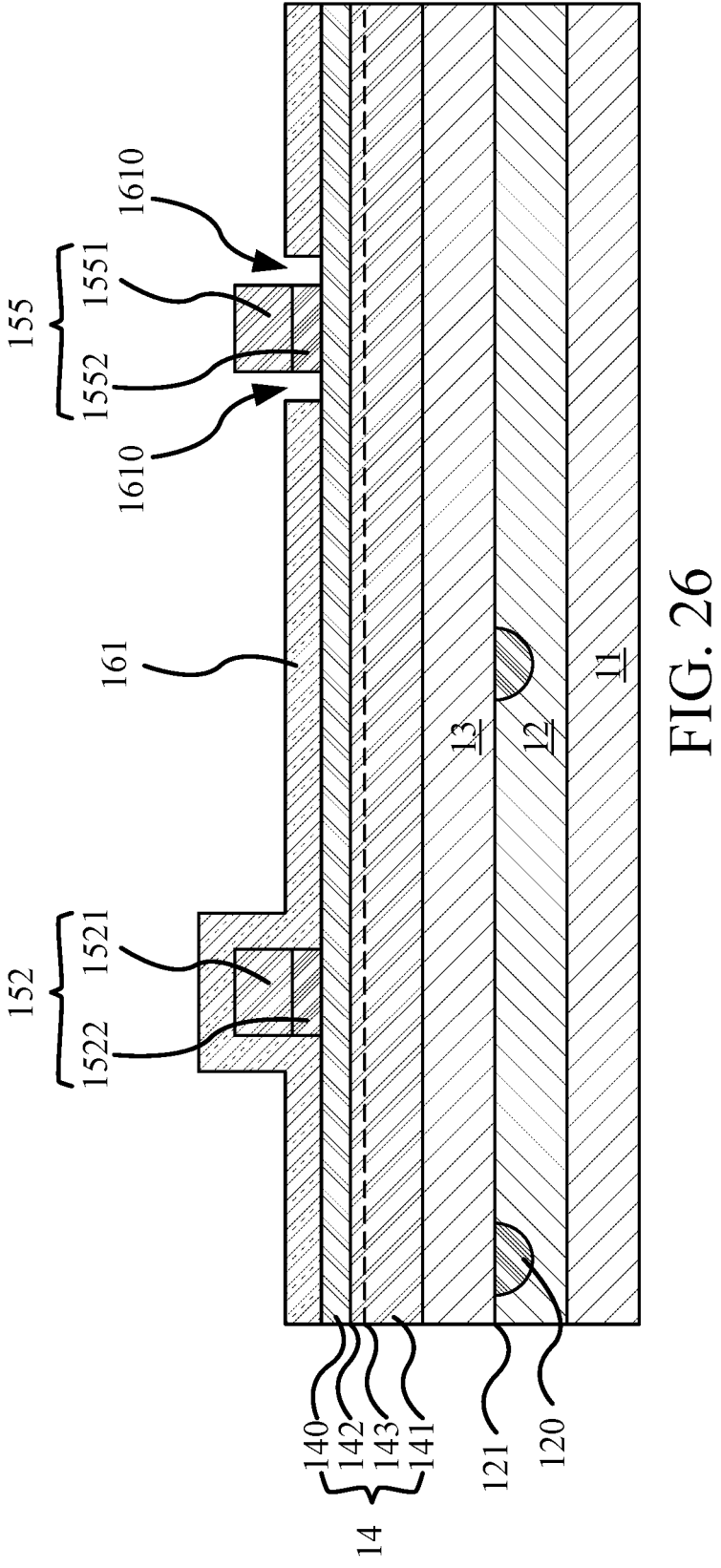

Referring to FIG. 26, the nitride layer 161 is etched. This step etches the nitride layer in contact with the gate connector 155, and the side surface and the top surface of the gate connector 155 are exposed. Furthermore, openings 1610 are formed around the gate connector 155, and the openings 1610 expose the top surface of the nitride-based semiconductor layer 140. At this step, the nitride layer 161 that covered the surface of the doped nitride-based semiconductor layer 1552 is etched.

Figure 27:
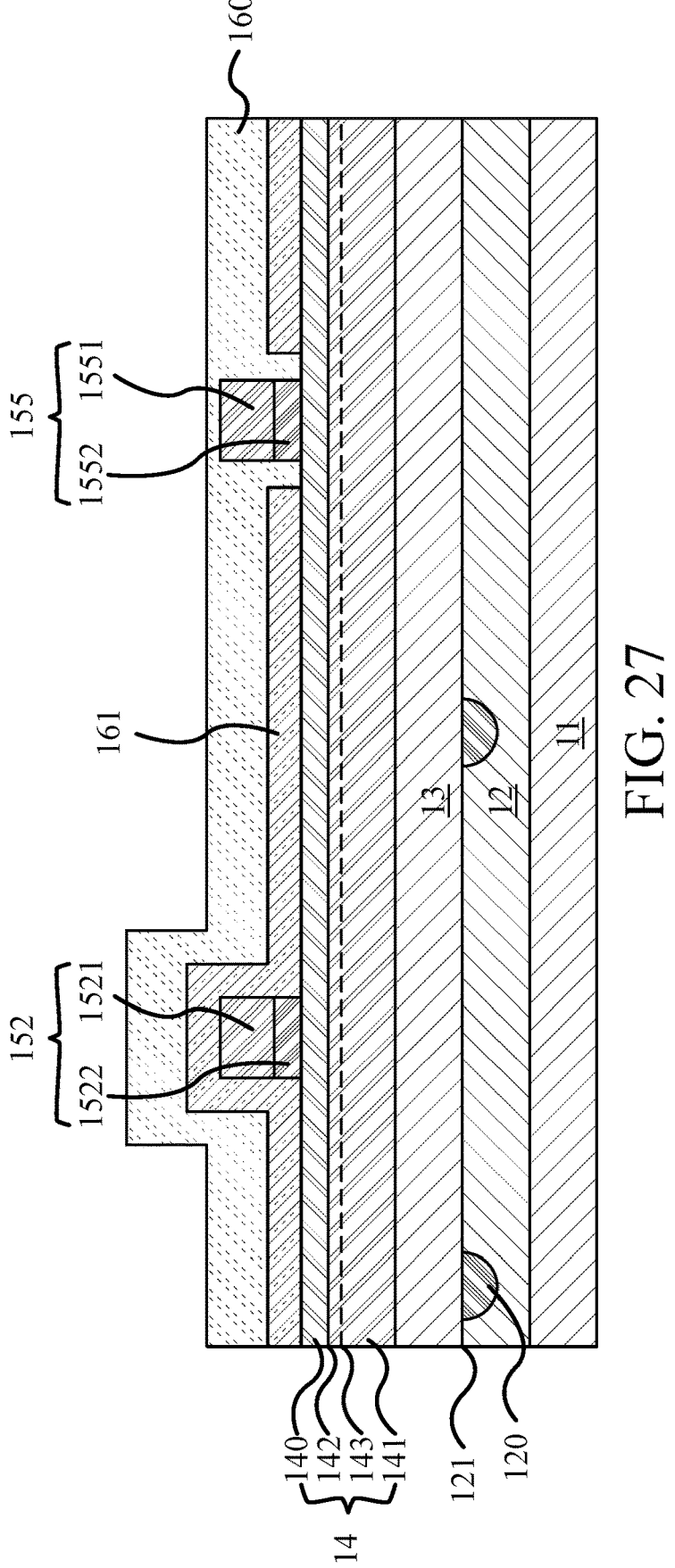

Referring to FIG. 27, the oxide layer 160 is disposed on the nitride layer 161 and the gate connector 155, and the oxide layer 160 fills the openings 1610 as shown in FIG. 26. The oxide layer 160 is applied through PECVD, and the oxide layer 160 makes contact with the gate connector 155.

Figure 28:
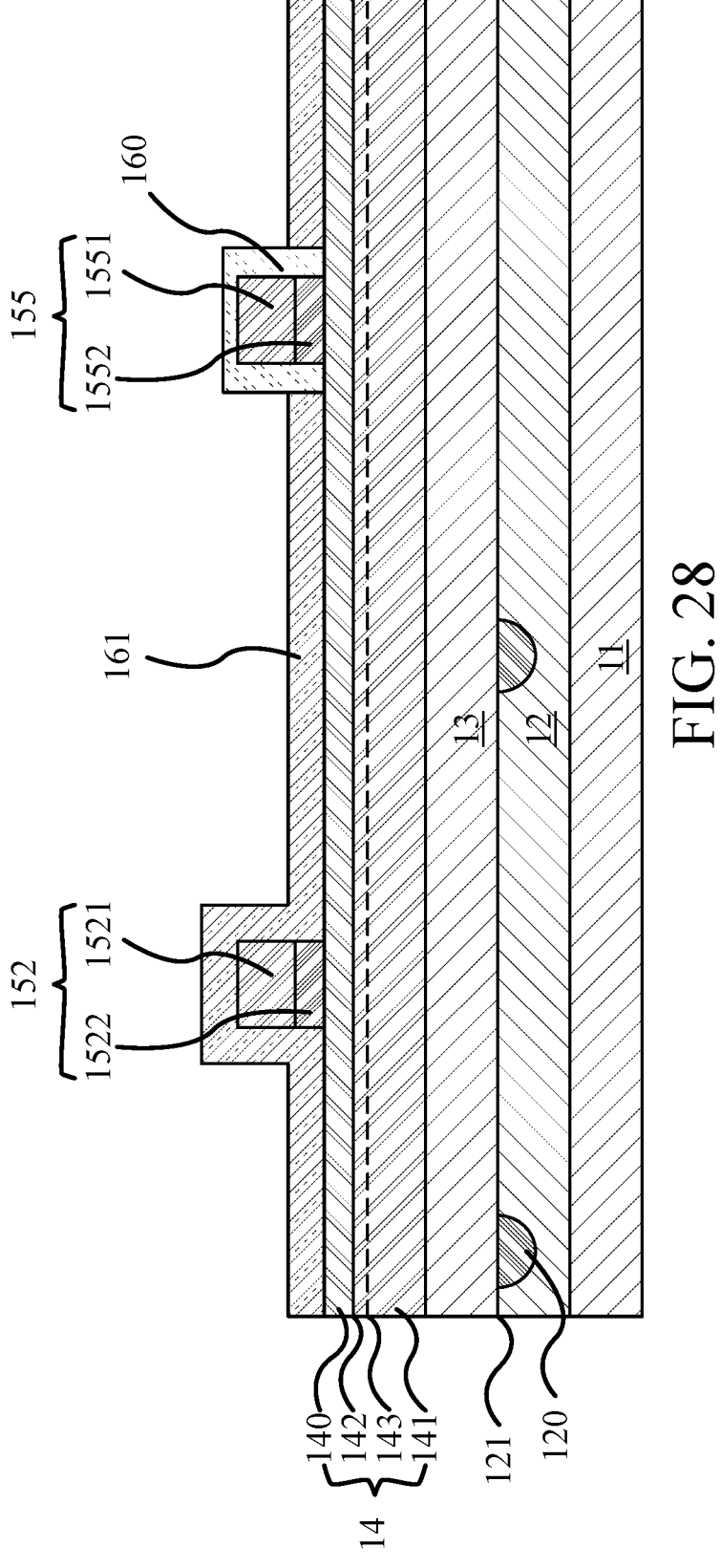

Referring to FIG. 28, the oxide layer 160 is etched, and only the oxide layer 160 that is in contact with the gate connector 155 is remained. The oxide layer 160 near the gate connector 152 is etched. In this embodiment, the gate connector 155 is only covered by the oxide layer 160.

The hydrogen concentration of oxide layer 160 is different from the hydrogen concentration of nitride layer 161, and the doped nitride-based semiconductor layer 1552 is in direct contact with the oxide layer 160. While the doped nitride-based semiconductor layers 1522, 1552 are doped with p-type dopant, activation of magnesium in the doped nitride-based semiconductor layer 1522 and activation of magnesium in the doped nitride-based semiconductor layer 1552 can be different during exposure to a high temperature thermal environment. Therefore, the threshold voltage of the HEMT structure 1a is different from the threshold voltage of the HEMT structure 1b as shown in FIG. 24. The HEMT structure 1a can be prevented from opening while the HEMT structure 1b is open. In other words, the HEMT structures 1a, 1b can be prevented from accidentally opening due to a voltage spike or voltage leakage.

In other words, in some embodiments of the present disclosure, the oxide layer 160 can be formed before the deposition of the nitride layer 161. In some other embodiments of the present disclosure, the oxide layer 160 can be formed after the deposition of the nitride layer 161.

Figure 29:
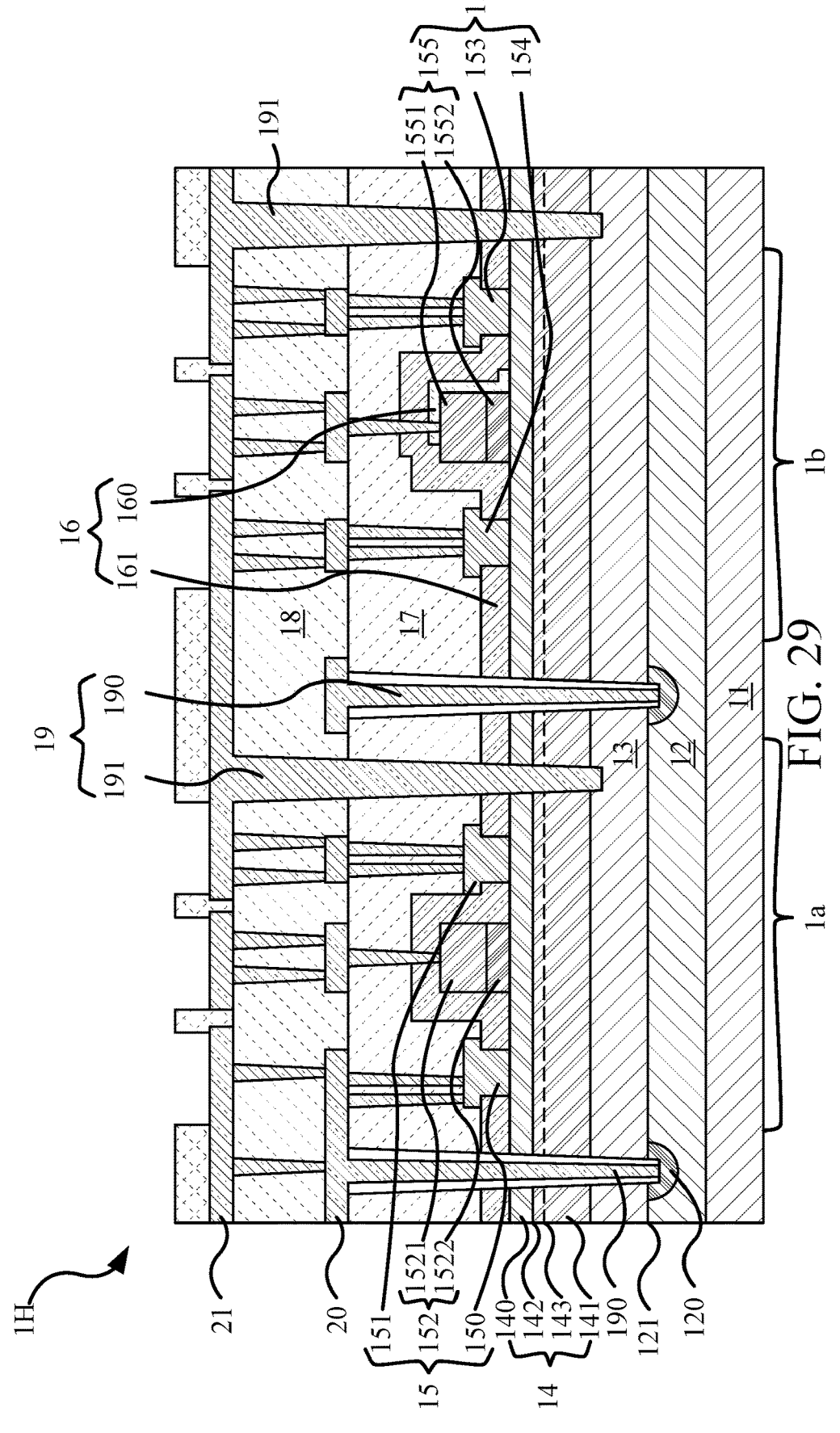
FIG. 29 is a cross-sectional view of a nitride-based semiconductor circuit according to some embodiments of the present disclosure.

FIG. 29 is a cross-sectional view of a nitride-based semiconductor circuit according to some embodiments of the present disclosure. The nitride-based semiconductor circuit 1H has substrates 11-13, a nitride-based heterostructure 14, connectors 15, patterned conductive layers 20, 21, and connecting vias 19, which are similar to the nitride-based semiconductor circuit 1A, and the detailed description regarding the similar components will not be repeated.

In this embodiment, part of the oxide layer 160 on the gate connector 155 is etched. To be specific, parts of the side surface and the top surface of the gate electrode 1551 of the gate connector 155 are free from coverage of the oxide layer 160. Part of the side surface of the doped nitride-based semiconductor layer 1552 is free from coverage of the oxide layer 160, and the rest of the side surface of the doped nitride-based semiconductor layer 1552 is in contact with the oxide layer 160. Therefore, the oxide layer 160 may be reduced in size, and the threshold voltage of the HEMT structure 1b and the threshold voltage of the HEMT structure 1a are different. For example, the threshold voltage of the HEMT structure 1b is higher than the threshold voltage of the HEMT structure 1a, and the HEMT structure 1a can be prevented from opening while the HEMT structure 1b is turned on.

Figure 30:
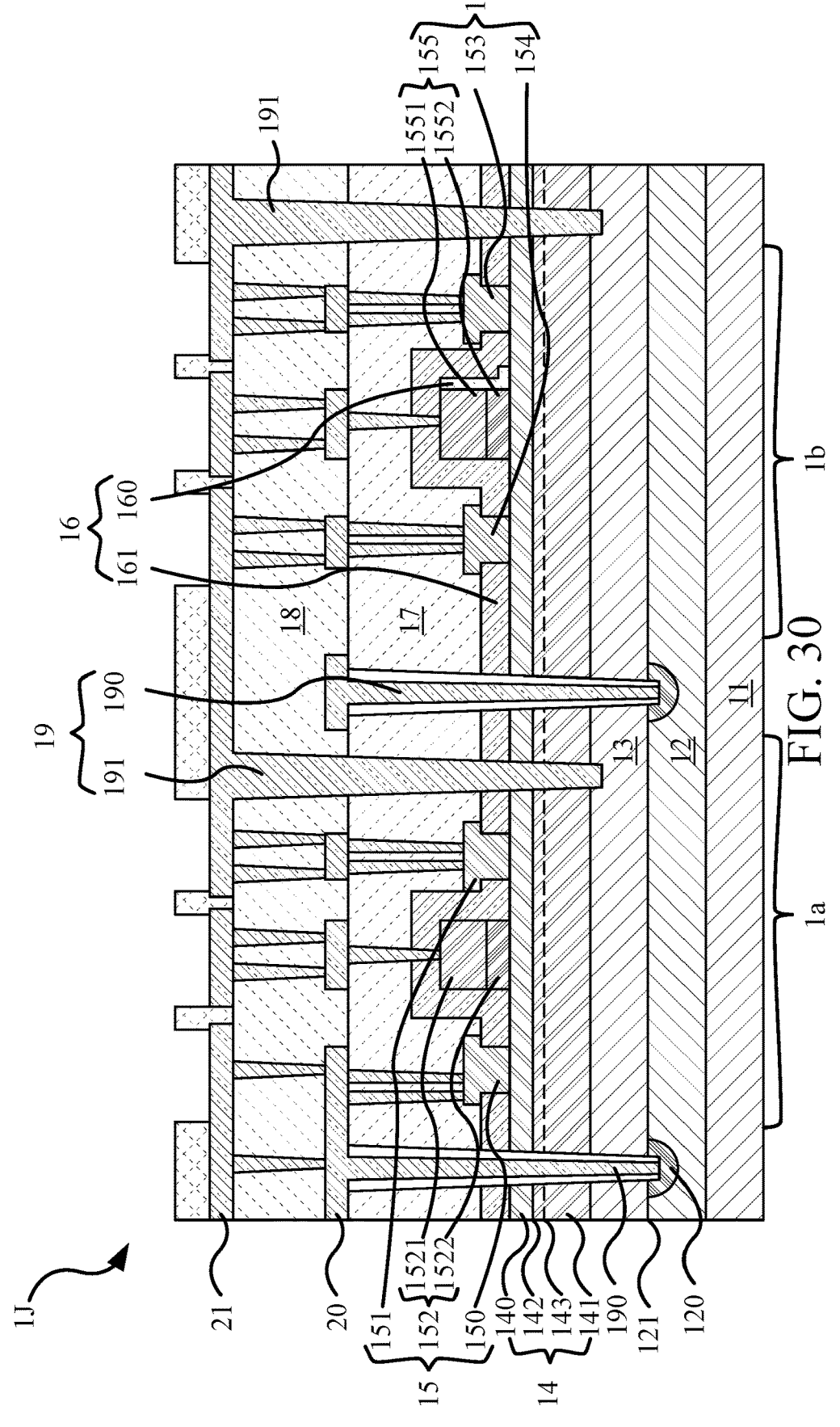
FIG. 30 is a cross-sectional view of a nitride-based semiconductor circuit according to some embodiments of the present disclosure.

FIG. 30 is a cross-sectional view of a nitride-based semiconductor circuit according to an embodiment of the present disclosure. The nitride-based semiconductor circuit 1J has substrates 11-13, a nitride-based heterostructure 14, connectors 15, patterned conductive layers 20, 21, and connecting vias 19, which are similar to the nitride-based semiconductor circuit 1A, and the detailed description regarding the similar components will not be repeated.

In this embodiment, part of the oxide layer 160 on the gate connector 155 is etched. To be specific, the top surface and part of the side surface of the gate electrode 1551 of the gate connector 155 are free from coverage of the oxide layer 160. Part of the side surface of the doped nitride-based semiconductor layer 1552 is free from coverage of the oxide layer 160, and the rest of the side surface of the doped nitride-based semiconductor layer 1552 is in contact with the oxide layer 160. Therefore, the oxide layer 160 may reduce its size, and the threshold voltage of the HEMT structure 1b and the threshold voltage of the HEMT structure 1a are different.

For example, the threshold voltage of the HEMT structure 1b is higher than the threshold voltage of the HEMT structure 1a, and the HEMT structure 1a can be prevented from opening while the HEMT structure 1b is turned on.

Figure 31:
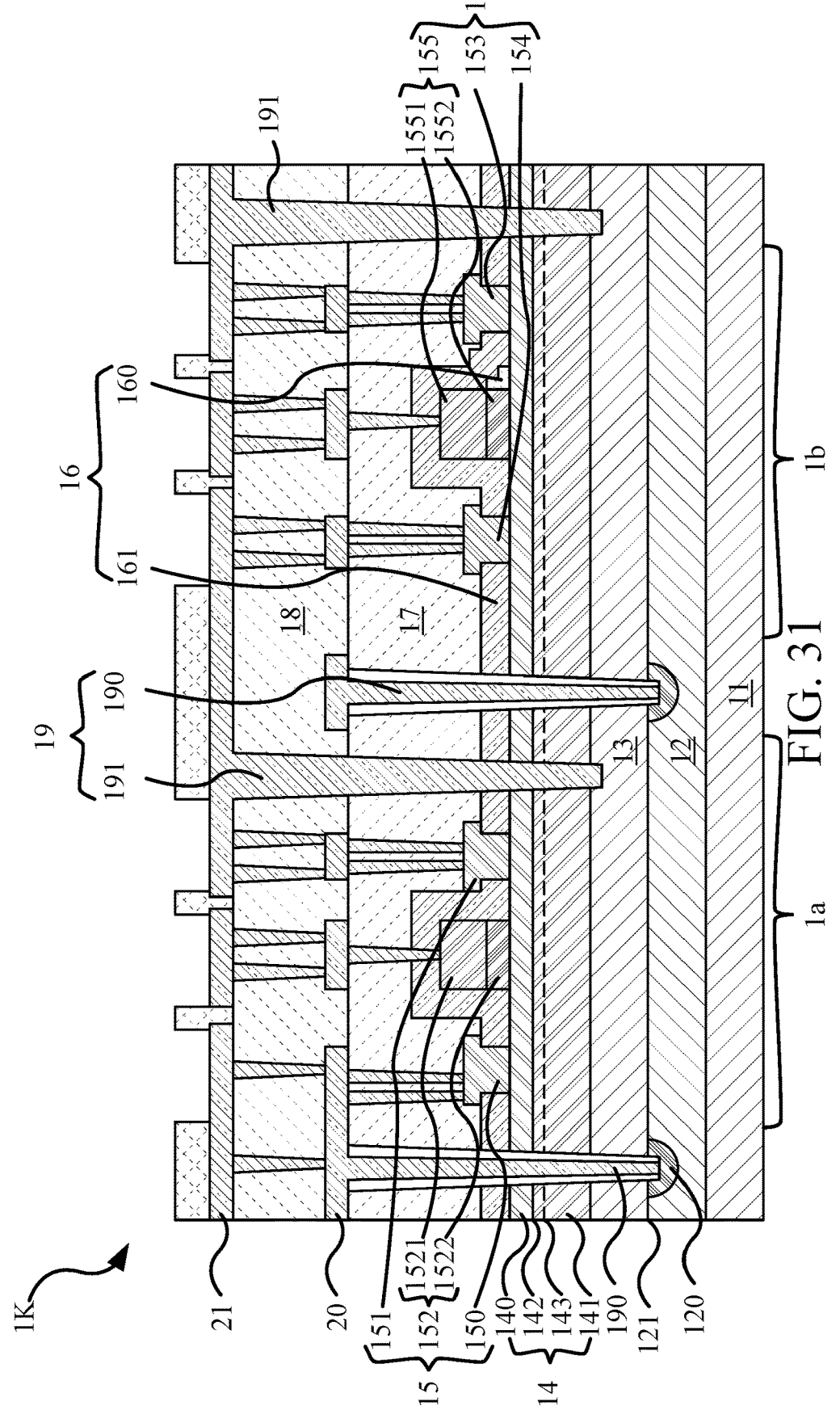
FIG. 31 is a cross-sectional view of a nitride-based semiconductor circuit according to some embodiments of the present disclosure.

FIG. 31 is a cross-sectional view of a nitride-based semiconductor circuit according to an embodiment of the present disclosure. The nitride-based semiconductor circuit 1K has substrates 11-13, a nitride-based heterostructure 14, connectors 15, patterned conductive layers 20, 21, and connecting vias 19, which are similar to the nitride-based semiconductor circuit 1A, and the detailed description regarding the similar components will not be repeated.

In this embodiment, part of the oxide layer 160 on the gate connector 155 is etched. To be specific, side surface and the top surface of the gate electrode 1551 of the gate connector 155 are free from coverage of the oxide layer 160. Part of the side surface of the doped nitride-based semiconductor layer 1552 is free from coverage of the oxide layer 160, and the rest of the side surface of the doped nitride-based semiconductor layer 1552 is in contact with the oxide layer 160. Therefore, the oxide layer 160 may reduce its size, and the threshold voltage of the HEMT structure 1b and the threshold voltage of the HEMT structure 1a are different. For example, the threshold voltage of the HEMT structure 1b is higher than the threshold voltage of the HEMT structure 1a, and the HEMT structure 1a can be prevented from opening while the HEMT structure 1b is turned on.

Figure 32:
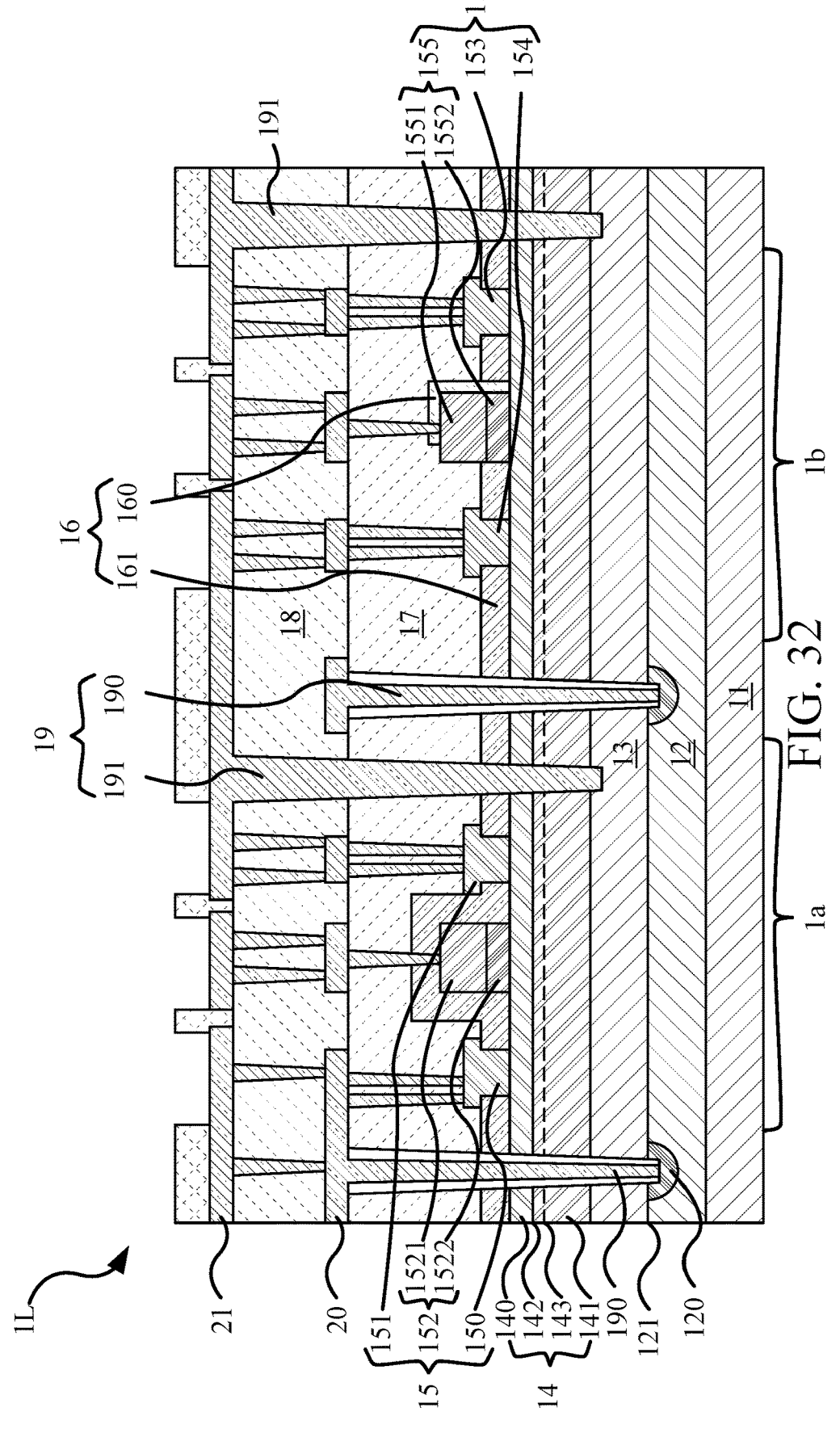
FIG. 32 is a cross-sectional view of a nitride-based semiconductor circuit according to some embodiments of the present disclosure.

FIG. 32 is a cross-sectional view of a nitride-based semiconductor circuit according to some embodiments of the present disclosure. The nitride-based semiconductor circuit 1L has substrates 11-13, a nitride-based heterostructure 14, connectors 15, patterned conductive layers 20, 21, and connecting vias 19, which are similar to the nitride-based semiconductor circuit 1G, and the detailed description regarding the similar components will not be repeated.

In this embodiment, the oxide layer 160 is disposed after the deposition and etching of the nitride layer 161. Part of the oxide layer 160 on the gate connector 155 is etched. To be specific, parts of the top surface and side surface of the gate electrode 1551 of the gate connector 155 are free from coverage of the oxide layer 160. Part of the side surface of the doped nitride-based semiconductor layer 1552 is free from coverage of the oxide layer 160, and the rest of the side surface of the doped nitride-based semiconductor layer 1552 is in contact with the oxide layer 160. Therefore, the oxide layer 160 may reduce its size, and the threshold voltage of the HEMT structure 1b and the threshold voltage of the HEMT structure 1a are different. For example, the threshold voltage of the HEMT structure 1b is higher than the threshold voltage of the HEMT structure 1a, and the HEMT structure 1a can be prevented from opening while the HEMT structure 1b is turned on.

Figure 33:
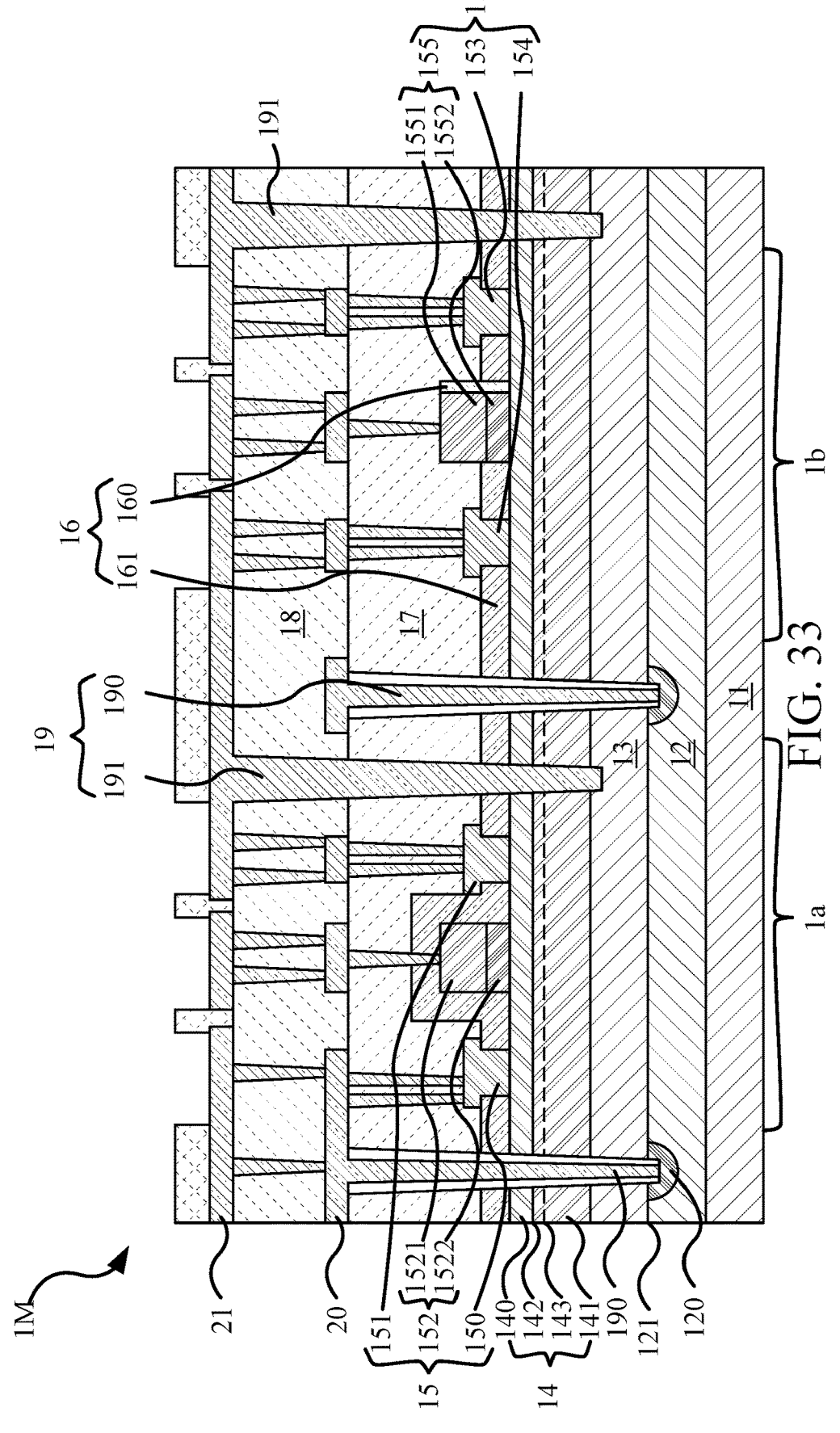
FIG. 33 is a cross-sectional view of a nitride-based semiconductor circuit according to some embodiments of the present disclosure.

FIG. 33 is a cross-sectional view of a nitride-based semiconductor circuit according to some embodiments of the present disclosure. The nitride-based semiconductor circuit 1M has substrates 11-13, a nitride-based heterostructure 14, connectors 15, patterned conductive layers 20, 21, and connecting vias 19, which are similar to the nitride-based semiconductor circuit 1G, and the detailed description regarding the similar components will not be repeated.

In this embodiment, the oxide layer 160 is disposed after the deposition and etching of the nitride layer 161. Part of the oxide layer 160 on the gate connector 155 is etched. To be specific, the top surface and part of the side surface of the gate electrode 1551 of the gate connector 155 are free from coverage of the oxide layer 160. Part of the side surface of the doped nitride-based semiconductor layer 1552 is free from coverage of the oxide layer 160, and the rest of the side surface of the doped nitride-based semiconductor layer 1552 is in contact with the oxide layer 160. Therefore, the oxide layer 160 may be reduced in size, and the threshold voltage of the HEMT structure 1b and the threshold voltage of the HEMT structure 1a are different. For example, the threshold voltage of the HEMT structure 1b is higher than the threshold voltage of the HEMT structure 1a, and the HEMT structure 1a can be prevented from opening while the HEMT structure 1b is turned on.

Figure 34:
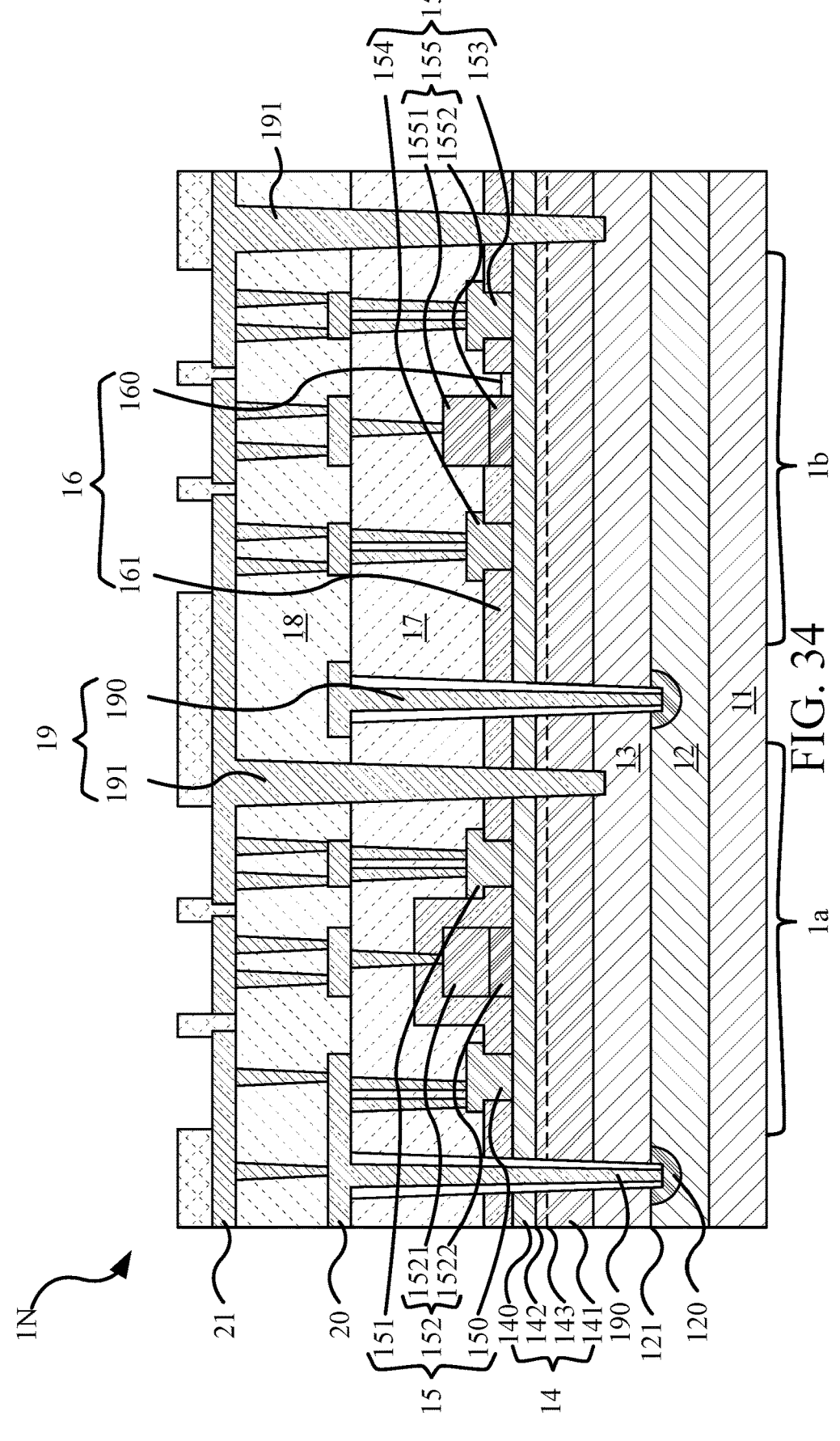
FIG. 34 is a cross-sectional view of a nitride-based semiconductor circuit according to some embodiments of the present disclosure.

FIG. 34 is a cross-sectional view of a nitride-based semiconductor circuit according to some embodiments of the present disclosure. The nitride-based semiconductor circuit 1N has substrates 11-13, a nitride-based heterostructure 14, connectors 15, patterned conductive layers 20, 21, and connecting vias 19, which are similar to the nitride-based semiconductor circuit 1G, and the detailed description regarding the similar components will not be repeated.

In this embodiment, the oxide layer 160 is disposed after the deposition and etching of the nitride layer 161. Part of the oxide layer 160 on the gate connector 155 is etched. To be specific, the gate electrode 1551 is isolated from the oxide layer 160, and the side surface and the top surface of the gate electrode 1551 of the gate connector 155 are free from coverage of the oxide layer 160. Part of the side surface of the doped nitride-based semiconductor layer 1552 is free from coverage of the oxide layer 160, and the rest of the side surface of the doped nitride-based semiconductor layer 1552 is in contact with the oxide layer 160. Therefore, the oxide layer 160 may be reduced in size, and the threshold voltage of the HEMT structure 1b and the threshold voltage of the HEMT structure 1a are different. For example, the threshold voltage of the HEMT structure 1b is higher than the threshold voltage of the HEMT structure 1a, and the HEMT structure 1a can be prevented from opening while the HEMT structure 1b is turned on.

Figure 35:
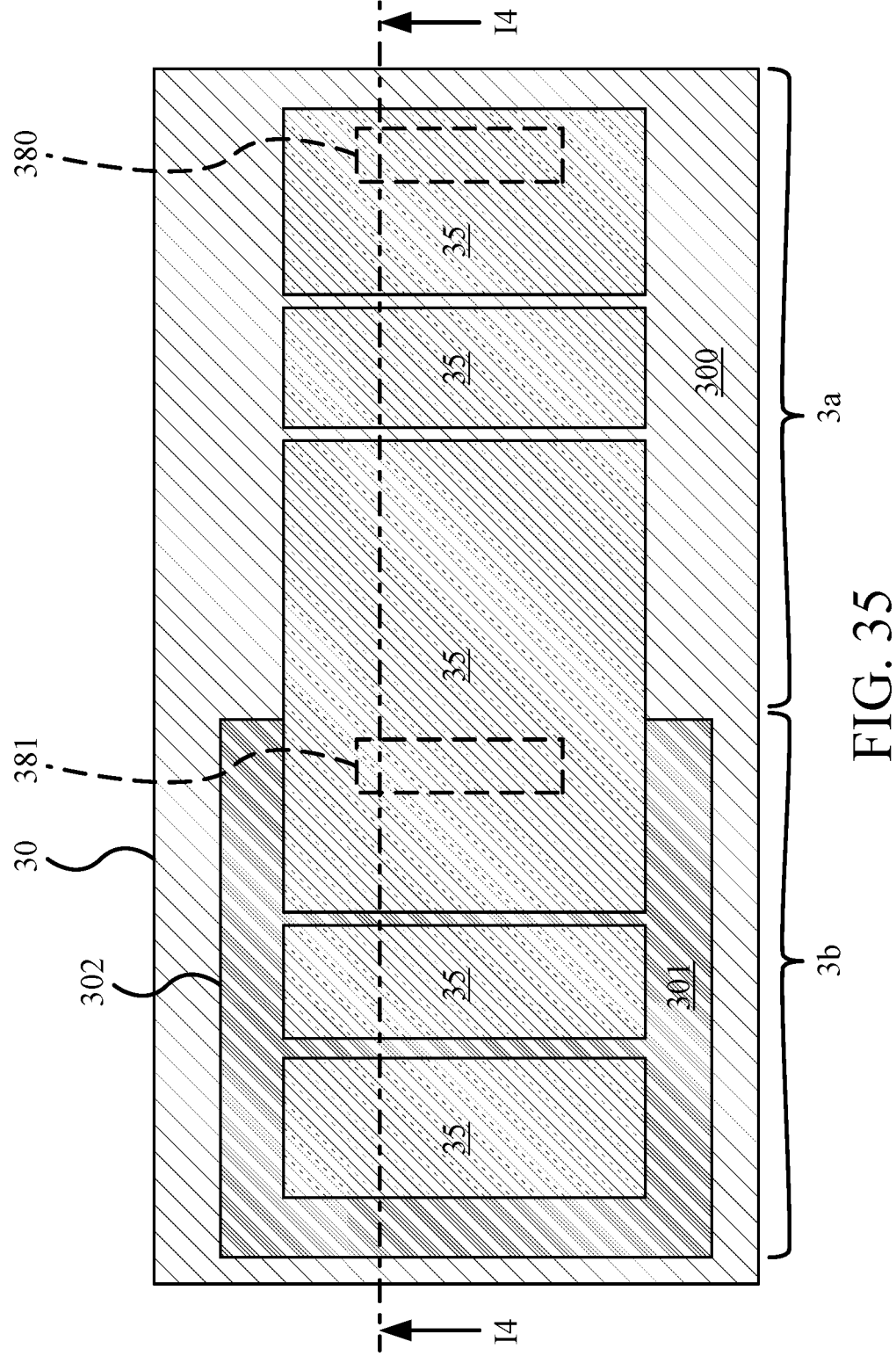
FIG. 35 is a top view of a nitride-based semiconductor circuit according to some embodiments of the present disclosure.
Figure 36:
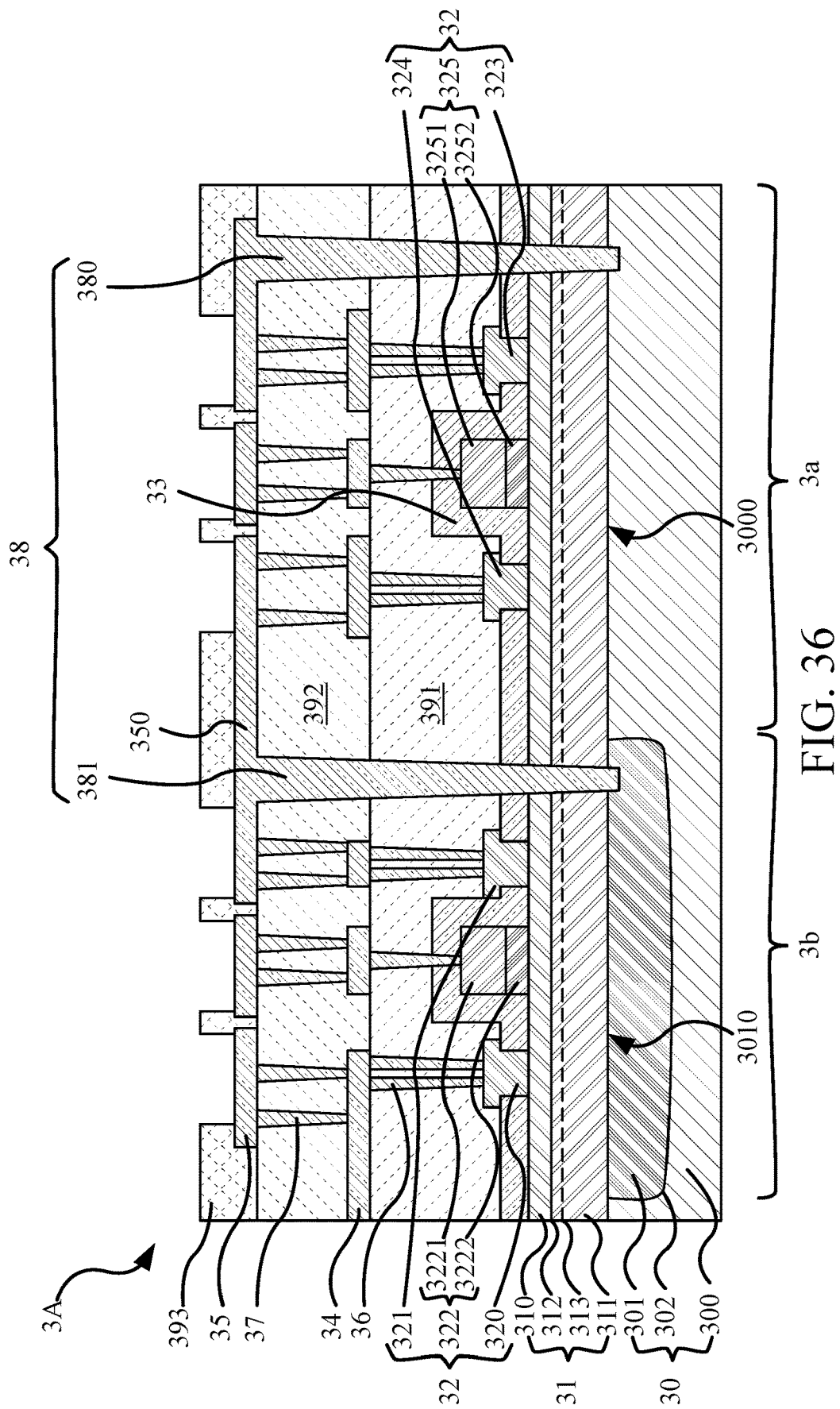
FIG. 36 is a cross-sectional view of the nitride-based semiconductor circuit according to cutting plane line I4 in FIG. 35.

FIG. 35 is a top view of a nitride-based semiconductor circuit 3A according to some embodiments of the present disclosure, and FIG. 36 is a cross-sectional view of the nitride-based semiconductor circuit 3A according to cutting plane line I4 in FIG. 35, and parts of layers of the nitride-based semiconductor circuit 3A are omitted in the top view for clarity. FIG. 35 only shows top view of a substrate structure 30, and a patterned conductive layer 35.

The nitride-based semiconductor circuit 3A includes a substrate structure 30, a nitride-based heterostructure 31, a plurality of connectors 32, and a plurality of connecting vias 38. The substrate structure 30 includes a semiconductor substrate 300, and a semiconductor substrate 301. The semiconductor substrate 300 has a region 3a and region 3b. The region 3a is adjacent to the region 3b. The semiconductor substrate 301 is embedded in the region 3b of the semiconductor substrate 300. A top surface 3000 of the semiconductor substrate 300 and a top surface 3010 of the semiconductor substrate 301 are coplanar. The semiconductor substrate 300 has dopants, and the semiconductor substrate 301 has dopants that are different from the dopants of the semiconductor substrate 300, and a pn junction 302 is formed between the semiconductor substrates 300, 301. For example, the semiconductor substrates 300, 301 may include silicon.

The nitride-based heterostructure 31 is disposed on the substrate structure 30, and the nitride-based heterostructure 31 is disposed on both the semiconductor substrate 300 and the semiconductor substrate 301. The connectors 32 are disposed on the nitride-based heterostructure 31. The connecting vias 38 go through the nitride-based heterostructure 31. The connecting vias 38 includes interconnection 380 and interconnection 381. The interconnection 380 electrically connects the region 3a of the semiconductor substrate 300 to one of the connectors 32, and the interconnection 381 electrically connects the semiconductor substrate 301 to another one of the connectors 32.

In some embodiments, the connectors 32 and connecting vias 38 can include, for example but are not limited to, metals, alloys, doped semiconductor materials (such as doped crystalline silicon), compounds such as silicides and nitrides, other conductor materials, or combinations thereof. The exemplary materials of the connectors 32 and connecting vias 38 can include, for example but are not limited to, W, Au, Pd, Ta, Co, Ni, Pt, Mo, Ti, AlSi, TiN, or combination thereof. The connectors 32 and connecting vias 38 may be a single layer, or plural layers of the same or different composition. In some embodiments, the connectors 32 and connecting vias 38 form ohmic contacts with the nitride-based heterostructure 31 or semiconductor substrates 300, 301. The ohmic contacts can be achieved by applying Ti, Al, or other suitable materials to the connectors 32 and connecting vias 38. In some embodiments, each of the connectors 32 and connecting vias 38 is formed by at least one conformal layer and a conductive filling. The conformal layer can surround the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

In this embodiment, the pn junction 302 separate the substrate structure 30 into two parts, and some of the connectors 32 are disposed above the semiconductor substrate 301, and some of the connectors 32 are disposed above the region 3a of the semiconductor substrate 300. The substrate voltage of the semiconductor substrate 301 does not affect the substrate voltage of the semiconductor substrate 300. Moreover, the interconnection 381 is electrically connected to the semiconductor substrate 301, and the interconnection 380 is electrically connected to the semiconductor substrate 300. Therefore, the connecting vias 38 can reversely bias the pn junction 302, and a depletion region is formed, and voltage of the semiconductor substrate 300 can be isolated from voltage of the semiconductor substrate 301.

The semiconductor substrate 301 is embedded in the semiconductor substrate 300, and an interface between the semiconductor substrate 300 and the semiconductor substrate 301 is concave or concave-like from a cross-sectional perspective. Moreover, the pn junction 302 is formed along the interface, and the interface is concave or concave-like. Therefore, the semiconductor substrate 301 can provide a sufficient area and thickness for deposition of some of the connectors 32.

To be specific, the connectors 32 includes drain connectors 320, 324, gate connectors 322, 325, and source connectors 321, 323. The gate connector 322 is located between the drain connector 320 and the source connector 321, and the gate connector 325 is located between the drain connector 324 and the source connector 323.

The nitride-based heterostructure 31 includes a nitride-based semiconductor layer 310 and a nitride-based semiconductor layer 311. The nitride-based semiconductor layer 310 is disposed on the nitride-based semiconductor layer 311, and the material of the nitride-based semiconductor layer 310 is different from the material of the nitride-based semiconductor layer 311, and a heterojunction 312 is formed. Moreover, the band gap of the nitride-based semiconductor layer 310 is different from the band gap of the nitride-based semiconductor layer 311, and a 2DEG region 313 is formed.

The drain connector 320, the gate connector 322, and the source connector 321 are located above the region 3b of the semiconductor substrate 300, and the connectors 320-322 form a HEMT structure with part of the nitride-based heterostructure 31. To be specific, the drain connector 320, the gate connector 322, and the source connector 321 are disposed on the semiconductor substrate 301.

The drain connector 324, the gate connector 325, and the source connector 323 are located above the region 3a of the semiconductor substrate 300, and the connectors 323-325 form a HEMT structure with another part of the nitride-based heterostructure 31.

The pn junction 302 is formed between the semiconductor substrate 301 and the semiconductor substrate 300, and the pn junction 302 can be reversely biased or zero biased. Therefore, substrate voltage of the HEMT structure above the region 3b can be isolated from substrate voltage of the HEMT structure above the region 3a.

In one aspect, the nitride-based semiconductor circuit 3A includes a patterned conductive layer 35. The patterned conductive layer 35 is disposed on the connectors 32, and the patterned conductive layer 35 electrically connects the connectors 32. The patterned conductive layer 35 has a plurality of pads, and the pad 350 electrically connects the source connector 321 and the drain connector 324. In other words, the patterned conductive layer 35 electrically connects the HEMT structure above the region 3b to the HEMT structure above the region 3a.

In an embodiment, the nitride-based semiconductor circuit 3A can form a half bridge circuit, and the HEMT structure above the region 3b is connected at the high side, and the HEMT structure above the region 3a is connected at the low side.

Furthermore, the pad 350 electrically connected to the source connector 321 and the drain connector 324 overlays part of the pn junction 302 and electrically connects to the semiconductor substrate 301. Therefore, the patterned conductive layer 35 electrically connects the HEMT structures, and the HEMT structures of the nitride-based semiconductor circuit 3A can be electrically connected while the substrate voltages of the HEMT structures are separate.

In one aspect, the pad 350 electrically connected to the source connector 321 and the drain connector 324 overlays both the region 3a and the region 3b. Therefore, the HEMT structures of the nitride-based semiconductor circuit 3A can be electrically connected while the substrate voltages of the HEMT structures are separate.

In one aspect, the nitride-based semiconductor circuit 3A includes a patterned conductive layer 34. The patterned conductive layer 34 is disposed between the connectors 32 and the patterned conductive layer 35. The patterned conductive layer 34 electrically connects the connectors 32 to the patterned conductive layer 35. Therefore, the patterned conductive layer 34 may provide proper connection between the patterned conductive layer 35 and the connectors 32.

In this embodiment, the interconnection 380 electrically connects the semiconductor substrate 300 to the source connector 323, and the interconnection 381 electrically connects the semiconductor substrate 301 to the source connector 321. The source connector 321 shares the same voltage with the semiconductor substrate 301, and the source connector 323 shares the same voltage with the semiconductor substrate 300.

In this embodiment, the source connector 323 is grounded, and voltages of the source connector 321 and the source connector 323 can reversely biased the pn junction 302 between the semiconductor substrate 300 and the semiconductor substrate 301.

For example, the semiconductor substrate 300 has p-type dopants, and the semiconductor substrate 301 has n-type dopants. When the HEMT structure on the semiconductor substrate 301 is opened, the source connector 321 and the interconnection 381 will have high voltage, and the pn junction 302 is reversely biased. When the HEMT structure on the region 3a of semiconductor substrate 300 is opened, the drain connector 324 and the interconnection 381 will have high voltage, and the pn junction 302 is reversely biased. When the pn junction 302 is reversely biased, a depletion region is formed in the substrate structure 30, and the substrate voltage of the semiconductor substrate 301 is isolated from the substrate voltage of the region 3a of the semiconductor substrate 300.

In one aspect, the interconnection 381 passes through an interface formed between the nitride-based heterostructure 31 and the semiconductor substrate 301 to have an end portion embedded in the semiconductor substrate 301. Therefore, the interconnection 381 can provide a proper electrical connection between the semiconductor substrate 301 and the source connector 321.

In one aspect, a projection of the semiconductor substrate 301 on a top surface of the substrate structure 30 is rectangular in shape. Therefore, the semiconductor substrate 301 can carry the connectors 320-322 that form a HEMT structure.

Figure 37:
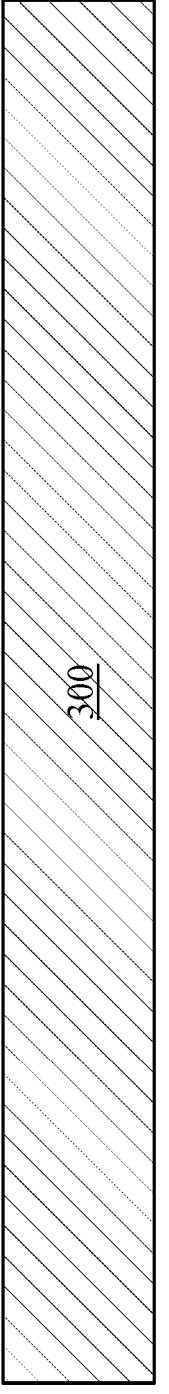
FIGS. 37-45 are cross-sectional views of steps of a manufacturing method of the nitride-based semiconductor circuit.
Figure 38:
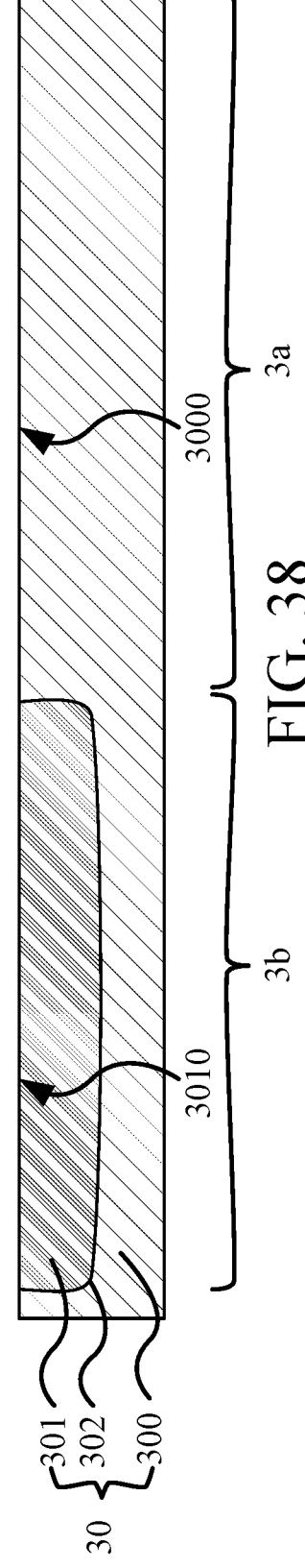

FIGS. 37-45 are cross-sectional views of steps of a manufacturing method of the nitride-based semiconductor circuit 3A. Referring to FIGS. 37 and 38, the manufacturing method of the nitride-based semiconductor circuit 3A includes: providing a substrate structure 30. The substrate structure 30 comprises the semiconductor substrate 300 having dopants, and the semiconductor substrate has the region 3a and the region 3b being adjacent to the region 3a. The semiconductor substrate 301 is embedded in the region 3b of the semiconductor substrate 300. The top surface 3000 of the semiconductor substrate 300 and the top surface 3010 of the semiconductor substrate 301 are coplanar. The semiconductor substrate 301 has dopants that are different from the dopants of the semiconductor substrate 300, and the pn junction 302 is formed between the semiconductor substrate 300 and the semiconductor substrate 301.

Figure 39:
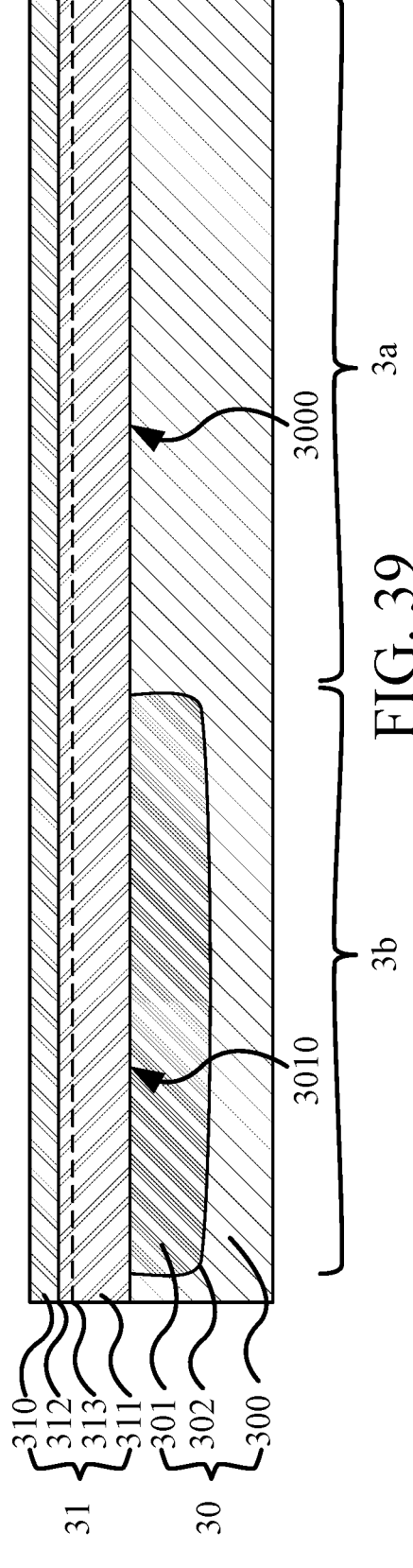

Referring to FIG. 39, the manufacturing method of nitride-based semiconductor circuit 3A includes: forming the nitride-based heterostructure 31 on the substrate structure 30. The nitride-based heterostructure 31 is disposed on the substrate structure 30, and the interface between the nitride-based semiconductor layers 310, 311 and the top surface of the substrate structure 30 are parallel.

Referring to FIGS. 40-43, the manufacturing method of nitride-based semiconductor circuit 3A includes: forming the connectors 32 on the nitride-based heterostructure 31.

Figure 44:
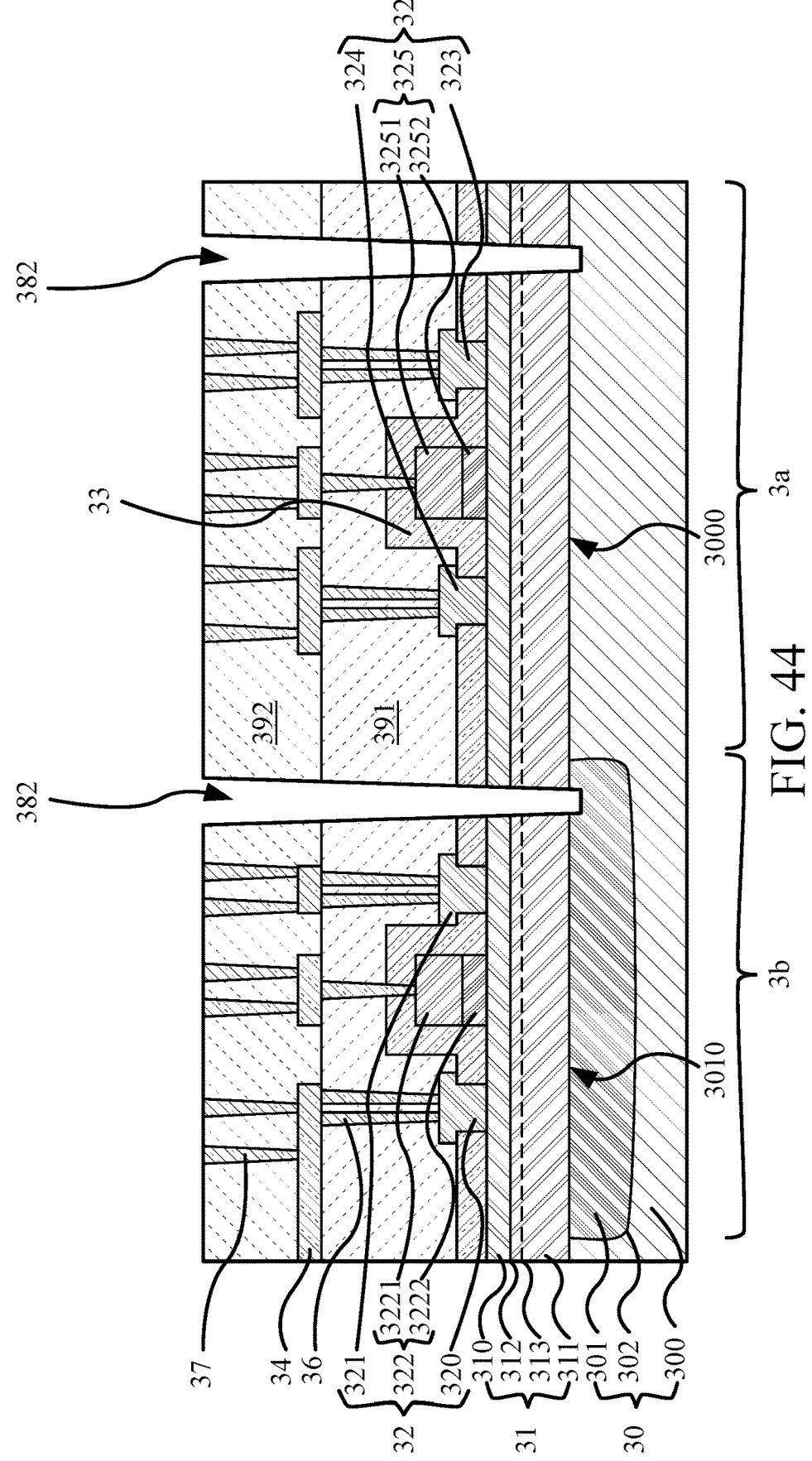

Referring to FIG. 44, the manufacturing method of nitride-based semiconductor circuit 3A includes: etching through the nitride-based heterostructure 31.

Figure 45:
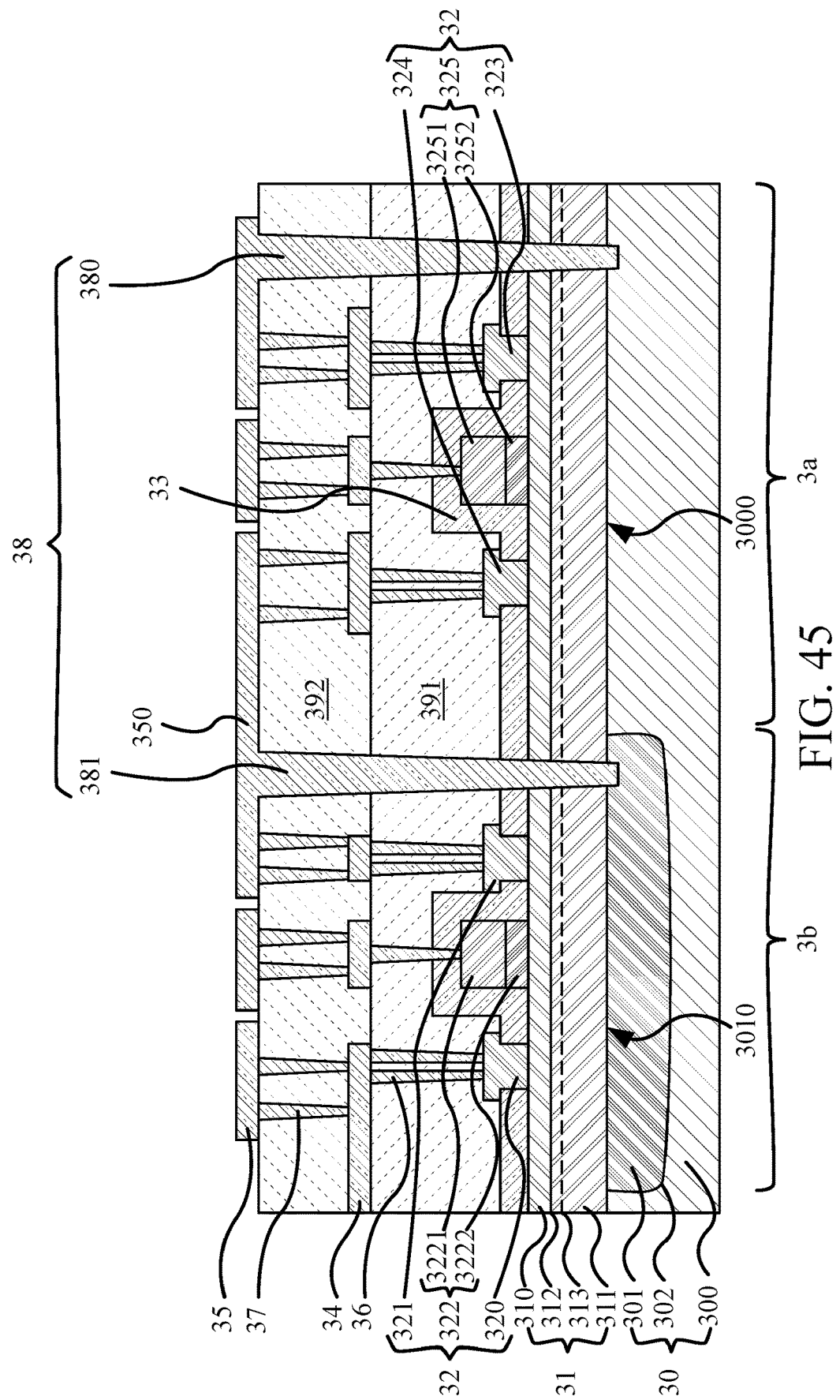

Referring to FIG. 45, the manufacturing method of nitride-based semiconductor circuit 3A includes: forming the connecting vias 38. The connecting vias 38 includes interconnection 380 and interconnection 381. The interconnection 380 electrically connects the region 3a of the semiconductor substrate 300 to one of the connectors 32, and the interconnection 381 electrically connects the semiconductor substrate 301 to another one of the connectors 32.

To be specific, referring to FIG. 37, in the manufacturing method of the embodiment, the semiconductor substrate 300 is provided, and the semiconductor substrate has dopants. Referring to FIG. 38, the semiconductor substrate 301 is formed through ion implantation and diffusion at high temperature. In other words, the step of providing the substrate structure includes: providing a substrate having the dopants; and doping the other type of dopants to form the semiconductor substrate 301, and the rest of the substrate form the semiconductor substrate 300. For example, the semiconductor substrate 300 has p-type dopants, and the semiconductor substrate 301 is formed through n-type ion implantation. Therefore, the top surface 3000 of the semiconductor substrate 300 and the top surface 3010 of the semiconductor substrate 301 are coplanar.

In some embodiments, the semiconductor substrate 301 may be a n-type well in the semiconductor substrate 300.

Referring to FIG. 39, the nitride-based semiconductor layer 311 and the nitride-based semiconductor layer 310 are formed through epitaxial growth techniques.

Figure 40:
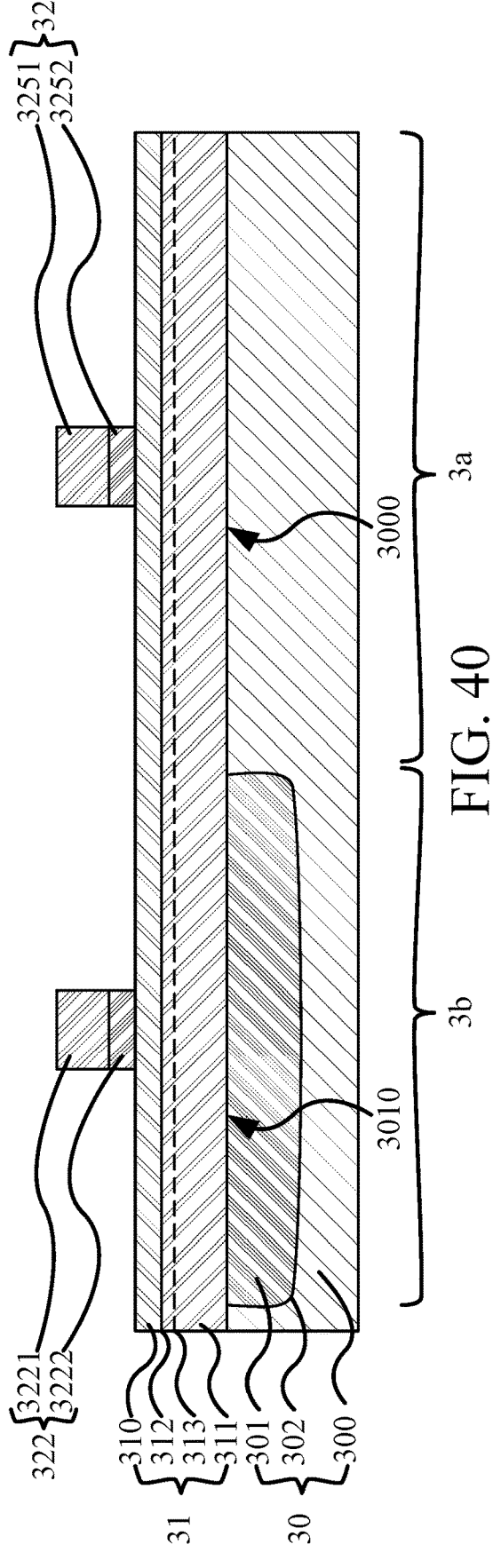

Referring to FIG. 40, the gate connectors 322, 325 are disposed on the nitride-based heterostructure 31. The gate connector 322 includes a doped nitride-based semiconductor layer 3222 and an electrode 3221, and the gate connector 325 includes a doped nitride-based semiconductor layer 3252 and an electrode 3251. The doped nitride-based semiconductor layers 3222, 3252 are disposed on the nitride-based heterostructure 31. The electrode 3221 is disposed on the doped nitride-based semiconductor layer 3222, and the electrode 3251 is disposed on the doped nitride-based semiconductor layer 3252. For example, the doped nitride-based semiconductor layers 3222, 3252 are formed through epitaxial growth techniques, and the doped nitride-based semiconductor layers 3222, 3252 are doped with p-type dopants. Therefore, the HEMT structures as shown in FIG. 36 are normally-on HEMT structures.

Figure 41:
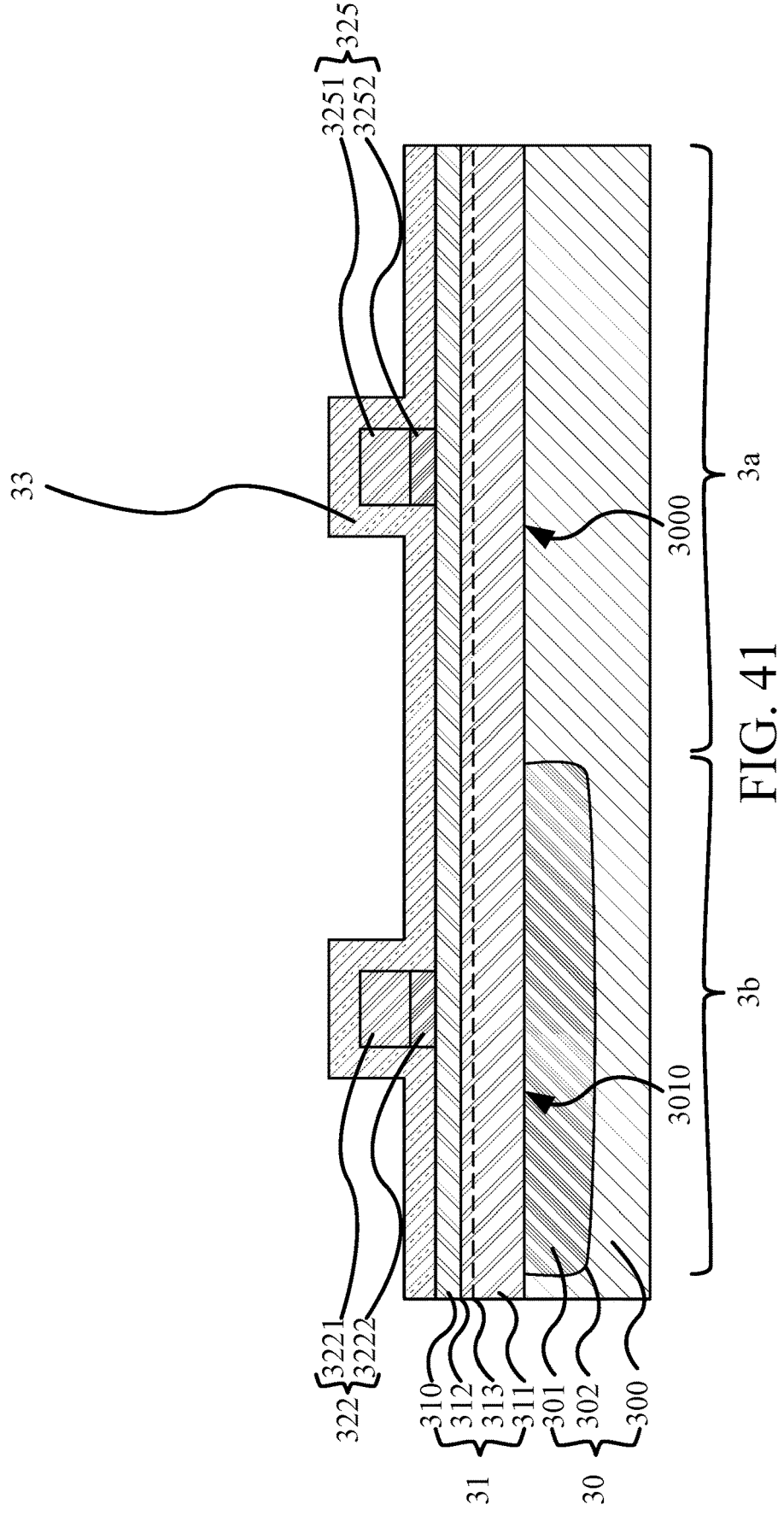

Referring to FIG. 41, the passivation layer 33 is disposed on the gate connectors 322, 325, and the nitride-based heterostructure 31. For example, the passivation layer 33 includes nitride, and the passivation layer 33 covers the top surfaces and side surfaces of the gate connectors 322, 325.

Figure 42:
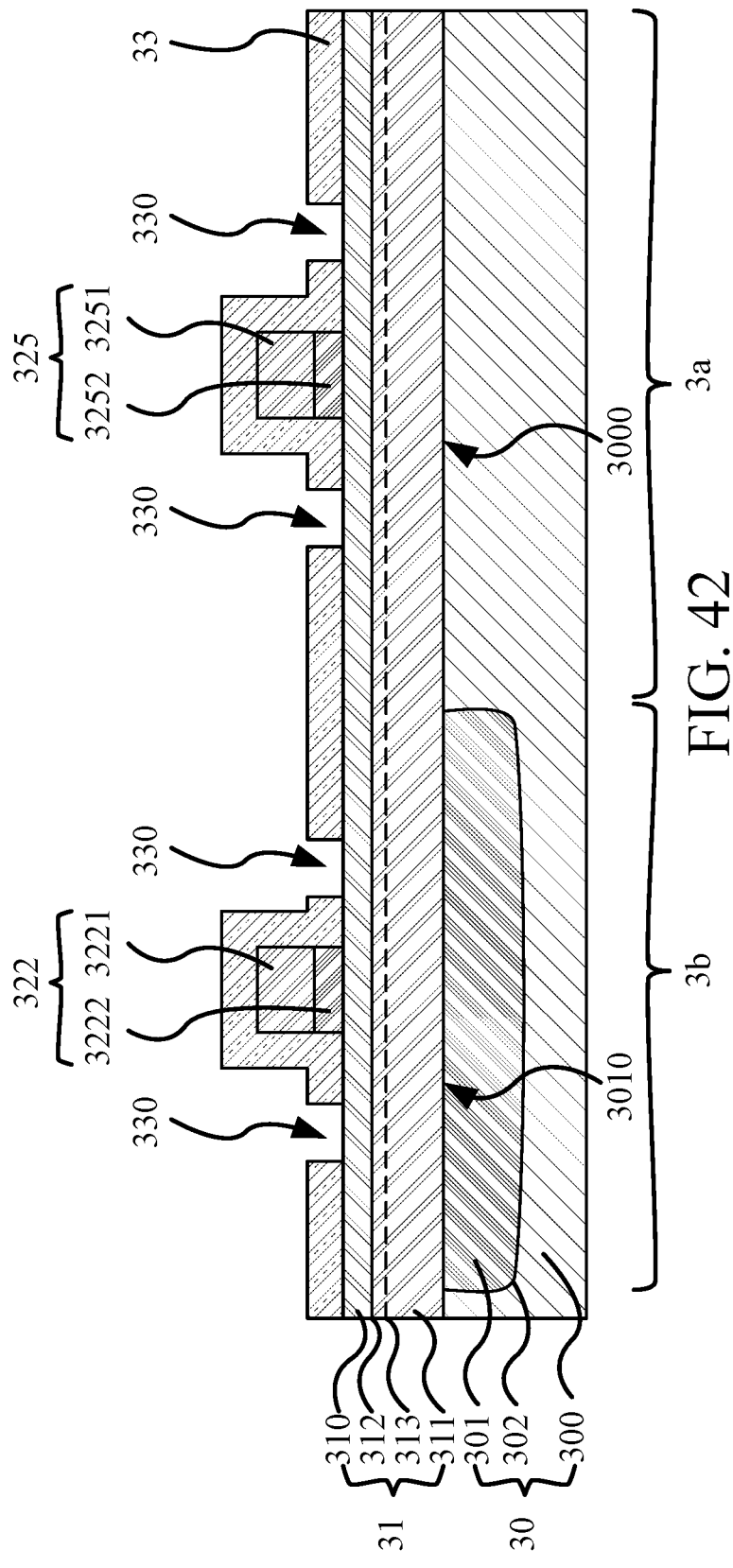

Referring to FIG. 42, the passivation layer 33 is etched and a plurality of openings 330 are formed. The openings 330 are for ohmic contact.

Figure 43:
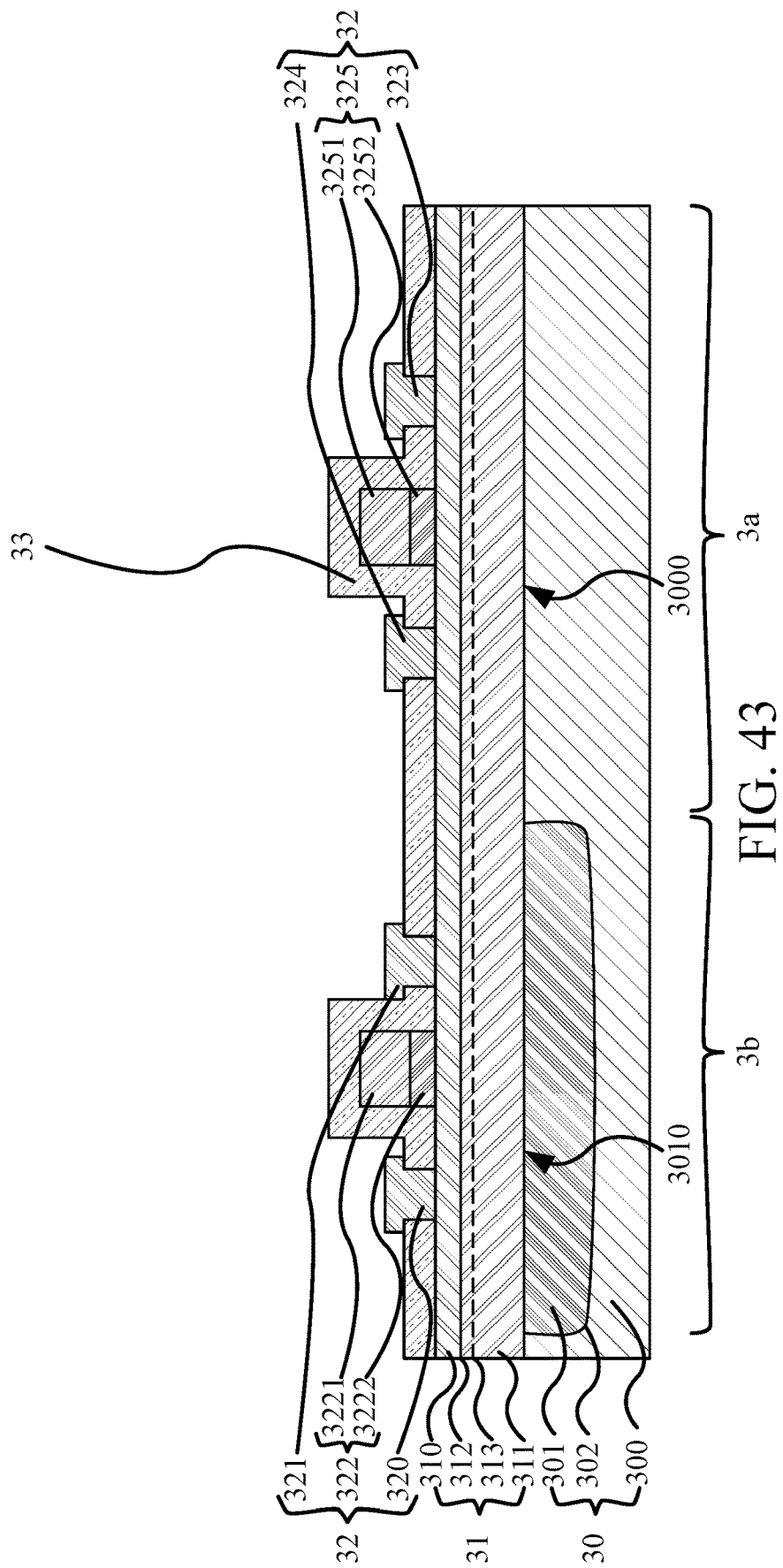

Referring to FIG. 43, the drain connectors 320, 324 and the source connectors 321, 323 are disposed in the openings 330 as shown in FIG. 42.

Referring to FIG. 44, an ILD layer 391, vias 36, the patterned conductive layer 34, an IMD layer 392, and vias 37 are disposed above the connectors 32, and the passivation layer 33. The ILD layer 391 is disposed on the connectors 32 and the passivation layer 33, and the vias 36 pass through the ILD layer 391. The patterned conductive layer 34 is disposed on the ILD layer 391, and the vias 36 electrically connect the patterned conductive layer 34 to the connectors 32.

The IMD layer 392 is disposed on the patterned conductive layer 34, and the vias 37 pass through the IMD layer 392. The vias 37 are electrically connected to the patterned conductive layer 34.

Also, the IMD layer 392, the ILD layer 391, the passivation layer 33, the nitride-based heterostructure 31, and part of the semiconductor substrate 301 are etched, and the openings 382 are formed. The openings 382 expose the semiconductor substrate 301.

Referring to FIG. 45, the patterned conductive layer 35 and the interconnections 380, 381 are disposed. The patterned conductive layer 35 is disposed on the IMD layer 392 and the vias 37, and the interconnections 381 are disposed in the openings 382 as shown in FIG. 44. The patterned conductive layer 35 is located above the connectors 32, and the patterned conductive layer 35 electrically connects to the connectors 32. The patterned conductive layer 35 has a plurality of pads, and the pad 350 electrically connects the source connector 321 and the drain connector 324. Also, the patterned conductive layer 34 electrically connects the connectors 32 to the patterned conductive layer 35.

Furthermore, the passivation layer 393 as shown in FIG. 36 is disposed and covers part of the patterned conductive layer 35, and the rest of the patterned conductive layer 35 is exposed for further connection.

The vias 36, 37, the patterned conductive layers 34, 35, and the interconnection 381 electrically connect the semiconductor substrate 301 to the source connector 321, and the vias 36, 37, the patterned conductive layers 34, 35, and the interconnection 380 electrically connect the semiconductor substrate 300 to the source connector 323. Therefore, during the operation of the HEMT structures of the nitride-based semiconductor circuit 3A, the pn junction 302 is reversely biased, and the voltages of the semiconductor substrate 301 and the semiconductor substrate 300 can be different.

Figure 46:
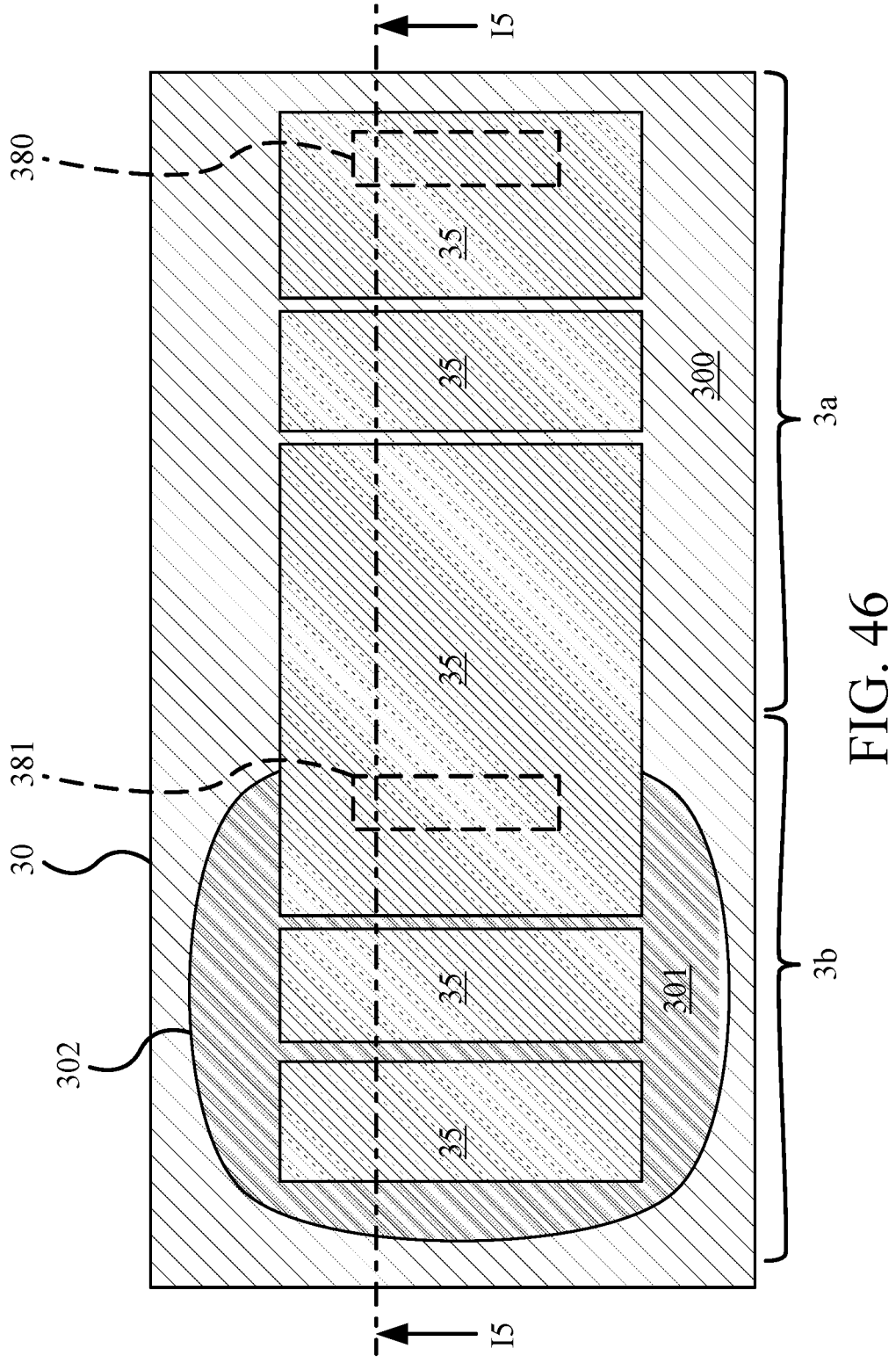
FIG. 46 is a top view of a nitride-based semiconductor circuit according to some embodiments of the present disclosure.
Figure 47:
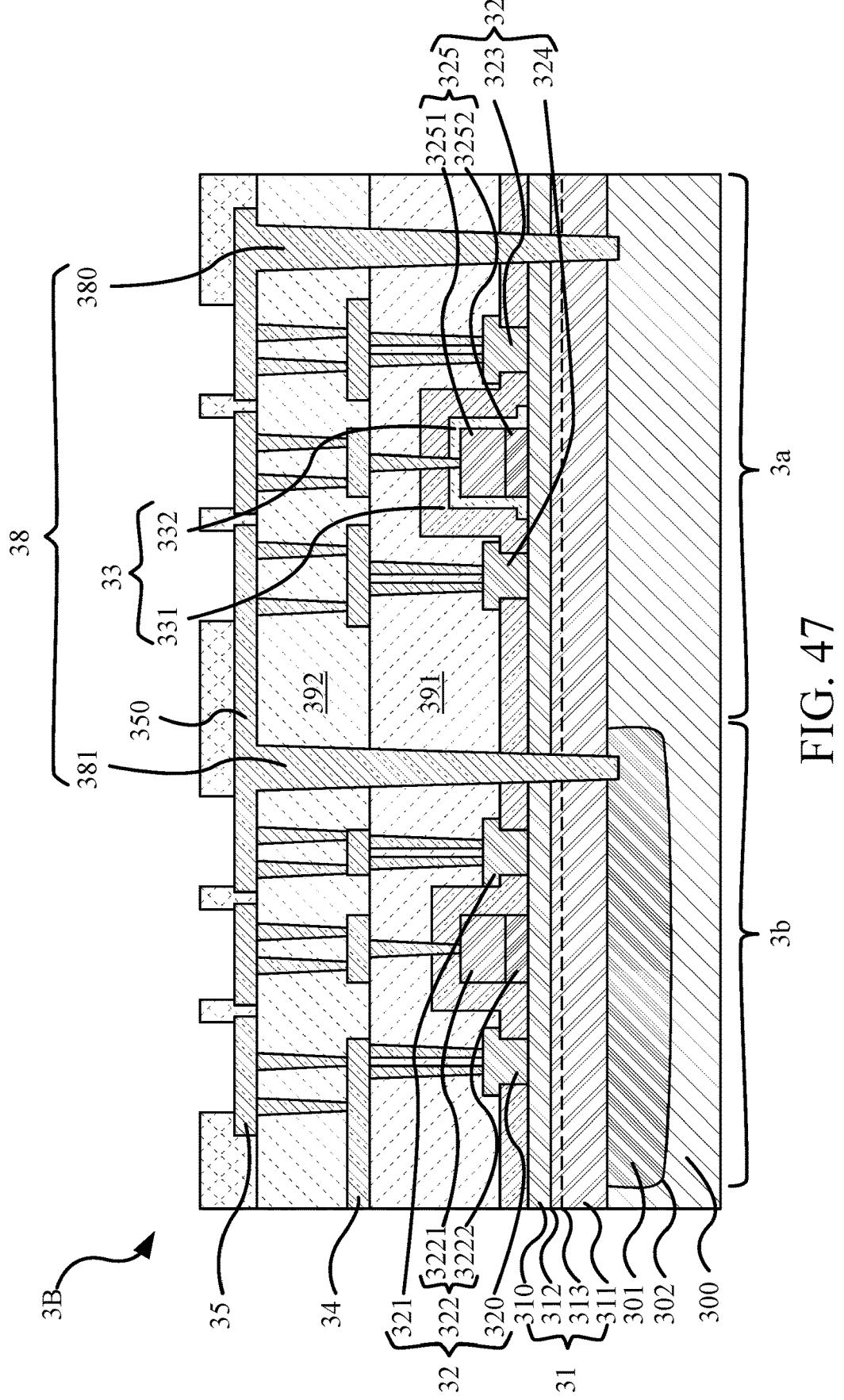
FIG. 47 is a cross-sectional view of the nitride-based semiconductor circuit according to cutting plane line I5 in FIG. 46.

FIG. 46 is a top view of a nitride-based semiconductor circuit 3B according to an embodiment of the present disclosure, and FIG. 47 is a cross-sectional view of the nitride-based semiconductor circuit 3B according to cutting plane line I5 in FIG. 46, and parts of layers of the nitride-based semiconductor circuit 3B are omitted in the top view for clarity. FIG. 46 only shows top view of a substrate structure 30, and a patterned conductive layer 35.

The nitride-based semiconductor circuit 3B includes the substrate structure 30, a nitride-based heterostructure 31, connectors 32, patterned conductive layers 34, 35, and connecting vias 38, which is similar to the nitride-based semiconductor circuit 3A, and the detailed description regarding similar components will not be repeated.

In this embodiment, the passivation layers 33 include oxide layer 332 and nitride layer 331. The oxide layer 332 covers the gate connector 325, and no oxide layer 332 is covering the gate connector 322. The nitride layer 331 covers the oxide layer 332 on the gate connector 325, and the nitride layer 331 directly covers the gate connector 322.

For example, in this embodiment, the oxide layer 332 comprises silicon dioxide, and the oxide layer 332 is applied through PECVD. The nitride layer 331 comprises silicon nitride, and the nitride layer 331 is applied through LPCVD. The hydrogen concentration of oxide layer 332 is different from the hydrogen concentration of nitride layer 331, and the doped nitride-based semiconductor layer 3252 is in direct contact with the oxide layer 332. While the doped nitride-based semiconductor layers 3222, 3252 are doped with p-type dopant, activation of magnesium in doped nitride-based semiconductor layer 3222 and activation of magnesium in doped nitride-based semiconductor layer 3252 can be different during high temperature thermal treatment. Therefore, the threshold voltage of the HEMT structure above the region 3b is different from the threshold voltage of the HEMT structure above the region 3a. Therefore, the HEMT structures can be prevented from accidentally being opened by a voltage spike or voltage leakage.

In one aspect, a projection of the semiconductor substrate 301 on a top surface of the substrate structure 30 is round in shape. Therefore, the semiconductor substrate 301 can provide sufficient area for deposition of the HEMT structure.

In this embodiment, the HEMT structure above the semiconductor substrate 301 is located at the high side, and the HEMT structure above the region 3a of the semiconductor substrate 300 is located at the low side, and the semiconductor substrate 301 is electrically connected to the source connector 321 of the HEMT structure located at the high side, and the semiconductor substrate 300 is electrically connected to the source connector 323 of the HEMT structure located at the low side. However, the present disclosure is not limited thereto.

Figure 48:
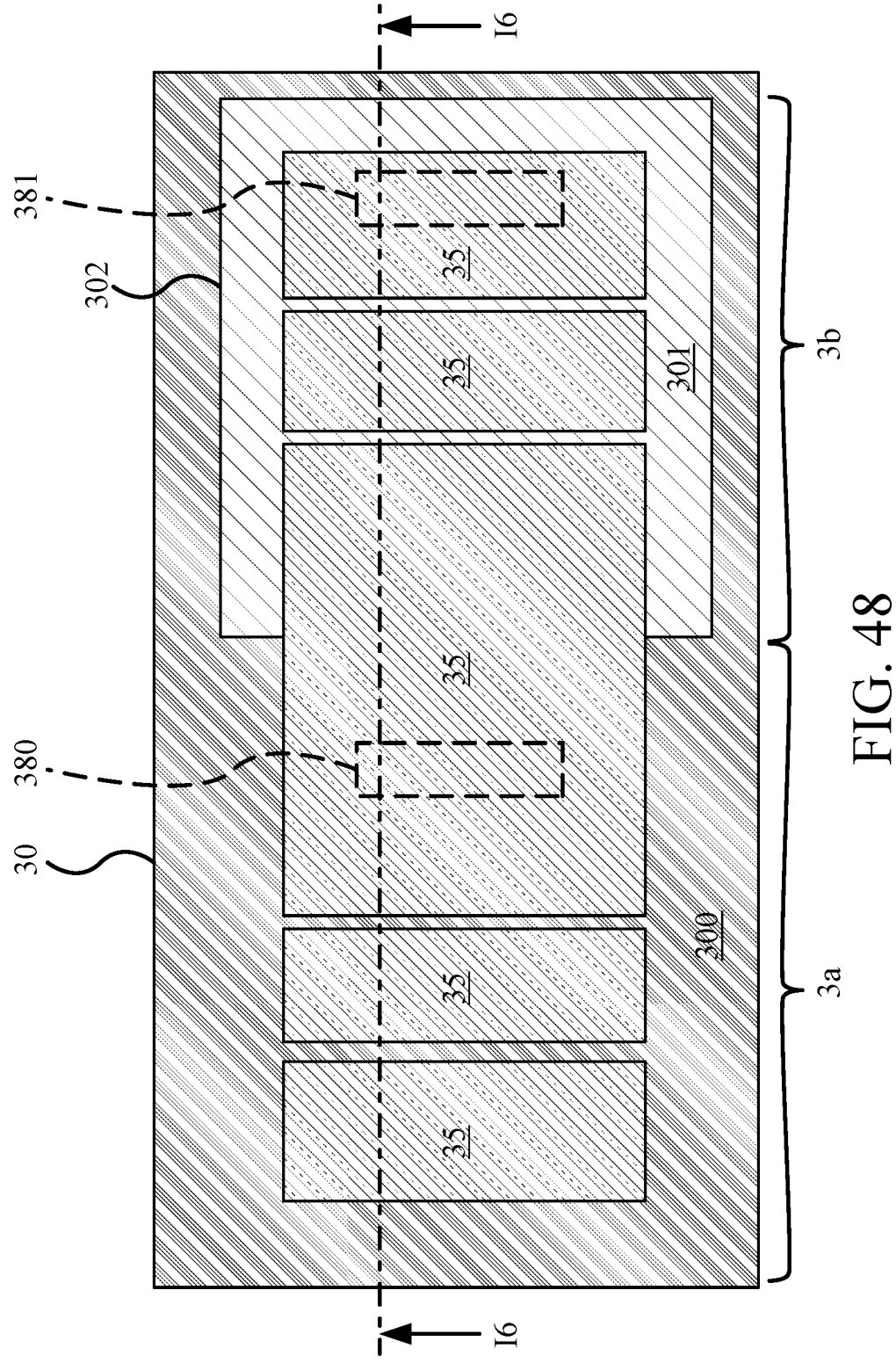
FIG. 48 is a top view of a nitride-based semiconductor circuit according to some embodiments of the present disclosure.
Figure 49:
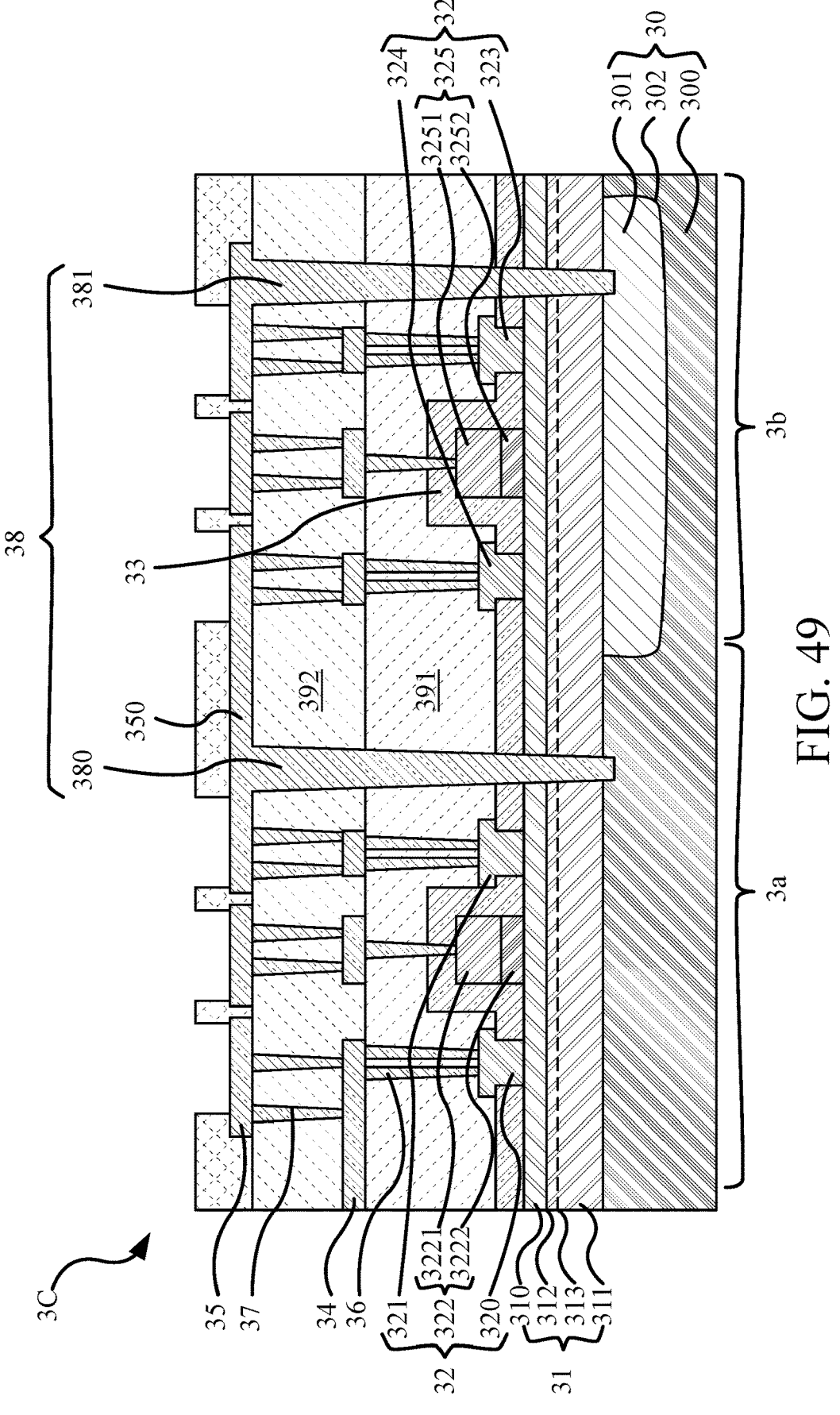
FIG. 49 is a cross-sectional view of the nitride-based semiconductor circuit according to cutting plane line I6 in FIG. 48.

FIG. 48 is a top view of a nitride-based semiconductor circuit 3C according to an embodiment of the present disclosure, and FIG. 49 is a cross-sectional view of the nitride-based semiconductor circuit 3C according to cutting plane line I6 in FIG. 48, and parts of layers of the nitride-based semiconductor circuit 3C are omitted in the top view for clarity. FIG. 48 only shows top view of a substrate structure 30, and a patterned conductive layer 35.

The nitride-based semiconductor circuit 3C includes a nitride-based heterostructure 31, connectors 32, passivation layer 33, vias 36, 37, patterned conductive layers 34, 35, which is similar to the nitride-based semiconductor circuit 3A, and the detailed description regarding similar components will not be repeated.

In this embodiment, the nitride-based semiconductor circuit 3C includes a connecting vias 38. The connecting vias 38 include an interconnection 380 and an interconnection 381. The interconnection 380 electrically connects the region 3a of the semiconductor substrate 300 to a source connector 321 of the connectors 32. The interconnection 381 electrically connects the semiconductor substrate 301 to a source connector 323 of the connectors 32. In other words, the source connector 321 shares the same voltage with the semiconductor substrate 300, and the source connector 323 shares the same voltage with the semiconductor substrate 301. Furthermore, the interconnection 380 electrically connects the region 3a of the semiconductor substrate 300 to a drain connector 324 of the connectors 32.

In this embodiment, the nitride-based semiconductor circuit 3C can form a half bridge circuit, and a drain connector 320, a gate connector 322, the source connector 321 and a part of the nitride-based heterostructure 31 above the region 3a form a HEMT structure, and the HEMT structure is located at the high side of the nitride-based semiconductor circuit 3C. In other words, the semiconductor substrate 300 is electrically connected to the source connector 321 of the HEMT structure at the high side of the nitride-based semiconductor circuit 3C.

The drain connector 324, a gate connector 325, and the source connector 323 and another part of the nitride-based heterostructure 31 above the region 3b form another HEMT structure, and the HEMT structure is located at the low side of the nitride-based semiconductor circuit 3C. In other words, the semiconductor substrate 301 is electrically connected to the source connector 323 of the HEMT structure at the low side of the nitride-based semiconductor circuit 3C.

For example, the semiconductor substrate 300 has n type dopants, and the semiconductor substrate 301 has p type dopants. The source connector 323 is grounded, while the source connector 321 will receive high voltage. Therefore, the pn junction 302 can be reversely biased during the operation of the HEMT structures above the substrate structure 30.

Figure 50:
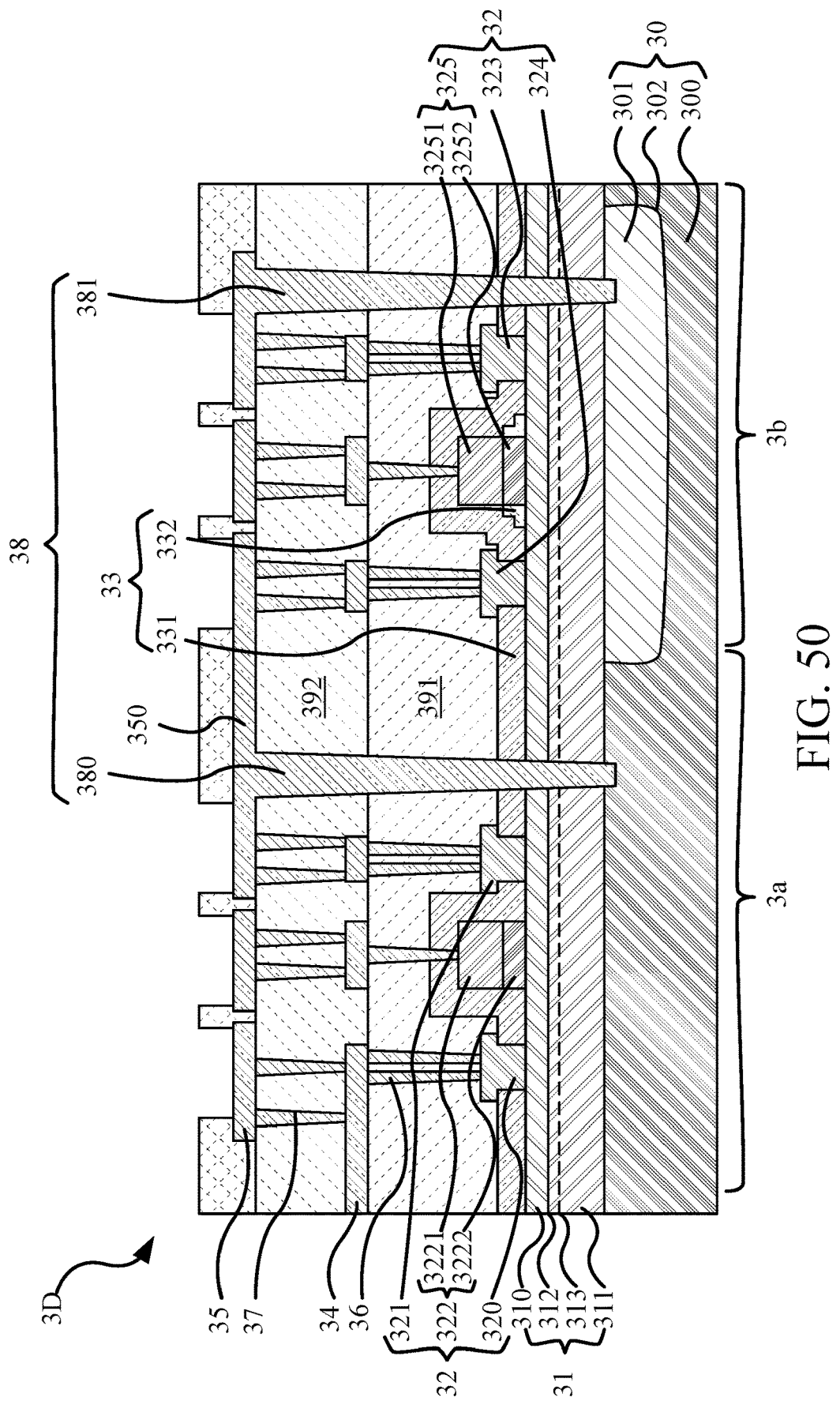
FIG. 50 is a cross-sectional view of a nitride-based semiconductor circuit according to some embodiments of the present disclosure.

FIG. 50 is a cross-sectional view of a nitride-based semiconductor circuit according to some embodiments of the present disclosure. The nitride-based semiconductor circuit 3D has a substrate structure 30, a nitride-based heterostructure 31, connectors 32, an ILD layer 391, an IMD layer 392, patterned conductive layers 34, 35, and connecting vias 38, which are similar to the nitride-based semiconductor circuit 3C, and the detailed description about the similar components will not be repeated.

In this embodiment, the nitride-based semiconductor circuit 3D includes passivation layers 33, and the passivation layers 33 include an oxide layer 332 and a nitride layer 331. The oxide layer 332 directly touches the gate connector 325, and the gate connector 322 is isolated from the oxide layer 332, and the nitride layer 331 covers the oxide layer 332.

Moreover, the gate connector 325 has an electrode 3251 and a doped nitride-based semiconductor layer 3252, and the gate connector 322 has an electrode 3221 and a doped nitride-based semiconductor layer 3222. The doped nitride-based semiconductor layers 3222, 3252 are disposed on the nitride-based heterostructure 31, and the electrodes 3221, 3251 are disposed on the doped nitride-based semiconductor layers 3222, 3252, respectively. In this embodiment, the oxide layer 332 directly contacts the doped nitride-based semiconductor layer 3252, and the electrode 3251 is isolated from the oxide layer 332. Therefore, the threshold voltage of the HEMT structure formed by the connectors 323-325 can be different from the threshold voltage of the HEMT structure formed by the connectors 320-322 without increasing the thickness of the nitride-based semiconductor circuit 3D.

In an embodiment, the oxide layer 332 as shown in FIG. 50 can be applied to the nitride-based semiconductor circuit 3B as shown in FIG. 47.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor circuit comprising:
a first semiconductor substrate having first dopants;
a second semiconductor substrate disposed on the first semiconductor substrate and having second dopants different from the first dopants to form a pn junction between the first semiconductor substrate and the second semiconductor substrate;
a nitride-based heterostructure disposed on the second semiconductor substrate;
a plurality of connectors disposed on the nitride-based heterostructure;
a first patterned conductive layer disposed on the connectors;
a second patterned conductive layer disposed on the connectors; and
a plurality of connecting vias going through the nitride-based heterostructure, wherein the connecting vias comprise:
a first interconnection electrically connecting the first semiconductor substrate to one of the connectors or an external power source through the first patterned conductive layer; and
a second interconnection electrically connecting the second semiconductor substrate to another one of the connectors or another external power source through the second patterned conductive layer;
wherein the connectors comprise a first and second source connectors, a first and second drain connectors, and a first and second gate connectors,
wherein the first source connector, the first drain connector, and the first gate connector and a part of the nitride-based heterostructure are configured to constitute a first HEMT structure,
wherein the second source connector, the second drain connector, and the second gate connector and another part of the nitride-based heterostructure are configured to constitute a second HEMT structure located beside the first HEMT structure, and a threshold voltage of the second HEMT structure is higher than a threshold voltage of the first HEMT structure, and the second patterned conductive layer connects the first source connector to the second drain connector.

2. The nitride-based semiconductor circuit of claim 1, wherein the first interconnection electrically connects the first drain connector to the first semiconductor substrate, and the second interconnection electrically connects the second semiconductor substrate to the first source connector and the second source connector.

3. The nitride-based semiconductor circuit of claim 1, wherein the first semiconductor substrate has a heavily doped area, and the first interconnection is connected to the heavily doped area.

4. The nitride-based semiconductor circuit of claim 3, wherein the heavily doped area surrounds a projection of the first HEMT structure on the first semiconductor substrate.

5. The nitride-based semiconductor circuit of claim 3, wherein the heavily doped area surrounds both projections of the first and second HEMT structures on the first semiconductor substrate.

6. The nitride-based semiconductor circuit of claim 1, wherein the first interconnection electrically connects the second source connector to the first semiconductor substrate, and the second interconnection electrically connects the first source connector and the second source connector to the second semiconductor substrate.

7. The nitride-based semiconductor circuit of claim 3, wherein the heavily doped area surrounds a projection of the second HEMT structure on the first semiconductor substrate.

8. The nitride-based semiconductor circuit of claim 1, further comprising:
an oxide layer in contact with the second gate connector and isolated from the first gate connector; and
a nitride layer in contact with the first gate connector.

9. The nitride-based semiconductor circuit of claim 8, wherein the second gate connector comprises:
a doped nitride-based semiconductor layer disposed on the nitride-based heterostructure and in direct contact with the oxide layer; and
a gate electrode disposed on the doped nitride-based semiconductor layer.

10. The nitride-based semiconductor circuit of claim 9, wherein a top surface or a side surface of the gate electrode is free from coverage of the oxide layer.

11. The nitride-based semiconductor circuit of claim 9, wherein the gate electrode is isolated from the oxide layer.

12. The nitride-based semiconductor circuit of claim 1, further comprising a third semiconductor substrate, wherein the first semiconductor substrate is disposed on the third semiconductor substrate, and the second and third semiconductor substrates have the same type of dopants.

13. The nitride-based semiconductor circuit of claim 1, wherein the first and second semiconductor substrates form a first interface therebetween with the pn junction across the first interface.

14. The nitride-based semiconductor circuit of claim 13, wherein the nitride-based heterostructure comprises two nitride-based semiconductor layers having different bandgaps with a second interface formed therebetween, and the first interface is parallel with the second interface.

15. A manufacturing method of a nitride-based semiconductor circuit comprising:
providing a first semiconductor substrate having first dopants;

disposing a second semiconductor substrate having second dopants, which are different from the first dopants, on the first semiconductor substrate to form a pn junction;

disposing a nitride-based heterostructure on the second semiconductor substrate;

disposing a plurality of connectors on the nitride-based heterostructure;

etching through part of the nitride-based heterostructure;

disposing a first interconnection;

disposing a first patterned conductive layer;

etching through another part of the nitride-based heterostructure;

disposing a second interconnection; and disposing a second patterned conductive layer on the nitride-based heterostructure, wherein the first interconnection electrically connects the first semiconductor substrate to one of the connectors or an external power source through the first patterned conductive layer, wherein the second interconnection electrically connects the second semiconductor substrate to another one of the connectors or another external power source through the second patterned conductive layer;

wherein the step of disposing the connectors comprises:

disposing a first gate connector and a second gate connector on the nitride-based heterostructure;

disposing the oxide layer on the first and second gate connectors and the nitride-based heterostructure;

etching a part of the oxide layer in contact with the first gate connector; and disposing a nitride layer on the first gate connector and the second gate connector and the oxide layer.

16. The manufacturing method of claim 15, wherein the step of disposing the connectors comprises:

disposing a first gate connector and a second gate connector on the nitride-based heterostructure;

disposing a nitride layer on the first and second gate connectors and the nitride-based heterostructure;

etching the nitride layer in contact with the second gate connector; and disposing an oxide layer on the second gate connector.

17. The manufacturing method of claim 15, wherein before the step of providing the first semiconductor substrate, the method comprises:

providing a third semiconductor substrate; and growing the first semiconductor substrate on the third semiconductor substrate, wherein the third and second semiconductor substrates have the same type of dopant.

18. The manufacturing method of claim 15, wherein after the step of providing the first semiconductor substrate, the method comprises:

doping a heavily doped area on the first semiconductor substrate, wherein the first interconnection connects the heavily doped area.

* * * * *